(12) United States Patent
Servalli et al.

(10) Patent No.: US 11,127,744 B2
(45) Date of Patent: Sep. 21, 2021

(54) MEMORY DEVICES AND METHODS OF FORMING MEMORY DEVICES

(71) Applicant: Micron Technology, Inc., Boise, ID (US)

(72) Inventors: Giorgio Servalli, Fara Gera d'Adda (IT); Marcello Mariani, Milan (IT)

(73) Assignee: Micron Technology, Inc., Boise, ID (US)

( * ) Notice: Subject to any disclaimer, the term of this patent is extended or adjusted under 35 U.S.C. 154(b) by 7 days.

(21) Appl. No.: 16/737,171

(22) Filed: Jan. 8, 2020

(65) Prior Publication Data

US 2021/0210491 A1 Jul. 8, 2021

(51) Int. Cl.
*H01L 27/108* (2006.01)
*H01L 27/11504* (2017.01)
*H01L 27/11507* (2017.01)
*G11C 11/22* (2006.01)

(52) U.S. Cl.
CPC ...... *H01L 27/10814* (2013.01); *G11C 11/221* (2013.01); *H01L 27/10855* (2013.01); *H01L 27/10873* (2013.01); *H01L 27/10885* (2013.01); *H01L 27/11504* (2013.01); *H01L 27/11507* (2013.01)

(58) Field of Classification Search
CPC ......... H01L 27/10814; H01L 27/10855; H01L 28/86–92; H01L 27/2454; H01L 29/7827; H01L 21/823487; H01L 21/823885; H01L 29/78642
See application file for complete search history.

(56) References Cited

U.S. PATENT DOCUMENTS

| | | | |
|---|---|---|---|
| 10,062,745 | B2 | 8/2018 | Ramaswamy |
| 2006/0113587 | A1 | 6/2006 | Thies et al. |
| 2007/0228434 | A1 | 10/2007 | Shimojo |
| 2008/0093644 | A1 | 4/2008 | Forbes |
| 2010/0052029 | A1 | 3/2010 | Huang |
| 2012/0153371 | A1 | 6/2012 | Chen et al. |
| 2019/0189357 | A1 | 6/2019 | Chavan et al. |

FOREIGN PATENT DOCUMENTS

WO WO 4/2021
PCT/US2020/066285

*Primary Examiner* — Amar Movva
(74) *Attorney, Agent, or Firm* — Wells St. John P.S.

(57) ABSTRACT

Some embodiments include an assembly having first and second pillars. Each of the pillars has an inner edge and an outer edge. A first gate is proximate a channel region of the first pillar. A second gate is proximate a channel region of the second pillar. A shield line is between the first and second pillars. First and second bottom electrodes are over the first and second pillars, respectively; and are configured as first and second angle plates. An insulative material is over the first and second bottom electrodes. The insulative material may be ferroelectric or non-ferroelectric. A top electrode is over the insulative material. Some embodiments include methods of forming assemblies.

43 Claims, 72 Drawing Sheets

MEMORY DEVICES AND METHODS OF FORMING MEMORY DEVICES

TECHNICAL FIELD

Memory devices (e.g., memory arrays comprising random-access memory), and methods of forming memory devices.

BACKGROUND

Memory may utilize memory cells which individually comprise an access transistor in combination with a capacitor. The capacitor may be a ferroelectric capacitor if the memory is ferroelectric random-access memory (FeRAM), or may be a non-ferroelectric capacitor if the memory is traditional dynamic random-access memory (DRAM).

It would be desirable to develop improved memory architecture, and improved methods of forming memory architecture. It would also be desirable for such methods to be applicable for fabrication of FeRAM and DRAM.

BRIEF DESCRIPTION OF THE DRAWINGS

FIG. 1 is a top view. FIGS. 1A and 1B are cross-sectional side views along the lines A-A and B-B, respectively, of FIG. 1.

FIGS. 1A-1 and 1B-1 are diagrammatic cross-sectional side views along the lines A-A and B-B, respectively, of FIG. 1, and show materials that may be associated with a gap shown in FIGS. 1A and 1B.

FIG. 2 is a top view. FIGS. 2A and 2B are cross-sectional side views along the lines A-A and B-B, respectively, of FIG. 2.

FIG. 3 is a top view. FIGS. 3A and 3B are cross-sectional side views along the lines A-A and B-B, respectively, of FIG. 3.

FIG. 4 is a top view. FIGS. 4A and 4B are cross-sectional side views along the lines A-A and B-B, respectively, of FIG. 4.

FIG. 5 is a top view. FIGS. 5A and 5B are cross-sectional side views along the lines A-A and B-B, respectively, of FIG. 5.

FIG. 6 is a top view. FIGS. 6A and 6B are cross-sectional side views along the lines A-A and B-B, respectively, of FIG. 6.

FIG. 7 is a top view. FIGS. 7A and 7B are cross-sectional side views along the lines A-A and B-B, respectively, of FIG. 7.

FIG. 8 is a top view. FIGS. 8A and 8B are cross-sectional side views along the lines A-A and B-B, respectively, of FIG. 8.

FIG. 9 is a top view. FIGS. 9A and 9B are cross-sectional side views along the lines A-A and B-B, respectively, of FIG. 9.

FIG. 10 is a top view. FIG. 10C is a three-dimensional view.

FIG. 11 is a top view. FIGS. 11A and 11B are cross-sectional side views along the lines A-A and B-B, respectively, of FIG. 11. The construction of FIGS. 11-11B may be considered to be a region of an example integrated assembly or a region of an example memory device.

FIG. 12 is a top view. FIG. 12C is a three-dimensional view.

FIG. 13 is a top view. FIGS. 13A and 13B are cross-sectional side views along the lines A-A and B-B, respectively, of FIG. 13. The construction of FIGS. 13-13B may be considered to be a region of an example integrated assembly or a region of an example memory device.

FIG. 14 is a top view. FIGS. 14A and 14B are cross-sectional side views along the lines A-A and B-B, respectively, of FIG. 14.

FIG. 15 is a top view. FIGS. 15A and 15B are cross-sectional side views along the lines A-A and B-B, respectively, of FIG. 15.

FIG. 16 is a top view. FIGS. 16A and 16B are cross-sectional side views along the lines A-A and B-B, respectively, of FIG. 16.

FIG. 17 is a top view. FIGS. 17A and 17B are cross-sectional side views along the lines A-A and B-B, respectively, of FIG. 17.

FIG. 18 is a top view. FIGS. 18A and 18B are cross-sectional side views along the lines A-A and B-B, respectively, of FIG. 18.

FIG. 19 is a top view. FIGS. 19A and 19B are cross-sectional side views along the lines A-A and B-B, respectively, of FIG. 19.

FIG. 20 is a top view. FIGS. 20A and 20B are cross-sectional side views along the lines A-A and B-B, respectively, of FIG. 20.

FIG. 21 is a top view. FIGS. 21A and 21B are cross-sectional side views along the lines A-A and B-B, respectively, of FIG. 21.

FIG. 22 is a top view. FIGS. 22A and 22B are cross-sectional side views along the lines A-A and B-B, respectively, of FIG. 22.

DETAILED DESCRIPTION OF THE ILLUSTRATED EMBODIMENTS

Some embodiments include new methods of forming memory architecture (e.g., DRAM, FeRAM, etc.) in which bottom electrodes are configured as angle plates (e.g., "L-shaped" plates) having vertically-extending legs joining to horizontally-extending legs. The angle plates may be supported by insulative masses provided along the full extent of vertically-extending legs, or by insulative structures (rails) that extend along the angle plates and are adjacent upper regions of the vertically-extending legs. Some embodiments include memory architectures (e.g., DRAM, FeRAM, etc.) which include bottom electrodes configured as angle plates. Example embodiments are described with reference to FIGS. 1-24.

Figure 1:
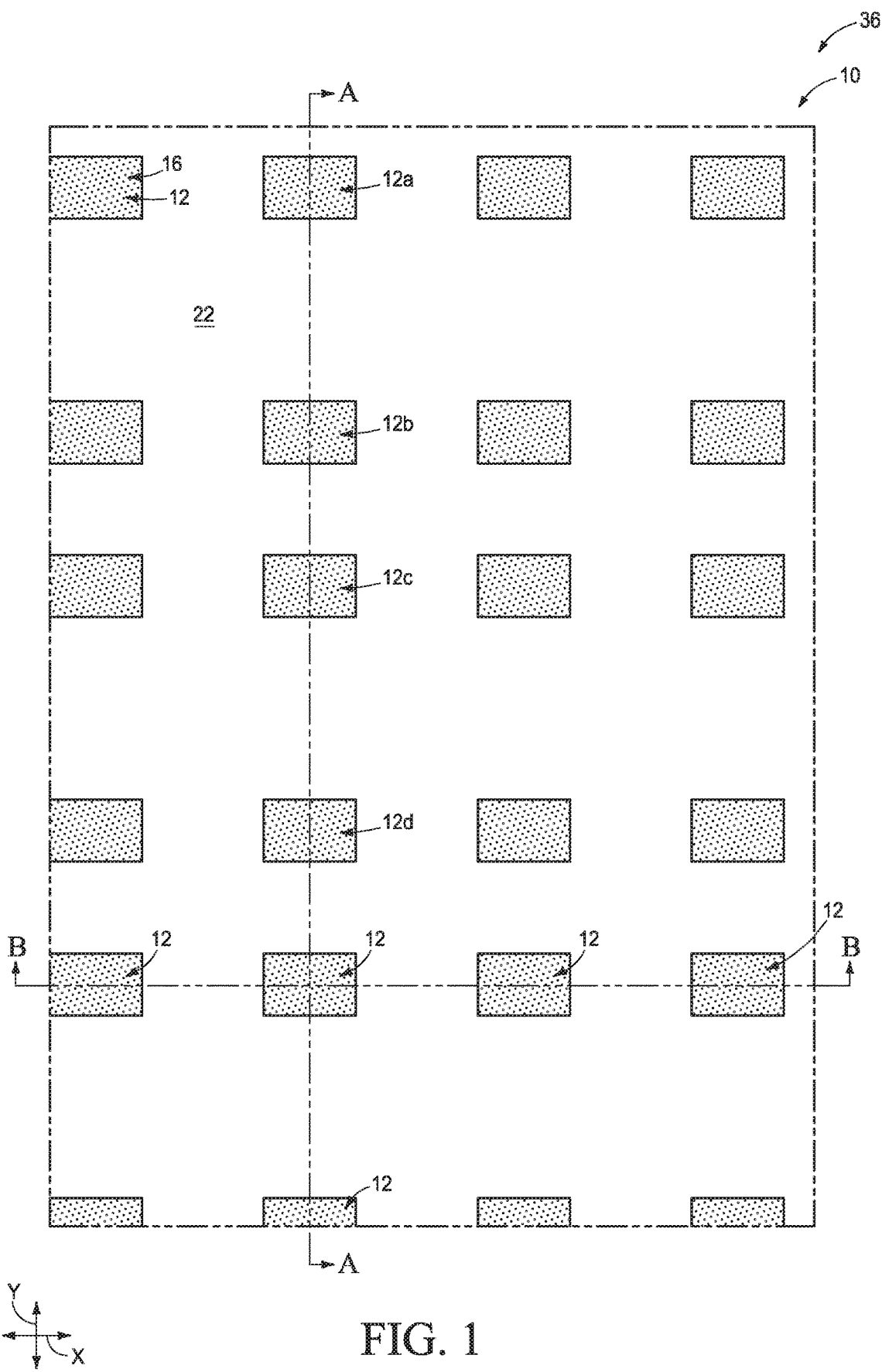
FIGS. 1-1B are diagrammatic views of a region of an example construction at an example process stage of an example method for forming an example integrated assembly.
Figure 1A:
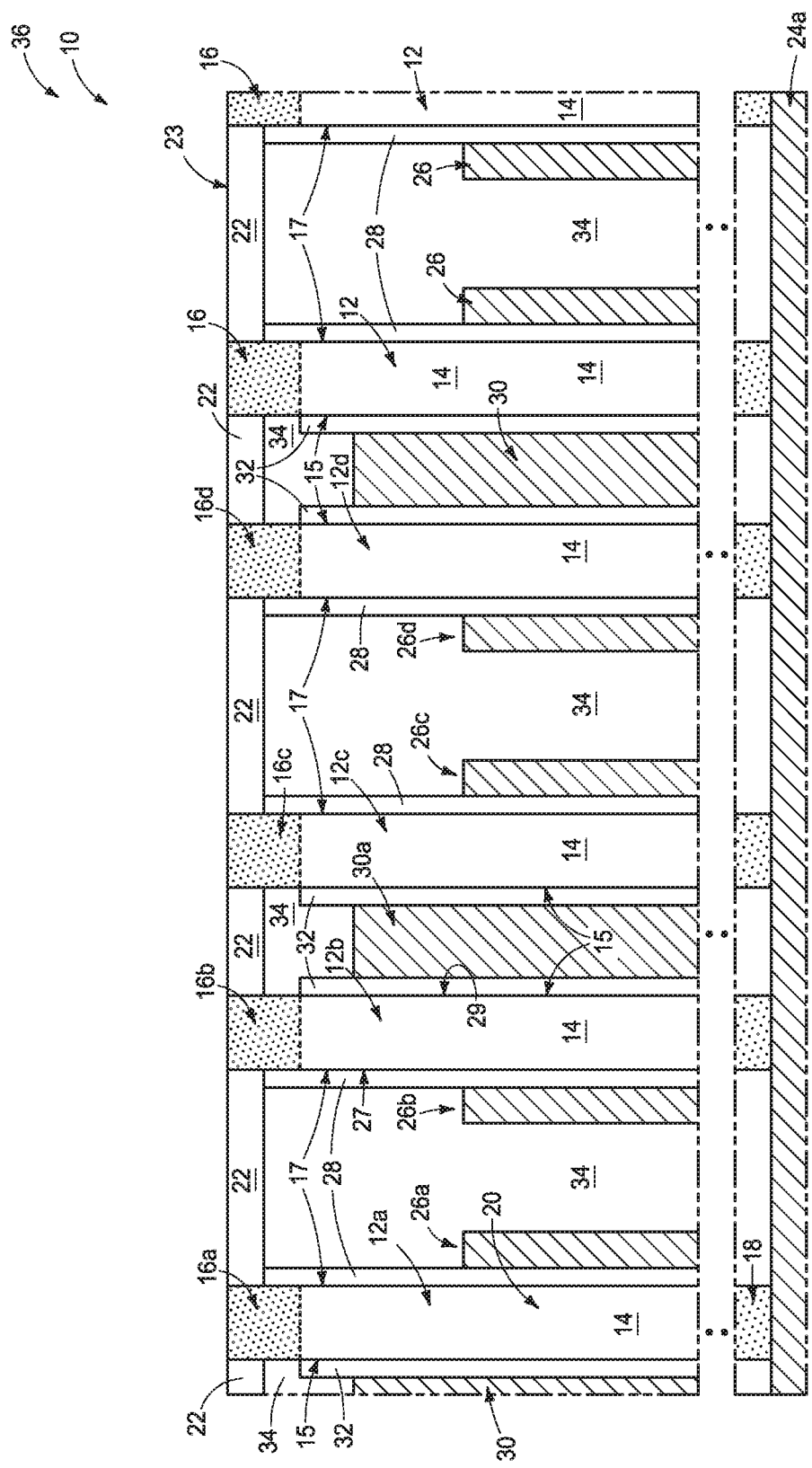
Figure 1B:
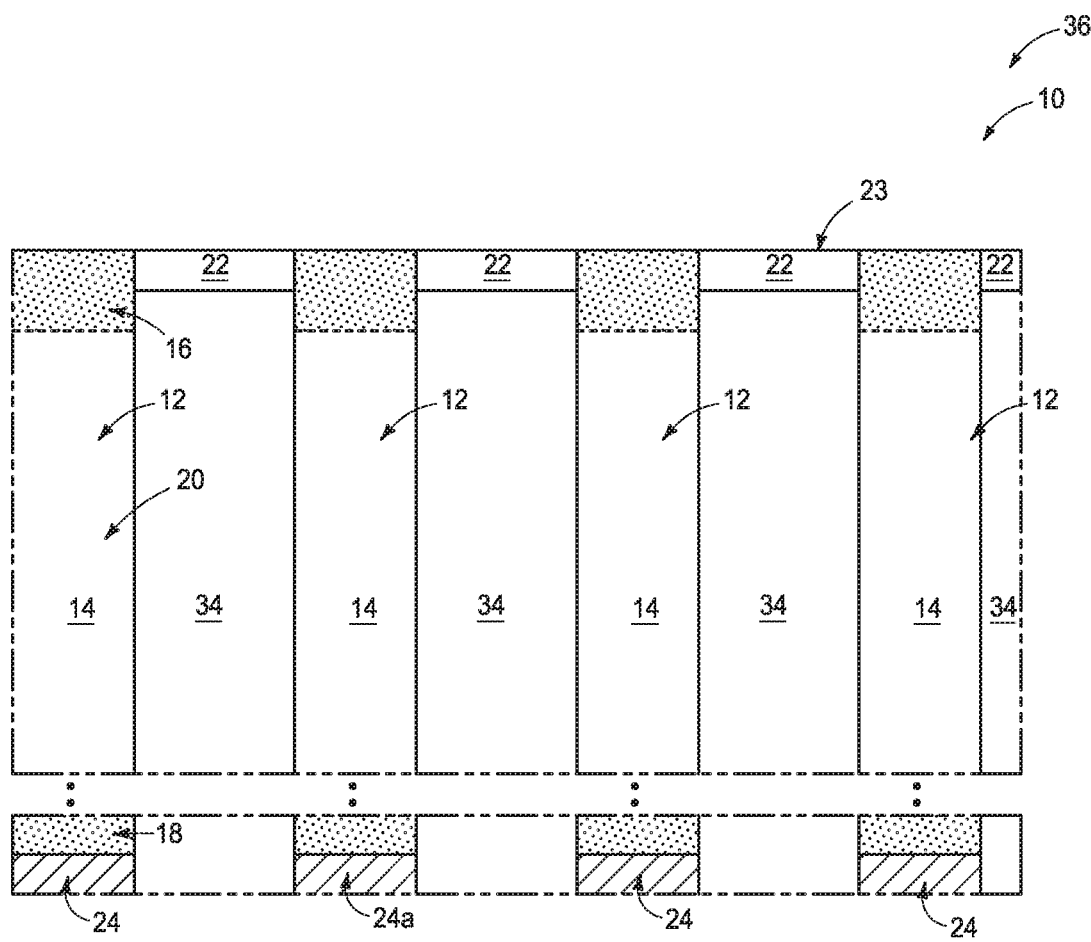
Figures 1, 1A:
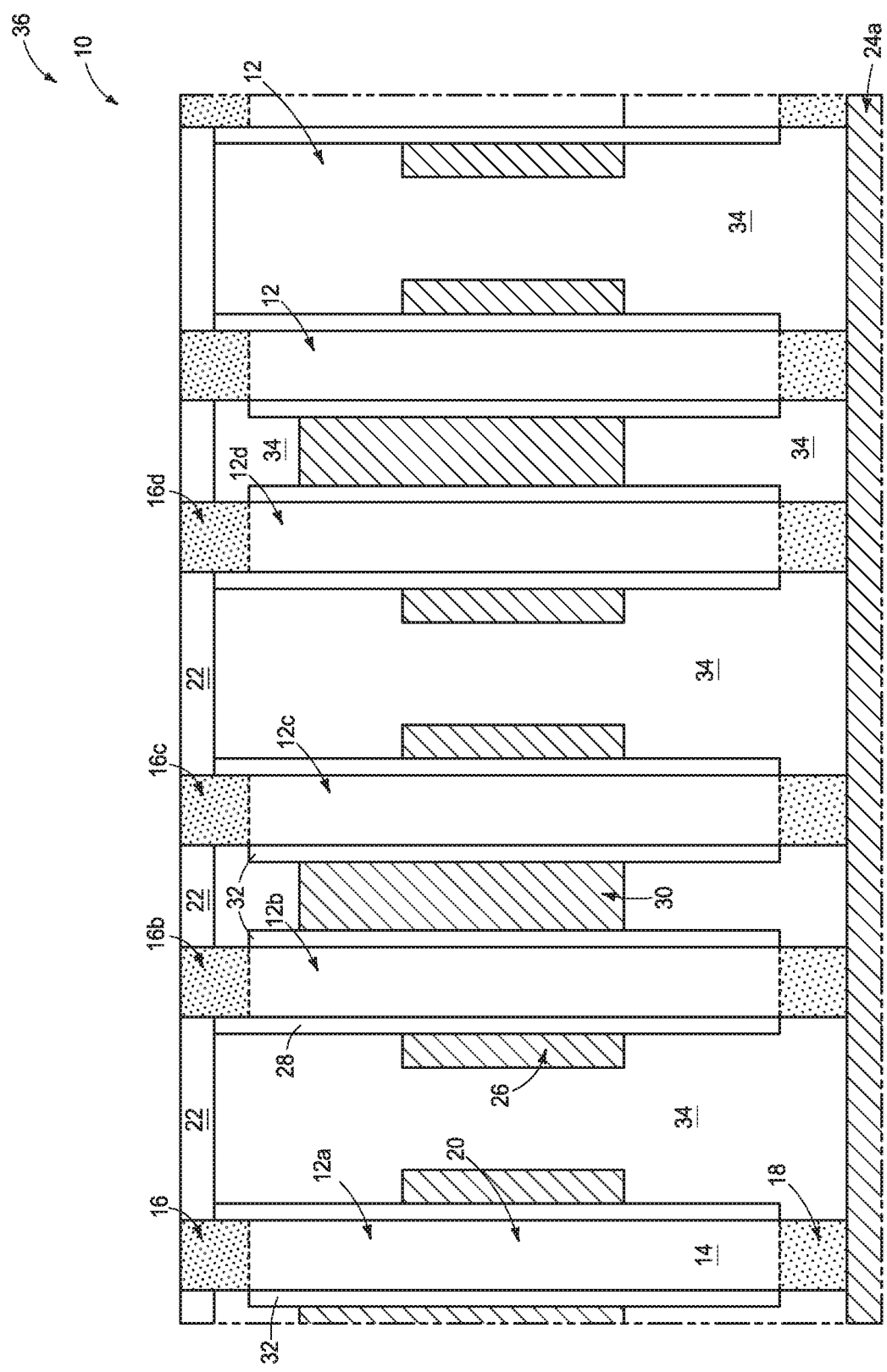
Figures 1, 1B:
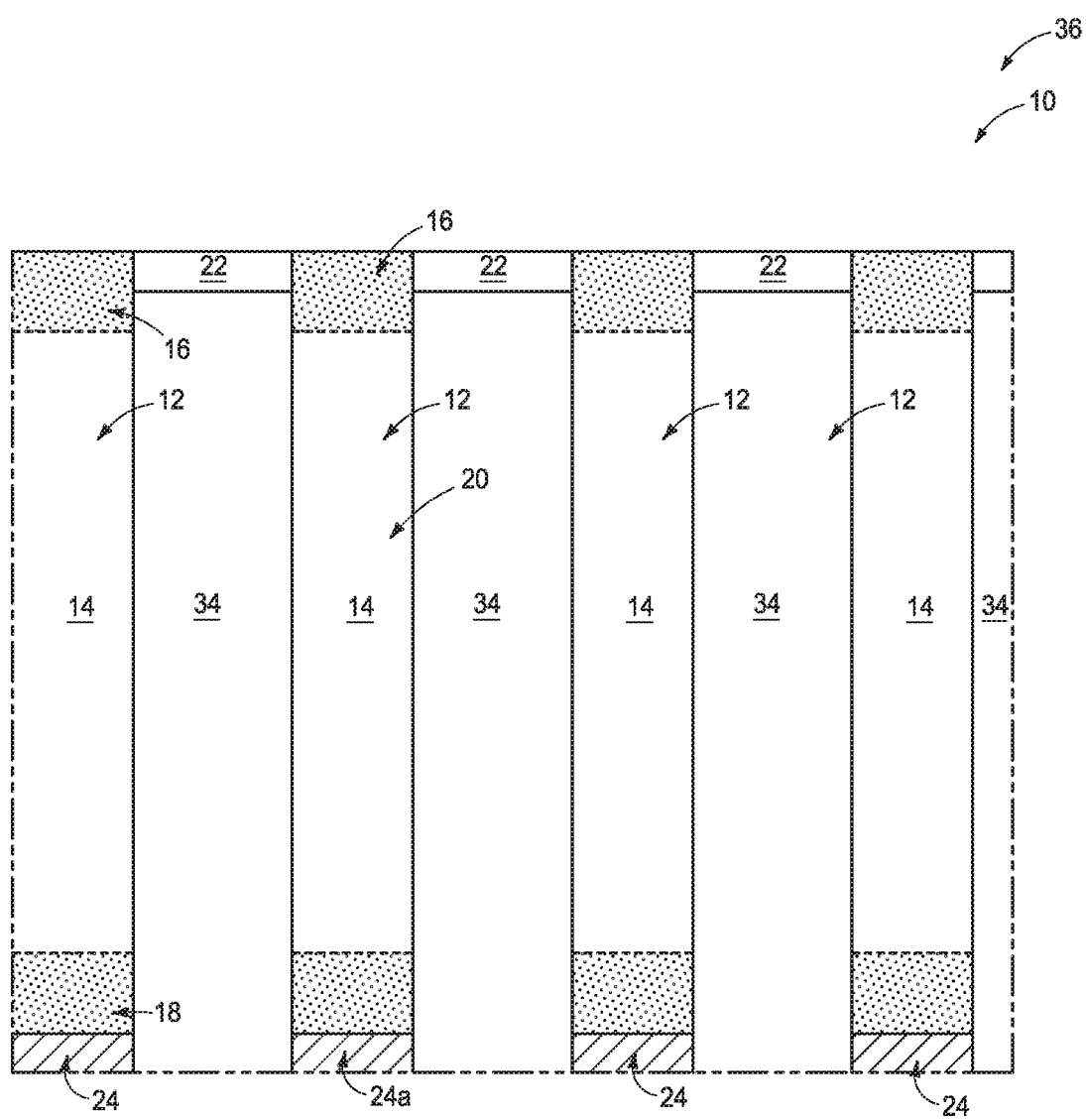

Referring to FIGS. 1-1B, a construction 10 includes vertically-extending pillars 12. The pillars 12 comprise semiconductor material 14. The pillars 12 are all substantially identical to one another, with the term "substantially identical" meaning identical to within reasonable tolerances of fabrication and measurement.

The semiconductor material 14 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 14 may comprise, consist essentially of, or consist of appropriately-doped silicon. The silicon may be in any suitable form, and in some embodiments may be monocrystalline, polycrystalline and/or amorphous.

Each of the pillars 12 includes a channel region 20 between an upper source/drain region 16 and a lower source/drain region 18. Stippling is utilized in the drawings to indicate that the source/drain regions 16 and 18 are heavily doped. In some embodiments, the source/drain regions 16 and 18 may be n-type doped by incorporating one or both of phosphorus and arsenic into the semiconductor material (e.g., silicon) 14 of the pillars 12. In some embodiments, one or both of the source/drain regions 16 and 18 may comprise additional conductive material besides the conductively-doped semiconductor material 14. For instance, one or both of the source/drain regions 16 and 18 may include metal silicide (e.g., titanium silicide, tungsten silicide, etc.) and/or other suitable conductive materials (e.g., titanium, tungsten, etc.). In some embodiments, the pillars 12 may be considered to be capped by the upper source/drain regions 16, with the term "capped" indicating that the upper source/drain regions may or may not include the semiconductor material 14 of the pillars 12.

In the shown embodiment, four of the pillars are labeled as 12a, 12b, 12c and 12d so that they may be distinguished from one another, and from the other pillars. The pillars 12a, 12b, 12c and 12d may be referred to as first, second, third and fourth pillars, respectively; and extend in lateral order along the cross-section of FIG. 1A. Also, the upper source/drain regions 16 associated with the pillars 12a-d are labeled as 16a-d; and may be referred to as first, second, third and fourth source/drain regions, respectively.

Insulative material 22 extends between the upper source/drain regions 16. The insulative material 22 may comprise any suitable composition(s); and in some embodiments may comprise, consist essentially of, or consist of silicon nitride.

A planarized upper surface 23 extends across the insulative material 22 and the source/drain regions 16. The planarized surface 23 may be formed utilizing chemical-mechanical polishing (CMP) and/or any other suitable process(es). In some embodiments, the surface 23 may be referred to as an upper surface of the construction 10.

The construction includes digit lines 24 under the pillars 12. The digit lines are electrically coupled with the lower source/drain regions 18 of the pillars. One of the digit lines is labeled as 24a so that it may be distinguished from the other digit lines. The digit lines may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In the illustrated embodiment, the digit lines are physically against the lower source/drain regions 18. In some embodiments, the digit lines may comprise metal (e.g., titanium, tungsten, etc.), the source/drain regions 18 may comprise conductively-doped silicon, and metal silicide be present where the silicon of the source/drain regions 18 interfaces with the digit lines 24.

Wordlines are alongside the pillars 12 and comprise gates 26. The gates 26 are spaced from the pillars by dielectric material (also referred to as gate dielectric material) 28.

The gates may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The dielectric material 28 may comprise any suitable composition(s); and in some embodiments may comprise, consist essentially of, or consist of one or more of silicon nitride, silicon dioxide, aluminum oxide, hafnium oxide, etc.

The dielectric material 28 is provided between the gates 26 and the channel regions 20, and may extend to any suitable vertical dimension. In the shown embodiment the dielectric material 28 extends upwardly beyond the uppermost surfaces of the gates 26. In other embodiments the dielectric material 28 may or may not extend vertically beyond the vertical edges of the gates 26.

Four of the gates are labeled as 26a, 26b, 26c and 26d, respectively, so that they may be distinguished relative to one another and relative to the other gates. The gates 26a, 26b, 26c and 26d are in lateral order along the cross-section of FIG. 1A, and may be referred to as first, second, third and fourth gates, respectively.

The first and second gates 26a and 26b are between the first and second pillars 12a and 12b. The third and fourth gates 26c and 26d are between the third and fourth pillars 12c and 12d.

The gates (transistor gates) may be considered to be operatively adjacent to (operatively proximate to) the channel regions 20 such that a sufficient voltage applied to an individual gate (e.g., the gate 26a) will induce an electric field which enables current flow through the associated channel region (e.g., the channel region 20 within the pillar 12a) to electrically couple the source/drain regions on opposing sides of the channel region with one another. If the voltage to the gate is below a threshold level, the current will not flow through the channel region, and the source/drain regions on opposing sides of the channel region will not be electrically coupled with one another. The selective control of the coupling/decoupling of the source/drain regions through the level of voltage applied to the gate may be referred to as gated coupling of the source/drain regions.

Shield lines 30 are alongside the pillars 12, and are spaced from the pillars by dielectric material 32. The shield lines may be electrically coupled with ground or any other suitable reference voltage.

The dielectric material 32 may comprise any suitable composition(s); and in some embodiments may comprise, consist essentially of, or consist of one or more of silicon dioxide, silicon nitride, aluminum oxide, hafnium oxide, etc. In the shown embodiment the dielectric material 32 extends vertically beyond the vertical edges of the shield lines 30. In other embodiments the dielectric material 32 may or may not extend vertically beyond the vertical edges of the shield lines 30.

The shield lines 30 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

One of the shield lines 30 is labeled as 30a so that it may be distinguished from the other shield lines. The shield line 30a is between the second and third pillars 12b and 12c.

In the shown embodiment, each of the pillars 12 shown along the cross-section of FIG. 1A has one side (for instance, a first side 27 of the pillar 12b) adjacent a gate 26, and has an opposing side (for instance, a second side 29 of the pillar 12b) adjacent a shield line 30.

In the shown embodiment, insulative material 34 is over the gates 26 and the shield lines 30. The insulative material 34 may comprise any suitable composition(s); and may, for example, comprise silicon dioxide. In some embodiments the material 34 may comprise a same composition as one or both of the dielectric materials 28 and 32, and in other embodiments the material 34 may comprise a different composition than at least one of the dielectric materials 28 and 32.

Each of the pillars 12 is uniquely coupled to one of the gates 26 and one of the digit lines 24; and accordingly each of the pillars 12 may be considered to be uniquely addressed by one of the gates and one of the digit lines. For instance, the pillar 12a may be considered to be uniquely addressed by the digit line 24a and the gate 26a, the pillar 12b may be considered to be uniquely addressed by the gate 26b and the digit line 24a, etc.

The digit lines 24 extend along an illustrated y-axis direction, and the shield lines 30 and gates 26 extend along an illustrated x-axis direction. In some embodiments, one of the x-axis and y-axis directions may be referred to as a first direction and the other may be referred to as a second direction.

In some embodiments, each of the pillars 12 may be considered to have an inner edge 15 and an outer edge 17 in opposing relation to the inner edge, as shown along the cross-section of FIG. 1A. The gates 26 are adjacent the outer edges 17, while the shield lines 30 are adjacent the inner edges 15. In some embodiments, the shield lines may be considered to be within regions between inner edges 15 of adjacent pillars. For instance, the shield line 30a is within a region between the inner edges 15 of the adjacent pillars 12b and 12c. In some embodiments, the pillars 12b and 12c may be referred to as first and second pillars, respectively; and the shield line 30a may be considered to be in a region between such first and second pillars.

The construction 10 may be supported by a semiconductor base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base may correspond to a semiconductor substrate containing one or more materials associated with integrated circuit fabrication. Such materials may include, for example, one or more of refractory metal materials, barrier materials, diffusion materials, insulator materials, etc.

In some embodiments, the construction 10 of FIGS. 1A and 1B may be considered to represent a portion of an integrated assembly 36.

In the embodiment of FIGS. 1A and 1B, a gap is provided within the construction 10 to break a region of the pillars 12 above the lower source/drain regions 18. The gap enables the view of construction 10 to be collapsed into a smaller area, which leaves more room for additional materials formed over the construction 10 at subsequent process stages. It is to be understood that the pillars 12 extend across the illustrated gap. FIGS. 1A-1 and 1B-1 show views along the same cross-sections as FIG. 1A and FIG. 1B, and show the construction 10 without the gap of FIGS. 1A and 1B. FIGS. 1A-1 and 1B-1 are provided to assist the reader in understanding the arrangement of construction 10. The views of FIGS. 1A and 1B (i.e., the views with the gaps in construction 10) will be used for the remaining figures of this disclosure.

Figure 2:
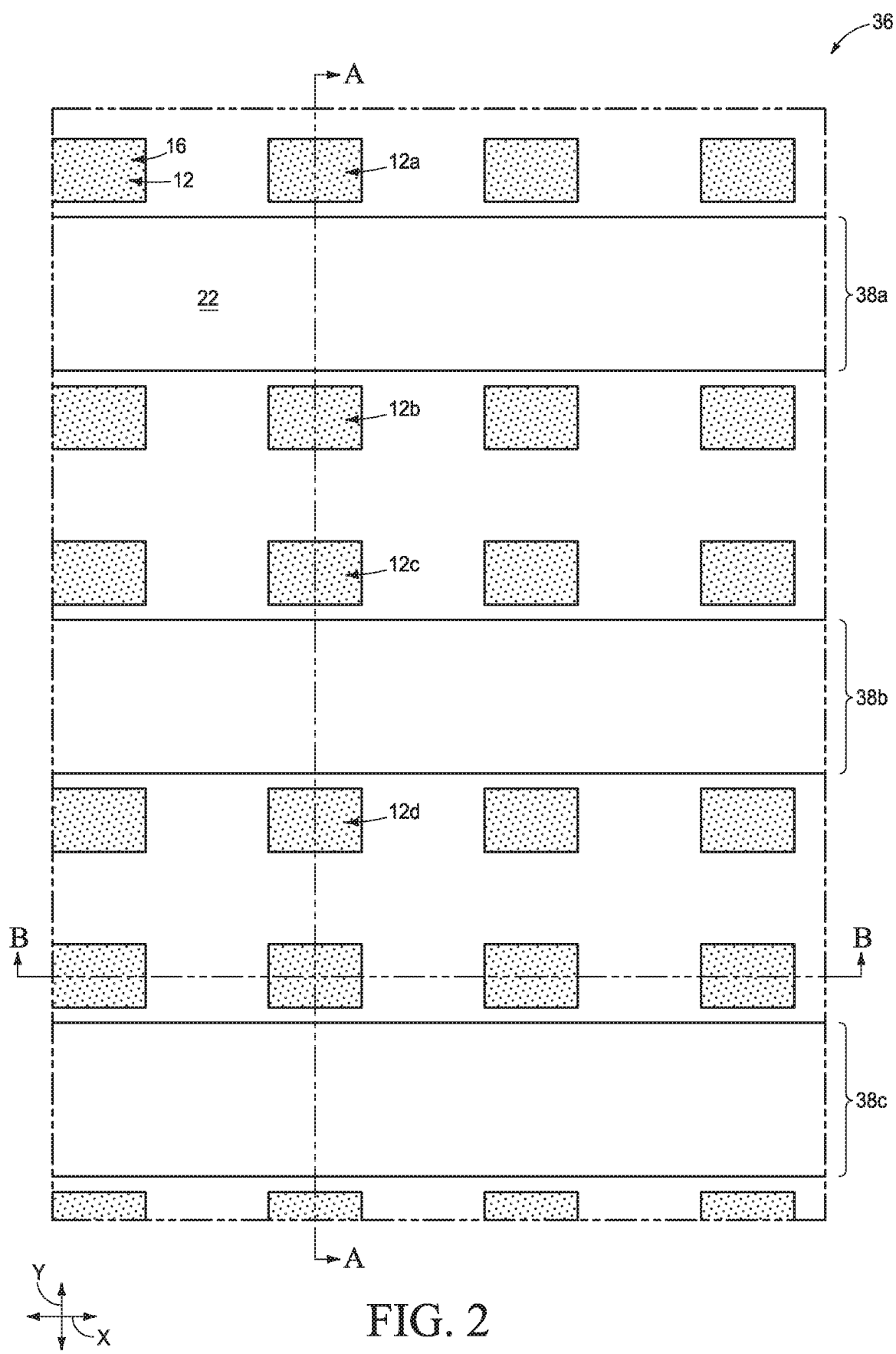
FIGS. 2-2B are diagrammatic views of the region of FIGS. 1-1B at an example process stage following that of FIGS. 1-1B.
Figure 2A:
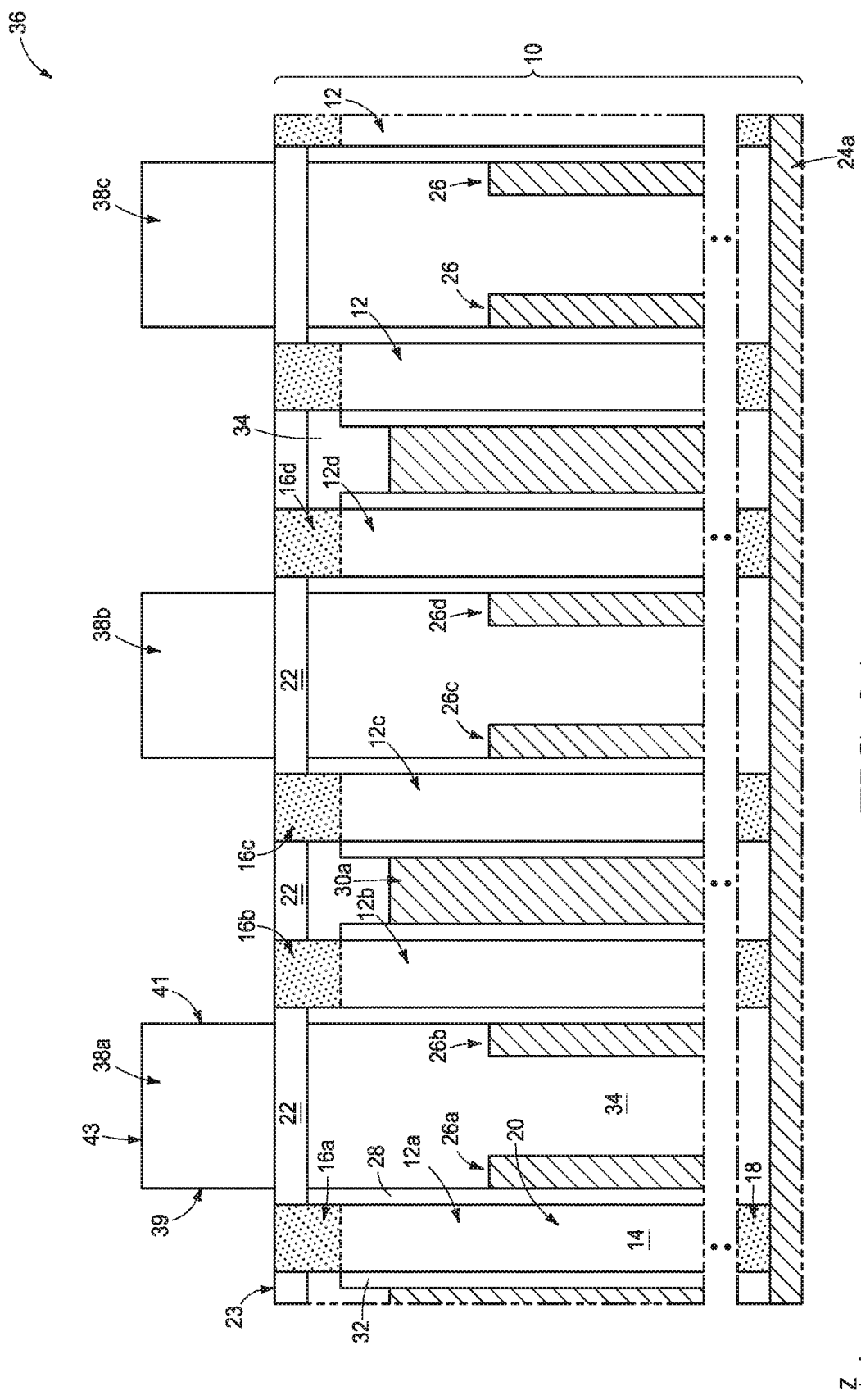
Figure 2B:
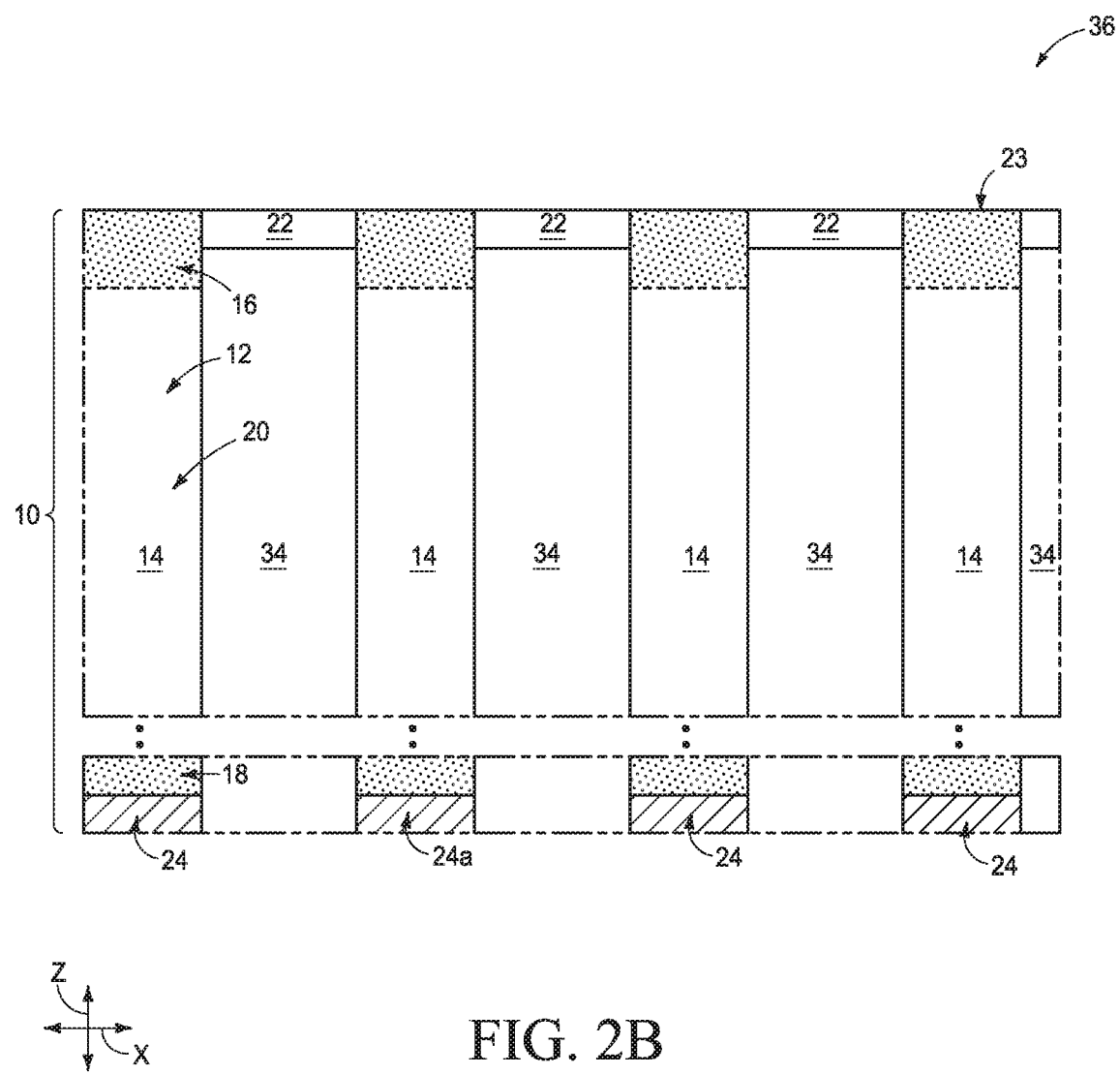

Referring to FIG. 2-2B, the assembly 36 is shown at a process stage subsequent to that of FIGS. 1-1B. Mask structures (beams) 38 are formed over the upper surface 23 of construction 10. The mask structures 38 may comprise any suitable composition(s); and in some embodiments may comprise, consist essentially of, or consist of one or both of silicon dioxide and silicon nitride.

The illustrated mask structures 38 are labeled 38a, 38b and 38c so that they may be distinguished relative to one another. The mask structures 38a, 38b and 38c may be referred to as first, second and third mask structures, respectively. The first mask structure 38a is directly over the first and second gates 26a and 26b, and the second mask structure 38b is directly over the third and fourth gates 26c and 26d.

The mask structures 38 may be formed with any suitable processing. For instance, an expanse of the material of the mask structures 38 may be formed across the upper surface 23, and such expanse may be patterned utilizing a patterned mask (not shown) and one or more suitable etches.

In some embodiments, the mask structures 38 are ultimately removed, and accordingly may comprise sacrificial material. In such embodiments, the mask structures may comprise any suitable composition(s) which may be subsequently removed with one or more etches; and may comprise insulative material, conductive material, semiconductor material, etc. In other embodiments, the mask structures 38 may remain as insulative structures. In such embodiments, the mask structures may comprise one or more electrically insulative materials (e.g., silicon dioxide, silicon nitride, etc.).

The mask structures 38 extend along the direction of the x-axis. The mask structures 38 are over the insulative material 22, and do not cover the source/drain regions 16.

Each of the mask structures 38 has a pair of opposing sidewall surfaces (or simply a pair of opposing sidewalls) 39 and 41, and has a top surface (or simply a top) 43. In the illustrated embodiment, the sidewall surfaces 39 and 41 are substantially vertical and extend substantially orthogonally relative to the substantially horizontal upper surface 23. The term "substantially vertical" means vertical to within reasonable tolerances of fabrication and measurement, the term "substantially orthogonal" means orthogonal to within reasonable tolerances of fabrication and measurement, and the term "substantially horizontal" means horizontal to within reasonable tolerances of fabrication and measurement.

Figure 3:
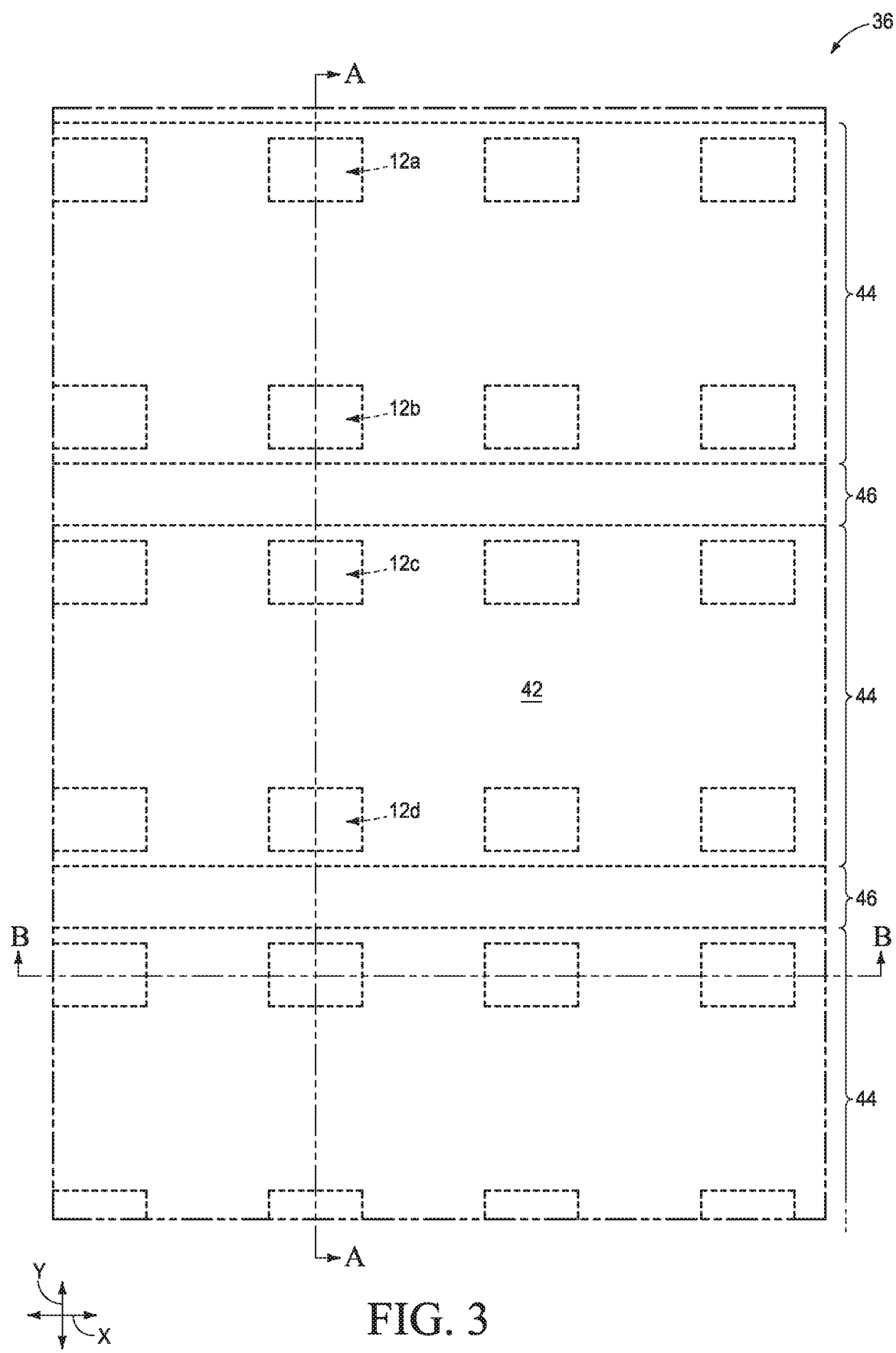
FIGS. 3-3B are diagrammatic views of the region of FIGS. 1-1B at an example process stage following that of FIGS. 2-2B.
Figure 3A:
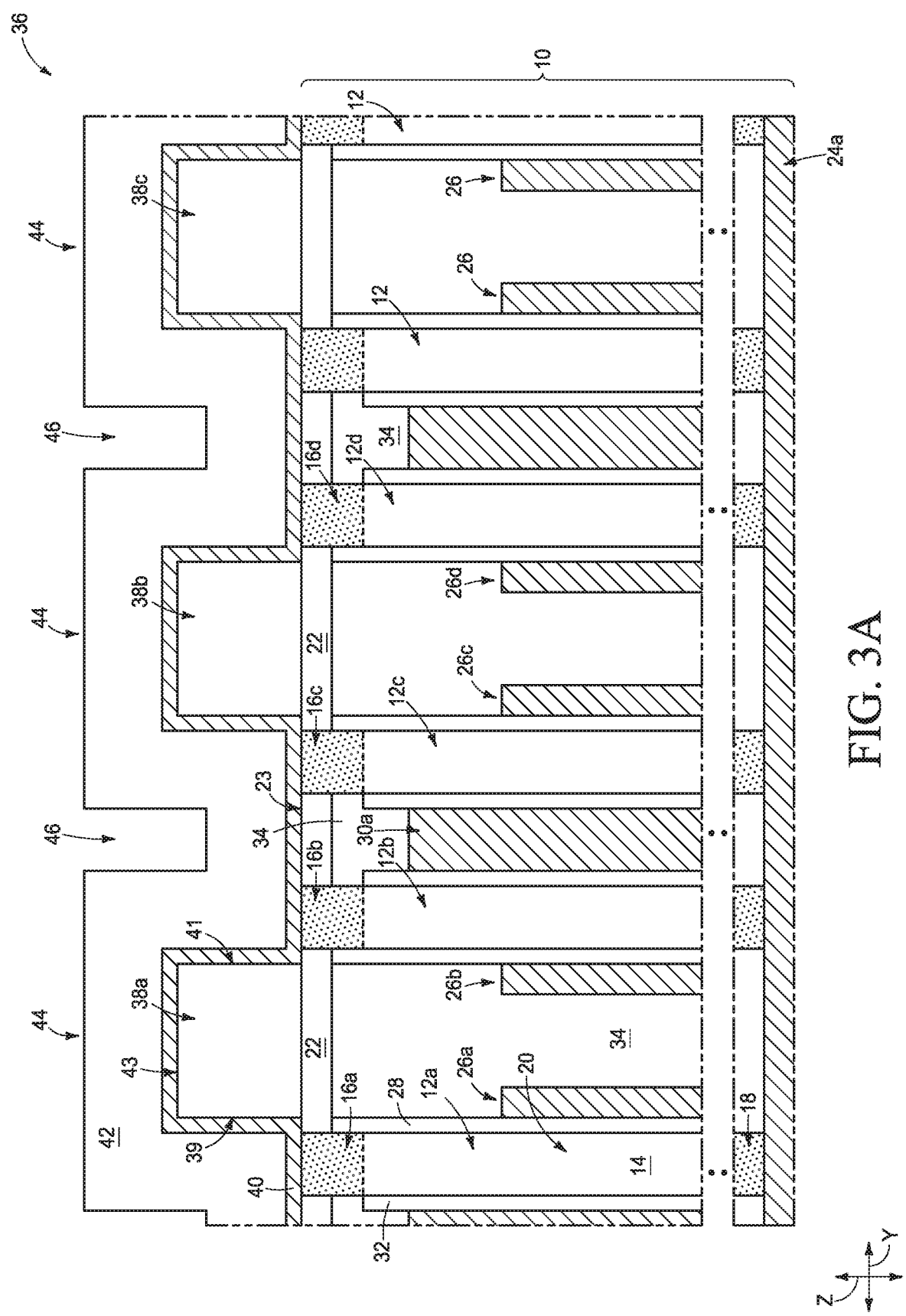
Figure 3B:
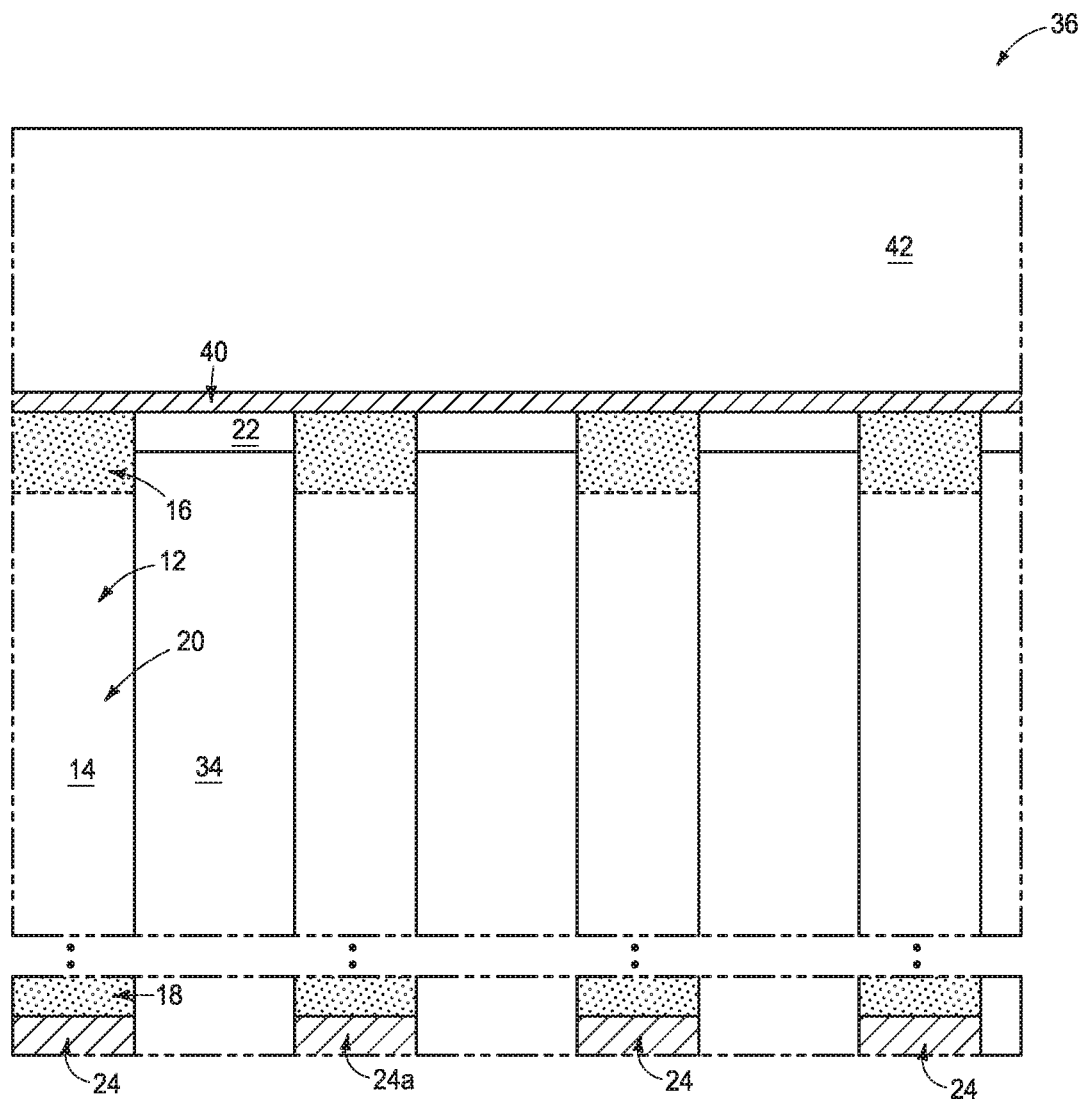

Referring to FIGS. 3-3B, bottom-electrode-material 40 is formed to extend conformally along the surfaces 39, 41 and 43 of the mask structures 38, and along the upper surface 23. The bottom-electrode-material 40 extends across the upper source/drain regions 16, and is electrically coupled with such source/drain regions. In the illustrated embodiment, the bottom-electrode-material 40 is directly against upper surfaces of the source/drain regions 16. The bottom-electrode-material 40 may have any suitable thickness; and in some embodiments may have a thickness within a range of from about 1 nanometer (nm) to about 5 nm.

The bottom-electrode-material 40 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the bottom-electrode-material 40 may comprise, consist essentially of, or consist of titanium nitride.

A patterning material 42 is formed over the bottom-electrode-material 40. The patterning material 42 has an undulating topography which includes peaks 44 over the mask structures 38, and valleys 46 between the peaks. The material 42 may be formed to any suitable thickness (e.g., a thickness between about 10 nm to about 30 nm); and may comprise any suitable composition(s). In some embodiments, the material 42 may comprise, consist essentially of, or consist of one or more of silicon dioxide, silicon nitride and silicon oxynitride. In the embodiment of FIGS. 3-3B, the material 42 may comprise silicon dioxide.

The pillars 12 are shown in dashed-line (phantom) view in FIG. 3 to indicate that they are under other materials.

Figure 4:
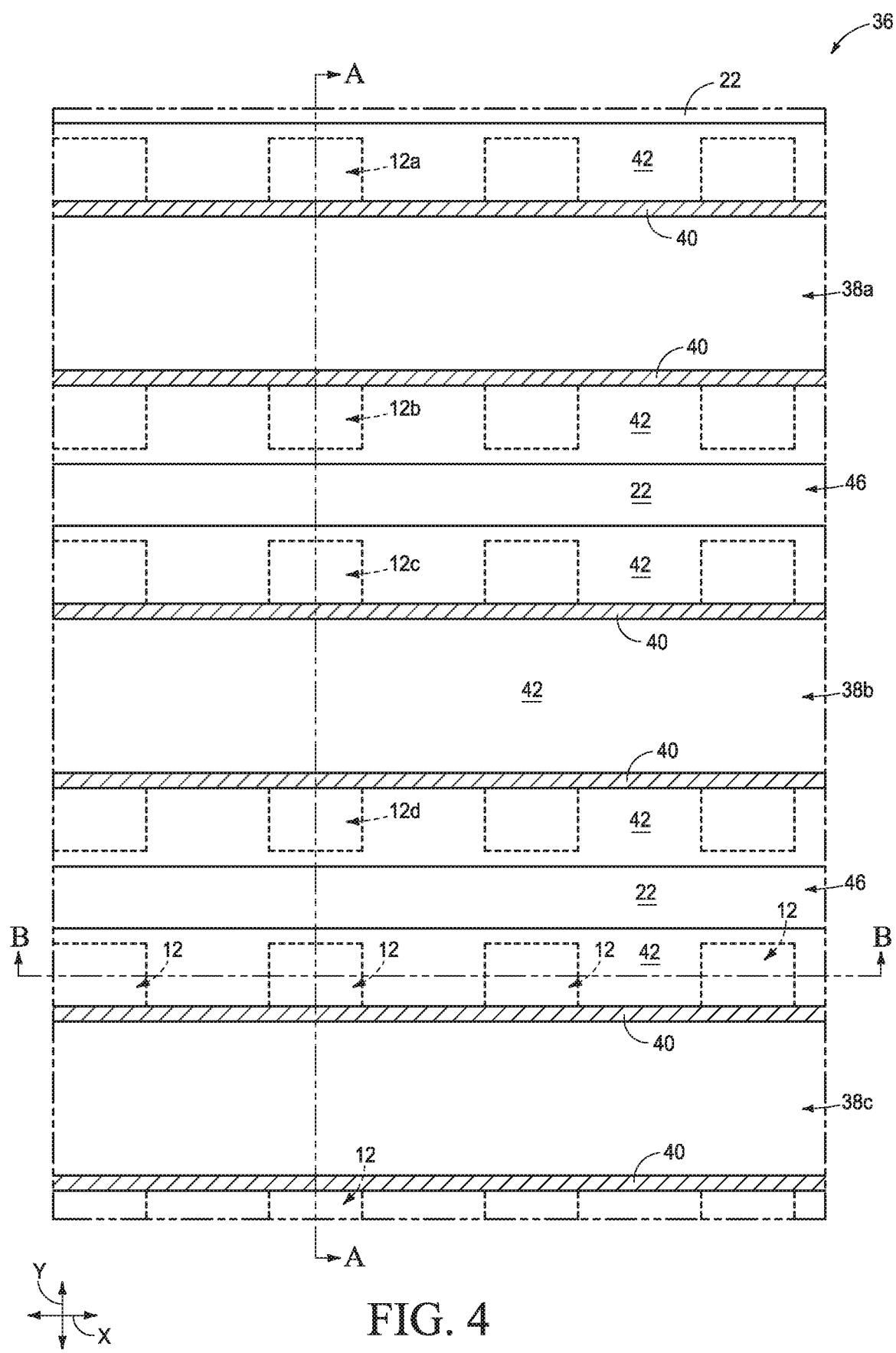
FIGS. 4-4B are diagrammatic views of the region of FIGS. 1-1B at an example process stage following that of FIGS. 3-3B.
Figure 4A:
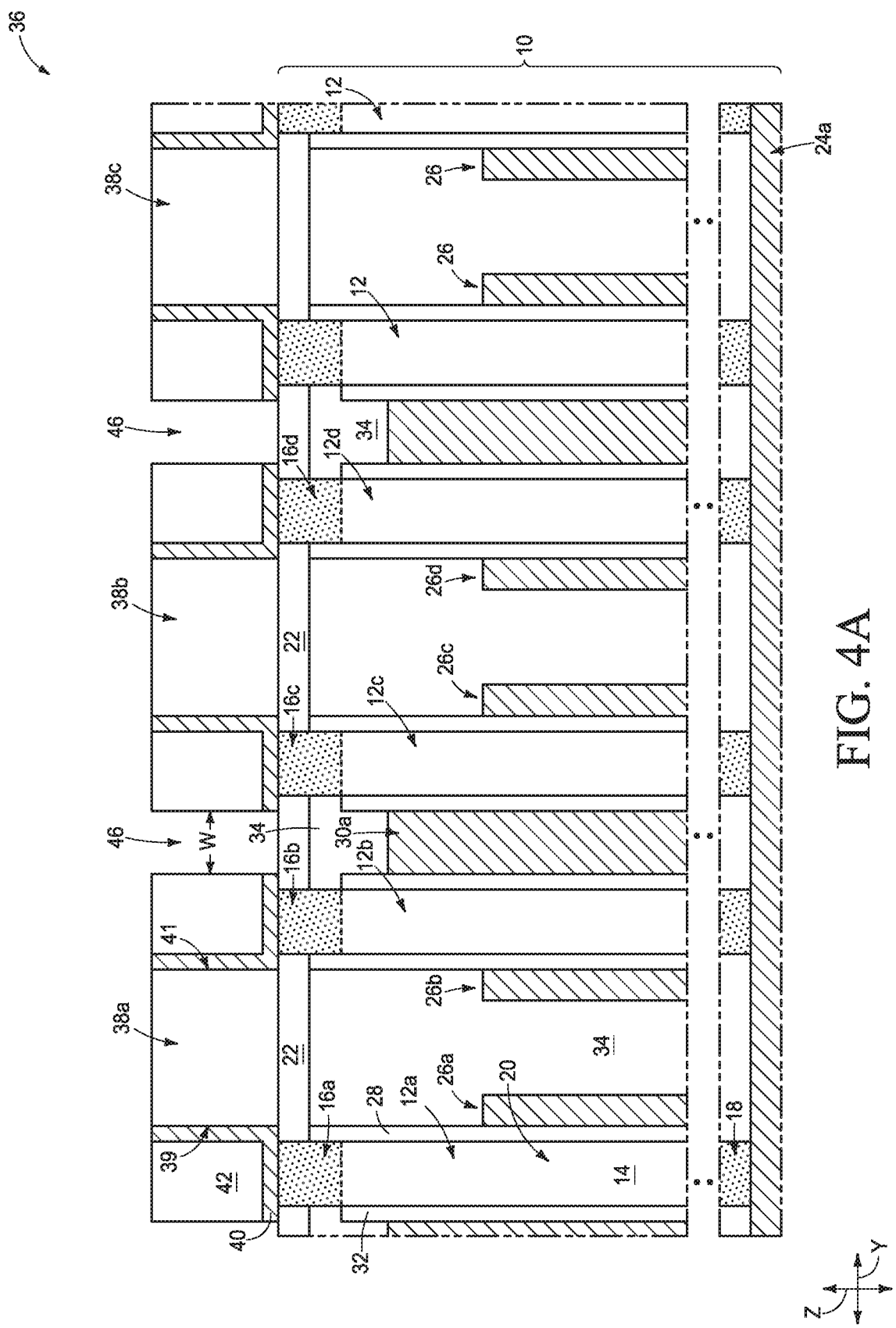
Figure 4B:
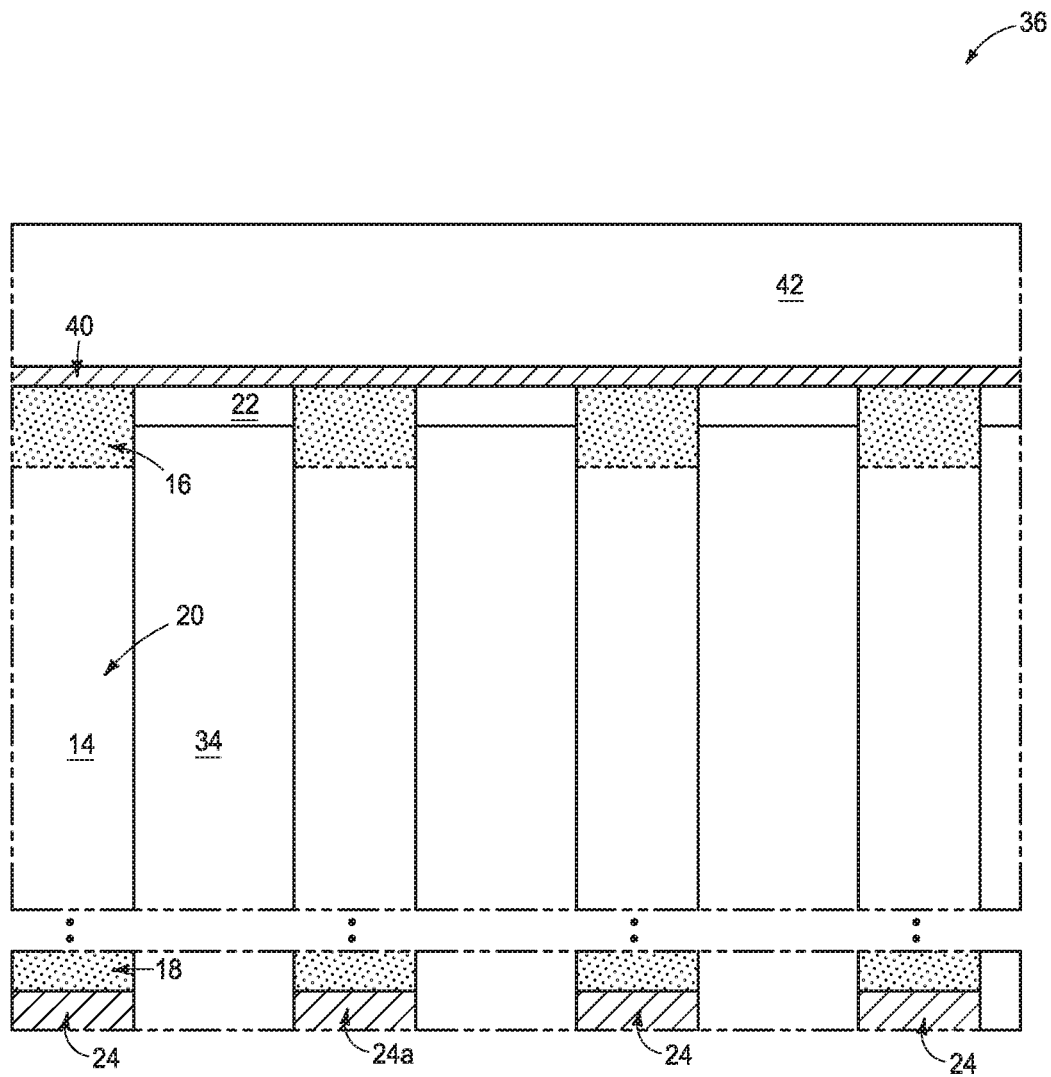

Referring to FIGS. 4-4B, the assembly 36 is subjected to one or more etches, and possibly also planarization, to remove materials 40 and 42 from over the mask structures 38; and to extend the valleys 46 through the materials 40 and 42, and to the insulative material 22. The valleys 46 thus become openings 46 which extend through the materials 42 and 40 to the material 22. In the illustrated embodiment the openings 46 stop at an upper surface of the material 22. In other embodiments the openings 46 may penetrate into the material 22 (or may even penetrate through the material 22 and stop at the underlying material 34).

The illustrated embodiment shows the upper surfaces of mask structures 38, material 40 and material 42 being substantially coplanar. In other embodiments at least one of such upper surfaces may be at a different elevational level relative to one or more of the others of such upper surfaces.

The illustrated openings 46 may, for example, have widths W along the cross-section of FIG. 4A within a range of from about 10 nm to about 30 nm.

Figure 5:
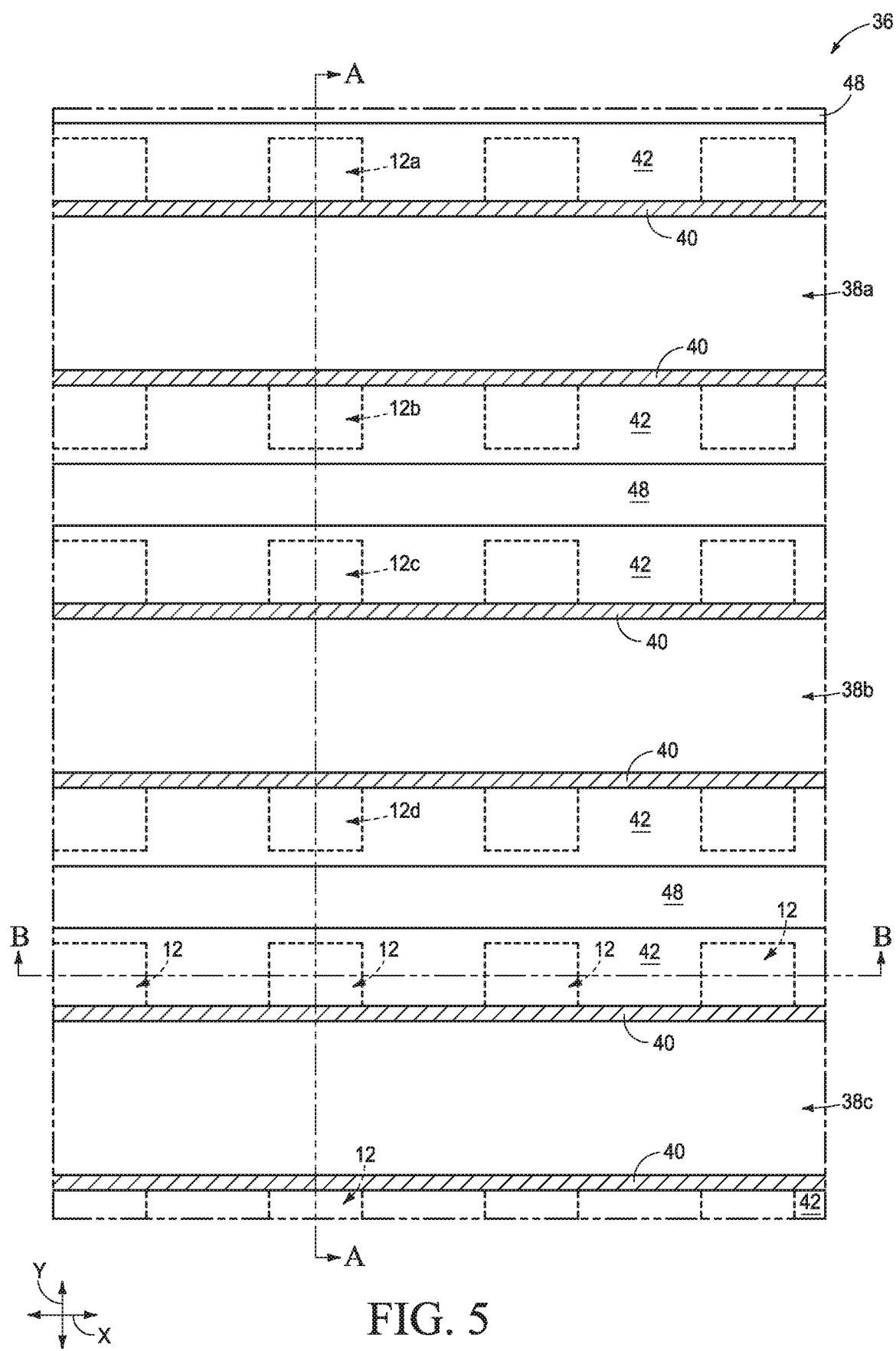
FIGS. 5-5B are diagrammatic views of the region of FIGS. 1-1B at an example process stage following that of FIGS. 4-4B.
Figure 5A:
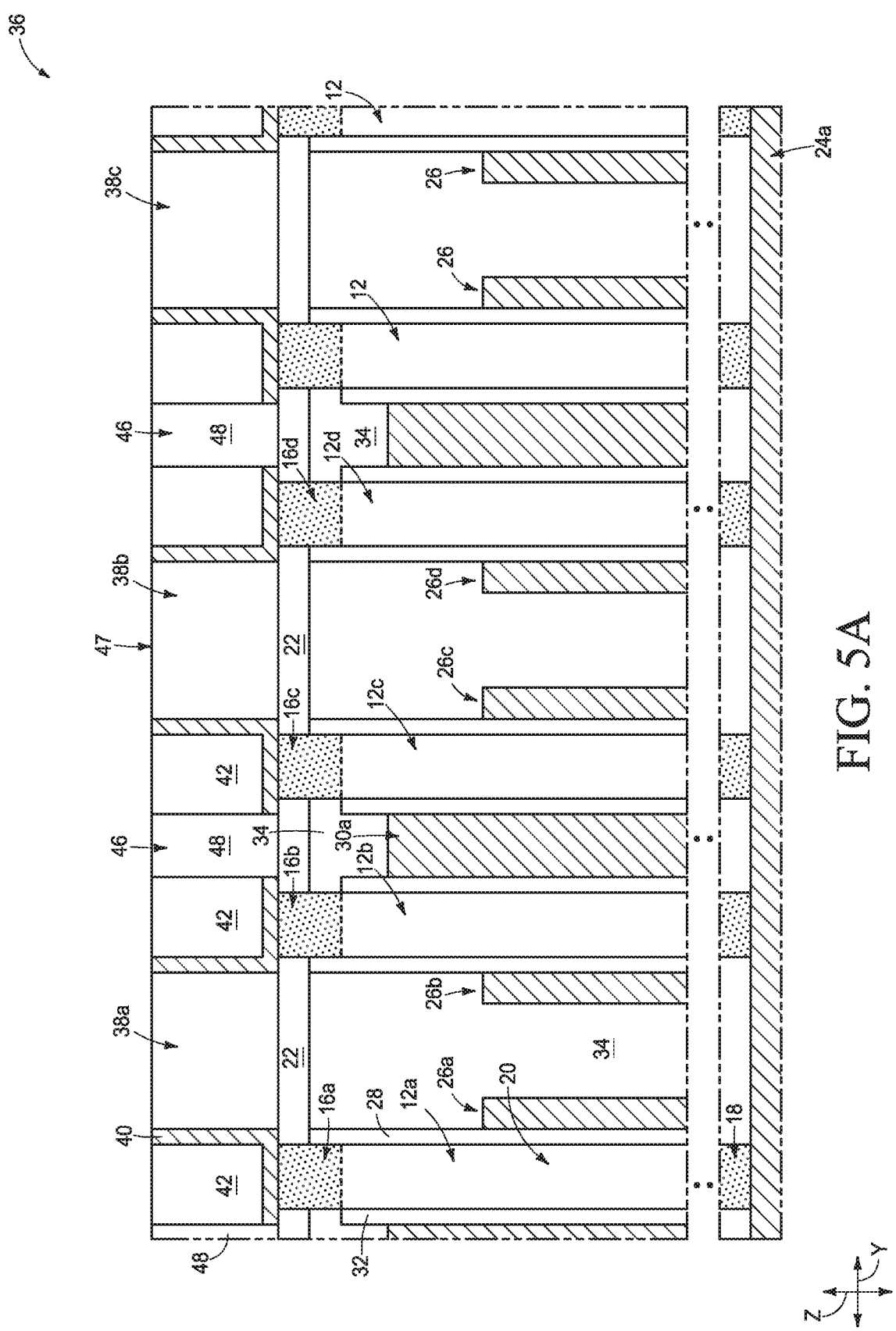
Figure 5B:
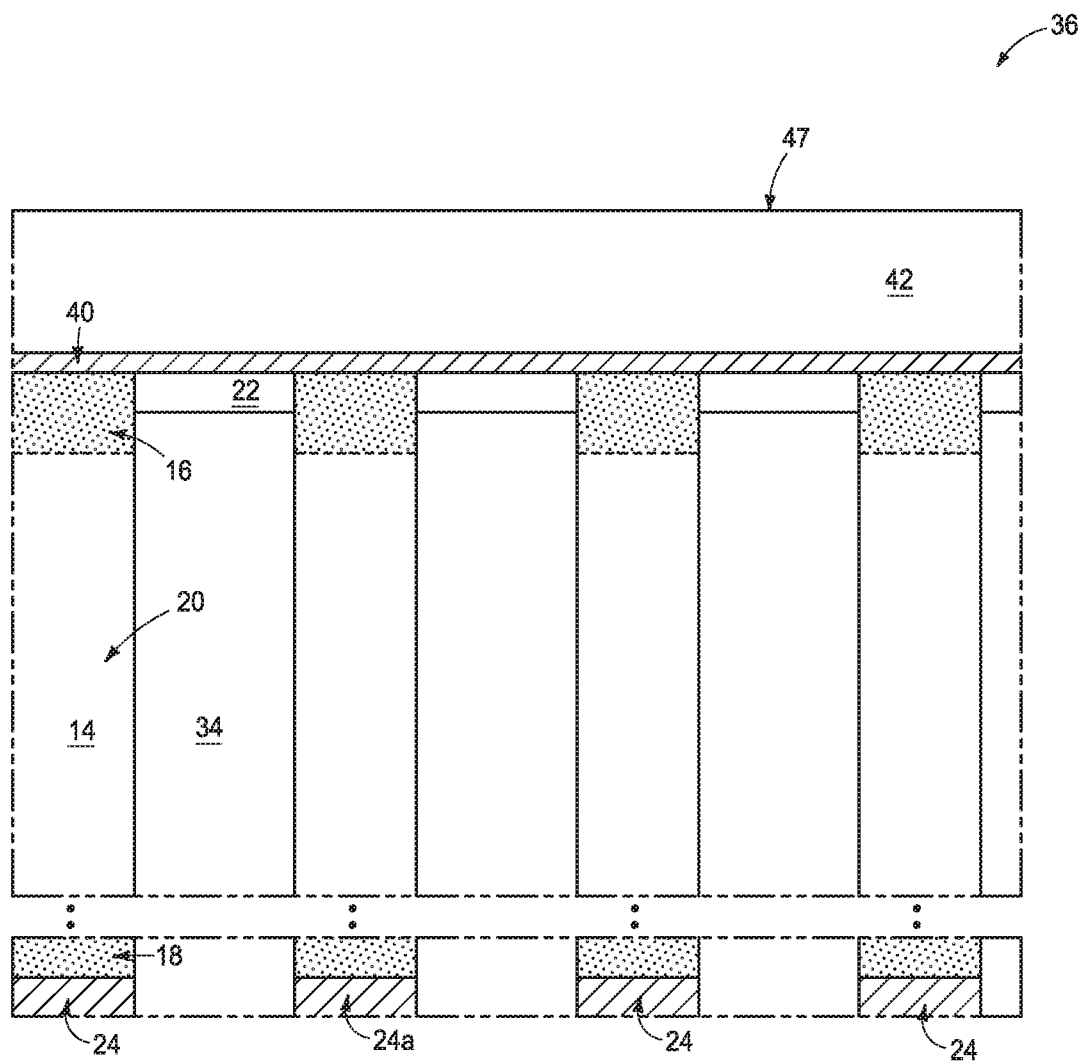

Referring to FIGS. 5-5B, fill material 48 is formed within the openings 46. Subsequently, CMP and/or other suitable planarization is utilized to form a planar surface 47 extending across the mask structures 38 and the materials 40, 42 and 48.

The fill material 48 may comprise any suitable composition(s); and in some embodiments may comprise, consist essentially of, or consist of one or more of silicon dioxide, silicon nitride and silicon oxynitride. Accordingly, the fill material 48 may or may not be a same composition as the patterning material 42.

Figure 6:
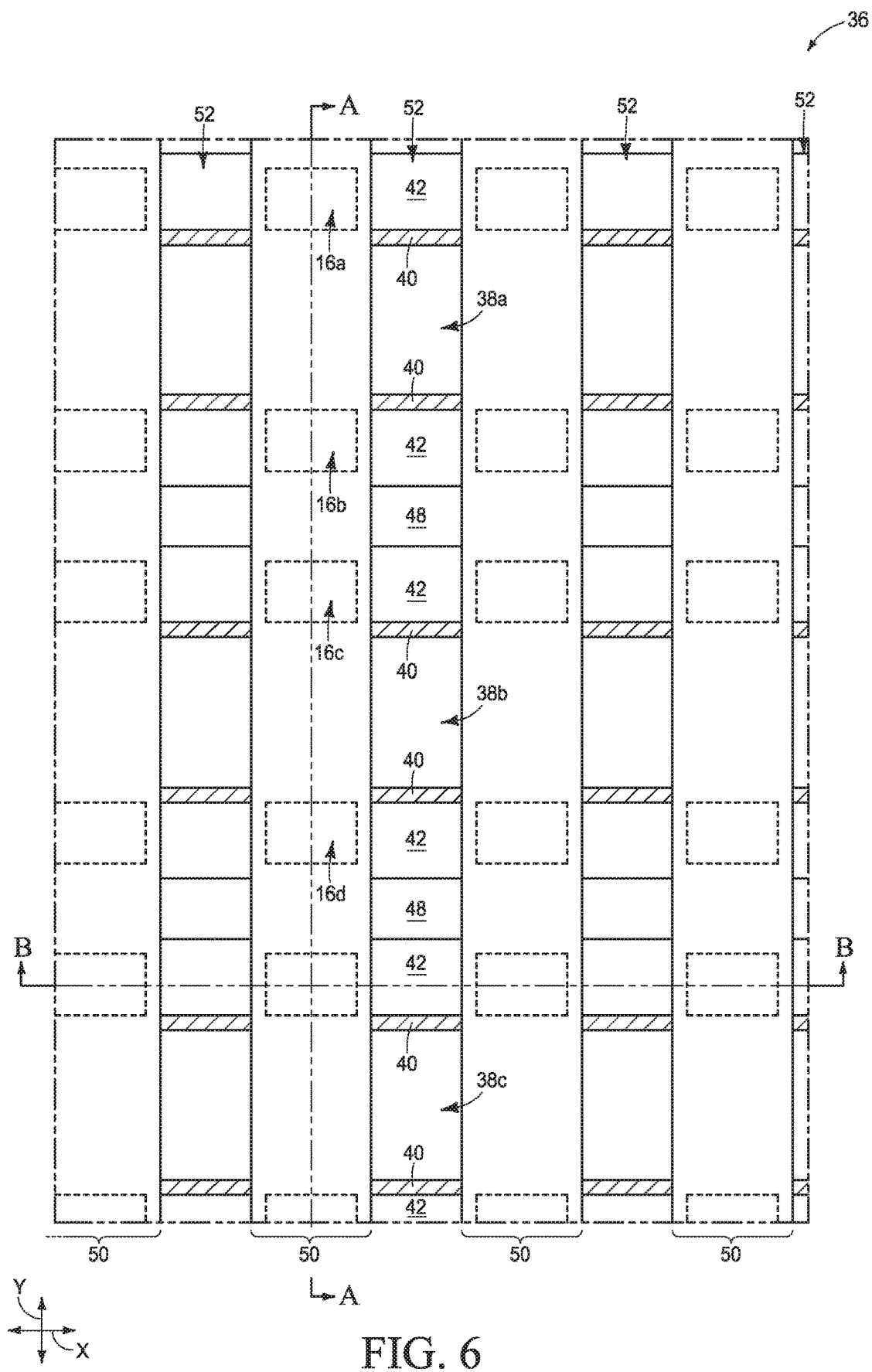
FIGS. 6-6B are diagrammatic views of the region of FIGS. 1-1B at an example process stage following that of FIGS. 5-5B.
Figure 6A:
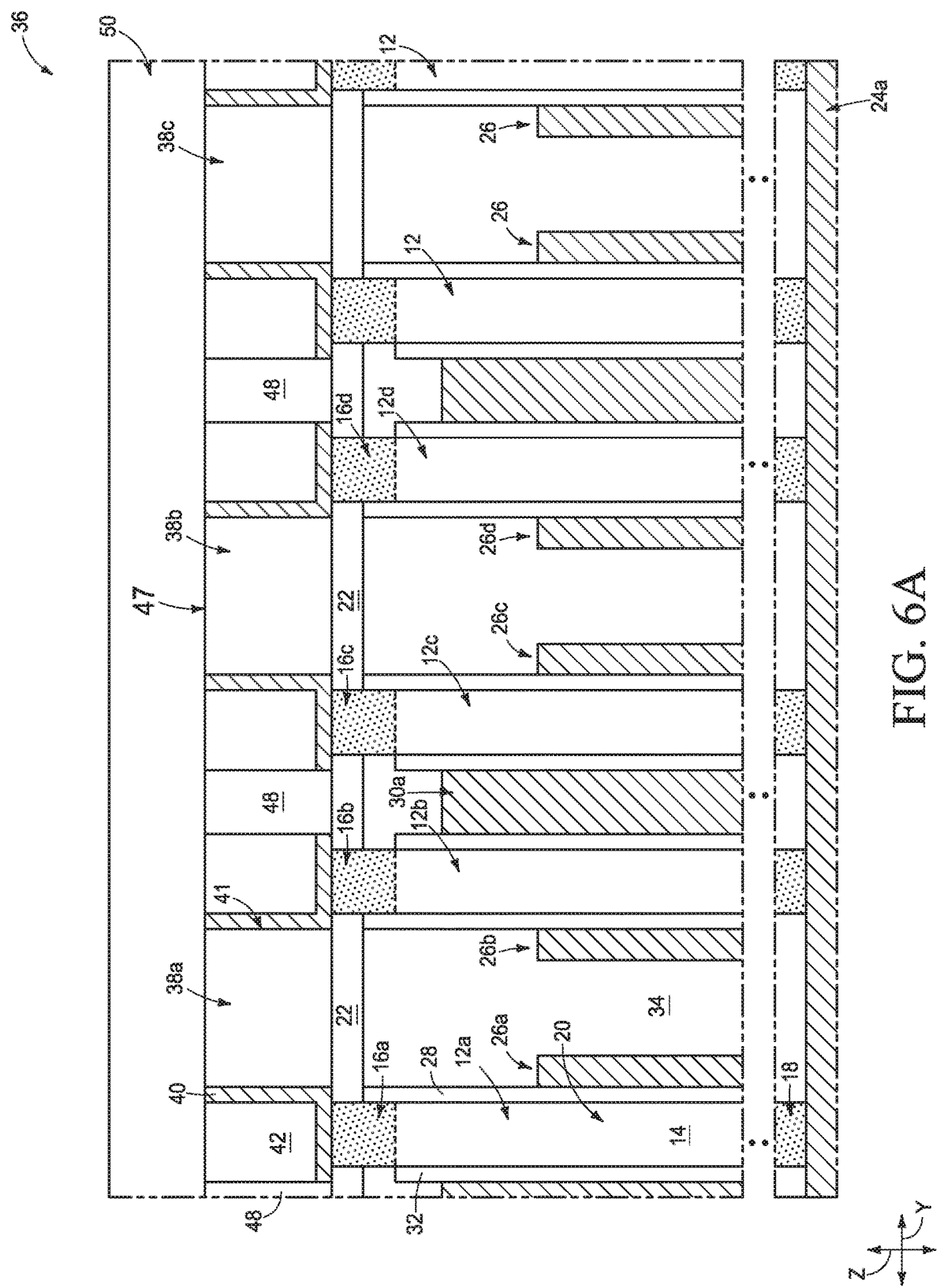
Figure 6B:
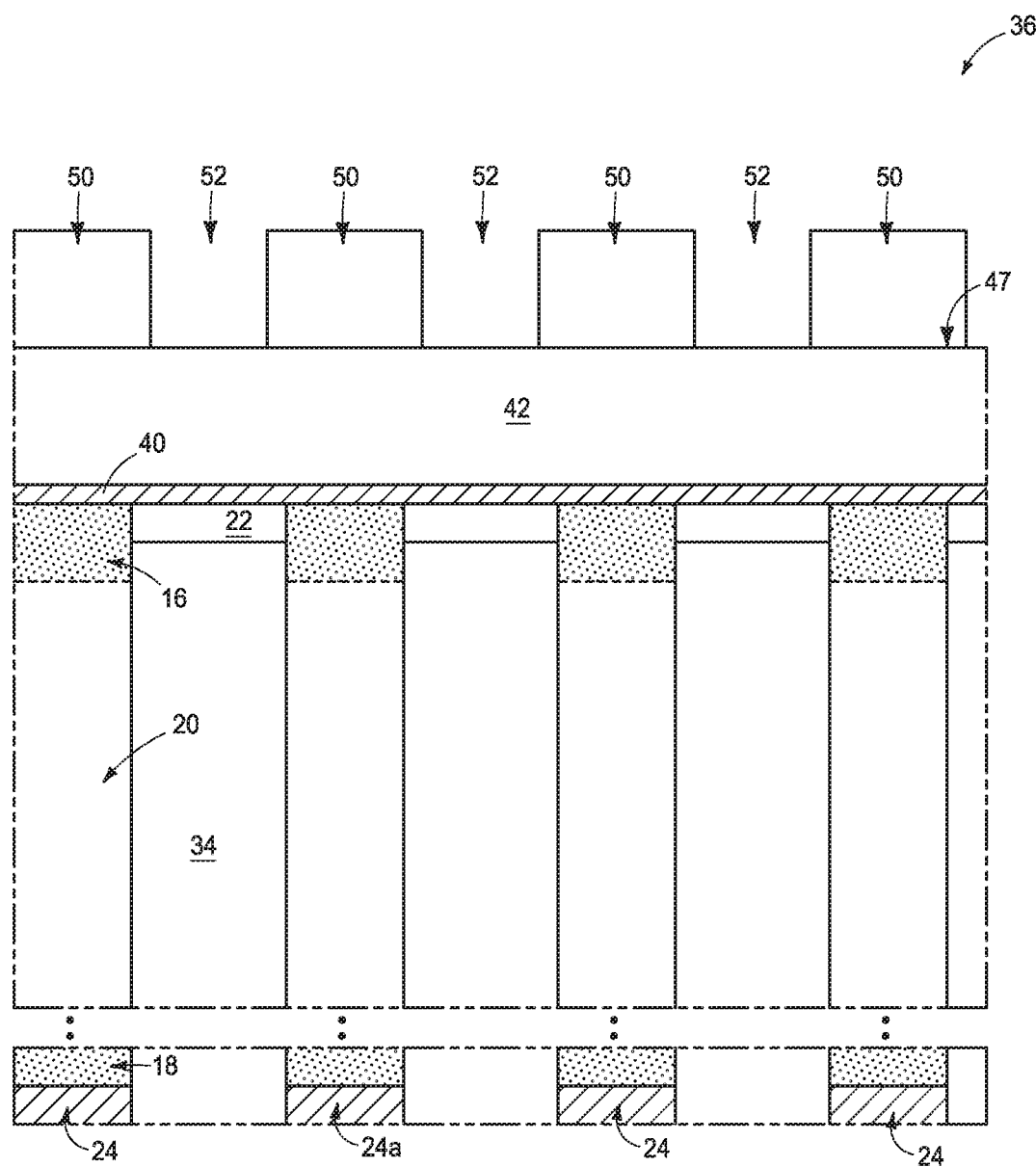

Referring to FIGS. 6-6B, additional mask structures (additional beams) 50 are formed on the planar surface 47, and extend along the y-axis direction. In some embodiments the mask structures 50 may be referred to as second mask structures to distinguish them from the first mask structures 38. The mask structures 50 may comprise any suitable composition(s); and in some embodiments may comprise, consist essentially of, or consist of carbon-containing material (e.g., amorphous carbon, resist, etc.).

The mask structures 50 may be formed with any suitable processing. For instance, an expanse of the material of the mask structures 50 may be formed across the upper surface 47, and such expanse may be patterned utilizing a patterned mask (not shown) and one or more suitable etches.

The mask structures 50 are spaced from one another by intervening gaps 52.

Figure 7:
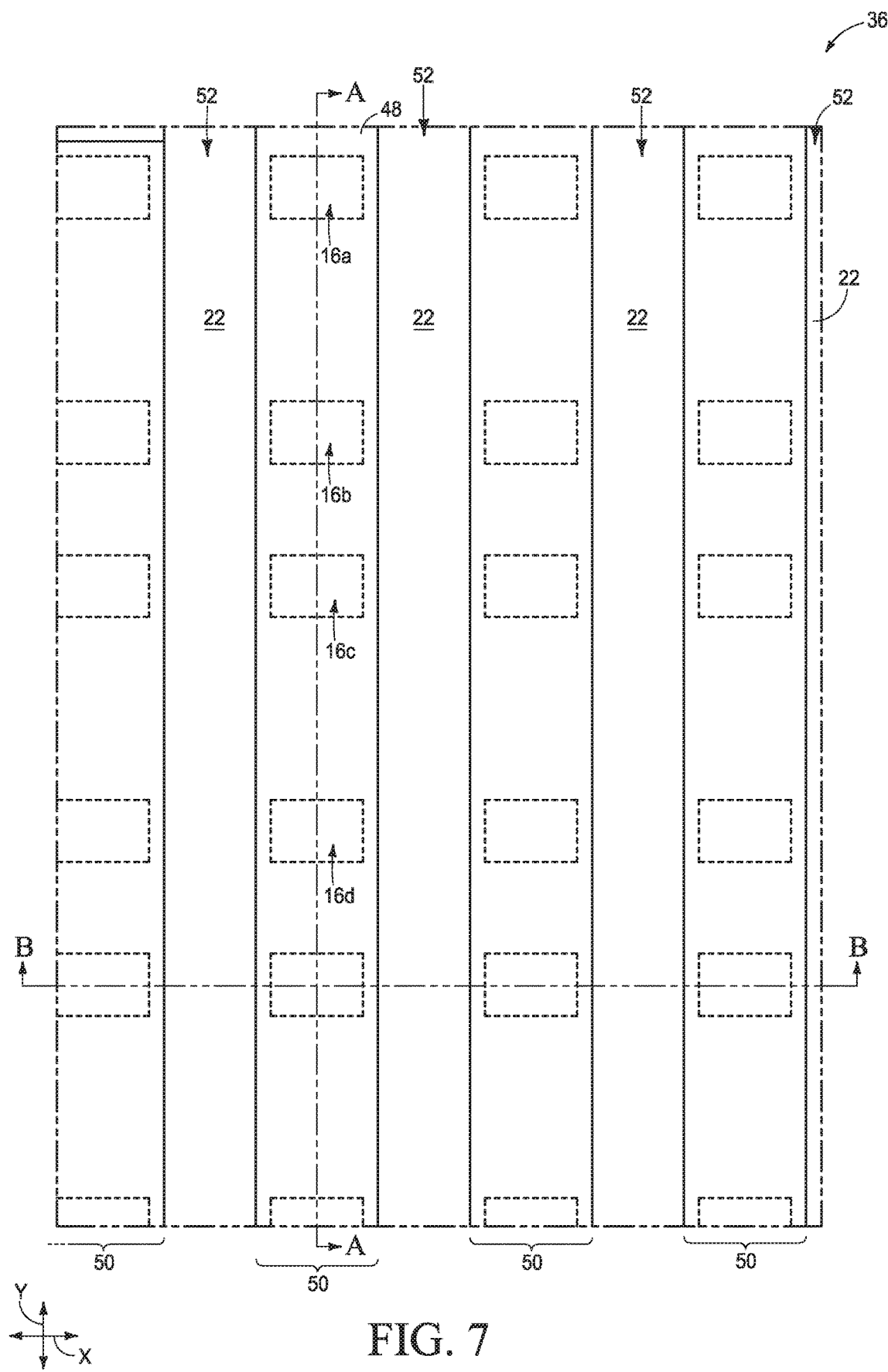
FIGS. 7-7B are diagrammatic views of the region of FIGS. 1-1B at an example process stage following that of FIGS. 6-6B.
Figure 7A:
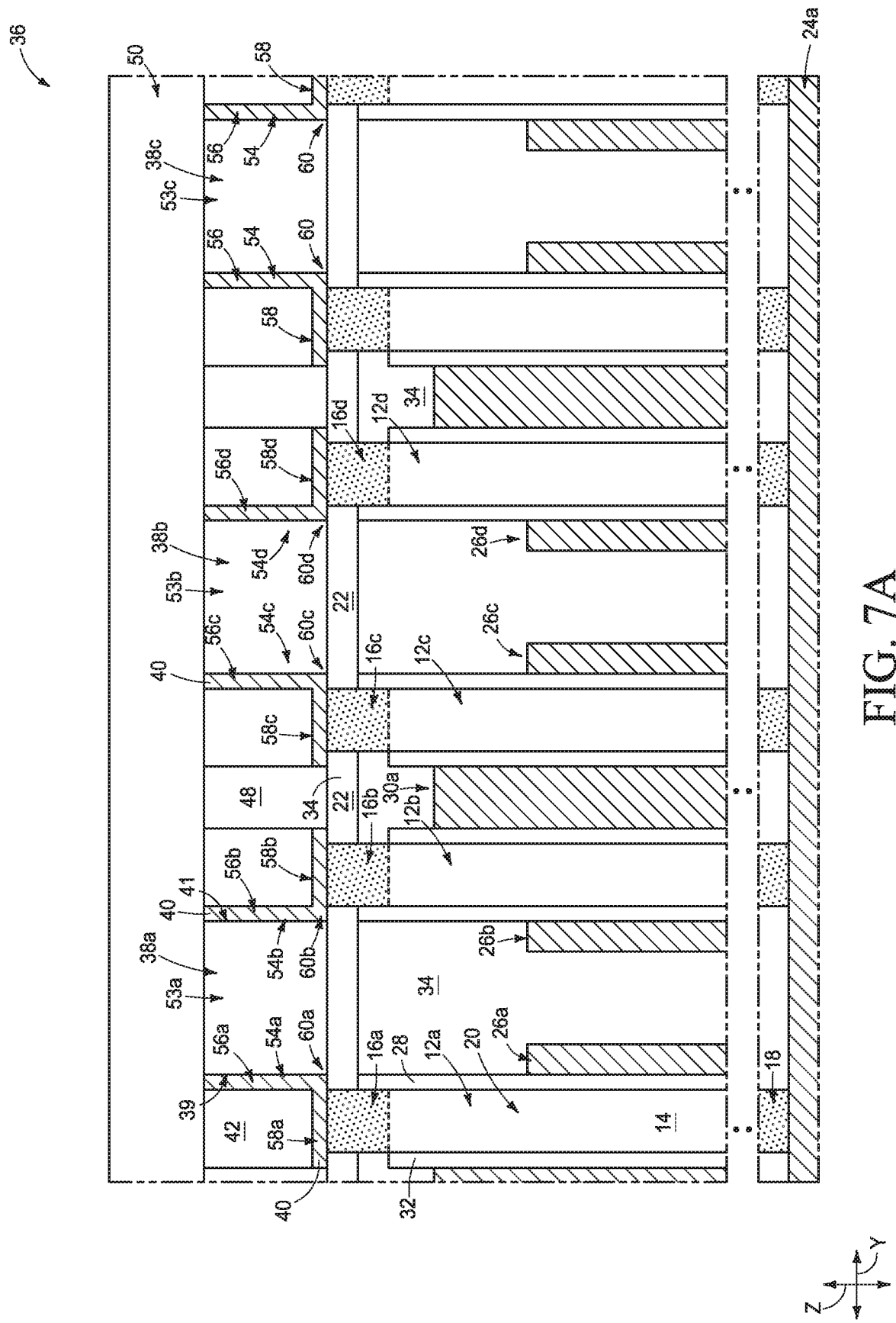
Figure 7B:
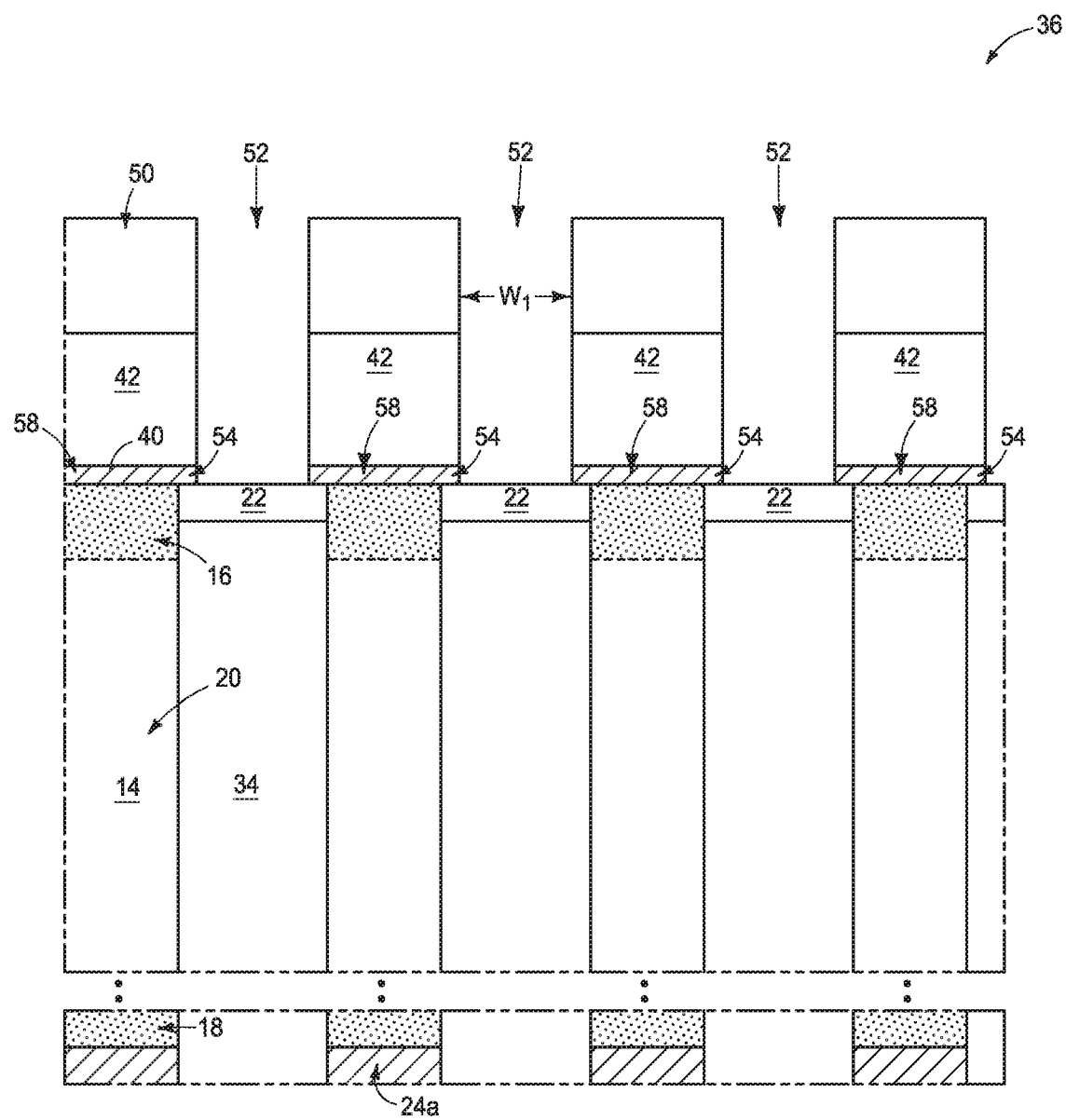

Referring to FIGS. 7-7B, the gaps 52 are extended through the materials 40, 42 and 48, and to an upper surface of the insulative material 22. In other embodiments (not shown), the gaps 52 may punch into the material 22, or even through the material 22 and into the underlying insulative material 34.

The gaps 52 are extended through the mask structures 38 and pattern remaining portions of the mask structures into blocks (or masses) 53. FIG. 7A shows blocks (masses) 53a, 53b and 53c patterned from remaining portions of the mask structures 38a, 38b and 38c, respectively.

The gaps 52 may, for example, have widths Wi within a range of from about 10 nm to about 30 nm. The widths Wi of the gaps 52 may or may not be the same as the widths W of the openings 46 of FIG. 4A.

The gaps 52 may be extended through the materials 42 and 40 with any suitable processing, including, for example, dry etching to anisotropically etch through the materials 42 and 40. Alternatively, dry etching may be utilized to anisotropically etch through the material 42, and then a wet etch may be utilized to extend the openings 52 through the thin layer corresponding to the bottom-electrode-material 40.

The patterning of the bottom-electrode-material 40 at the process stage of FIG. 4 (which forms the bottom-electrode-material 40 into strips extending along the x-axis as shown in the top view of FIG. 4), and the subsequent process stage of FIG. 7 (which subdivides the strips utilizing trenches 52 that extend along the y-axis direction) may be considered to pattern the bottom-electrode-material 40 into bottom-electrode-structures (bottom electrodes) 54. Each of the bottom-electrode-structures is over one of the source/drain regions 16. Four of the bottom-electrode-structures along the cross-section of FIG. 7A are labeled as 54a-d so that they may be distinguished from the other bottom-electrode-structures. Each of the bottom-electrode-structures 54a-d is associated with a corresponding one of the upper source/drain regions 16a-d, and may be considered to be associated with a corresponding one of the vertically-extending pillars 12a-d. The bottom-electrode-structures 54a-d may be referred to as first, second, third and fourth bottom-electrode-structures, respectively.

Each of the bottom-electrode-structures 54 has a vertical segment 56 along one of sidewalls (39, 41) of a mask structure 38, and has a horizontal segment 58 along a source/drain region 16. The horizontal segments 58 join to the vertical segments 56 at corners 60. The corners 60 may be about 90° (i.e., may be approximately right angles), with the term "about 90°" meaning 90° to within reasonable tolerances of fabrication and measurement.

In the illustrated embodiment, the vertical segments 56 are longer than the horizontal segments 58. In other embodiments, the segments 56 and 58 may be about the same length as one another, or the horizontal segments 58 may be longer than the vertical segments 56.

Some of the vertical segments of FIG. 7A are labeled as segments 56a-d so that they may be distinguished from one another, and from others of the vertical segments. The vertical segments 56a-d may be referred to as first, second, third and fourth vertical segments, respectively.

Some of the horizontal segments of FIG. 7A are labeled as segments 58a-d so that they may be distinguished from one another, and from others of the horizontal segments. The horizontal segments 58a-d may be referred to as first, second, third and fourth horizontal segments, respectively.

Some of the corners of FIG. 7A are labeled as corners 60a-d so that they may be distinguished from one another, and from others of the corners. The corners 60a-d may be referred to as first, second, third and fourth corners, respectively.

The bottom-electrode-structures may be considered to be configured as angle plates. In some embodiments, the bottom-electrode-structures 54a-d may be referred to as first, second, third and fourth angle plates, respectively. In some embodiments, the pillars 12b and 12c may be referred to as first and second pillars, respectively; and the structures 54b and 54c may be referred to as first and second bottom electrodes, respectively.

Figure 8:
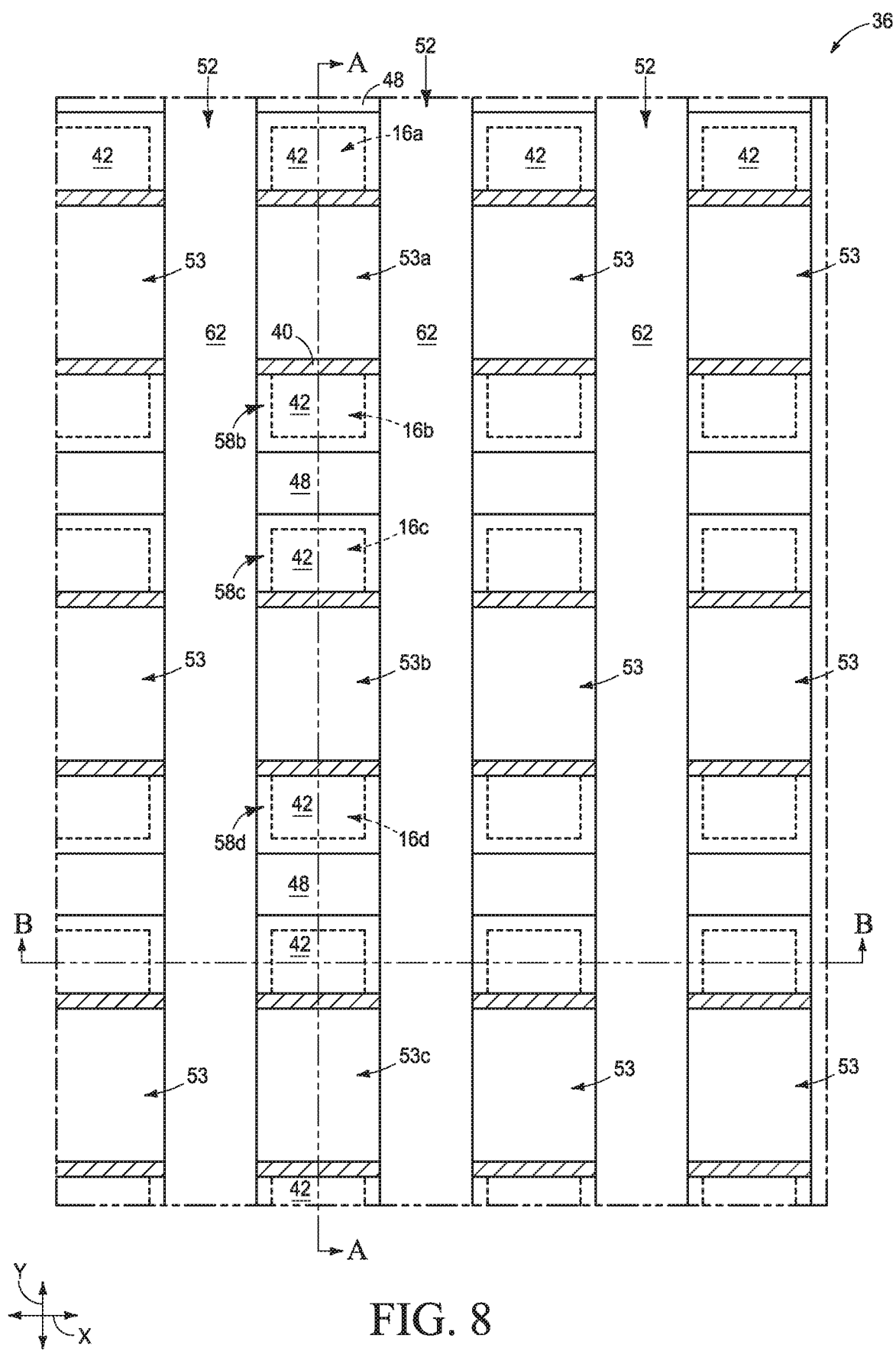
FIGS. 8-8B are diagrammatic views of the region of FIGS. 1-1B at an example process stage following that of FIGS. 7-7B.
Figure 8A:
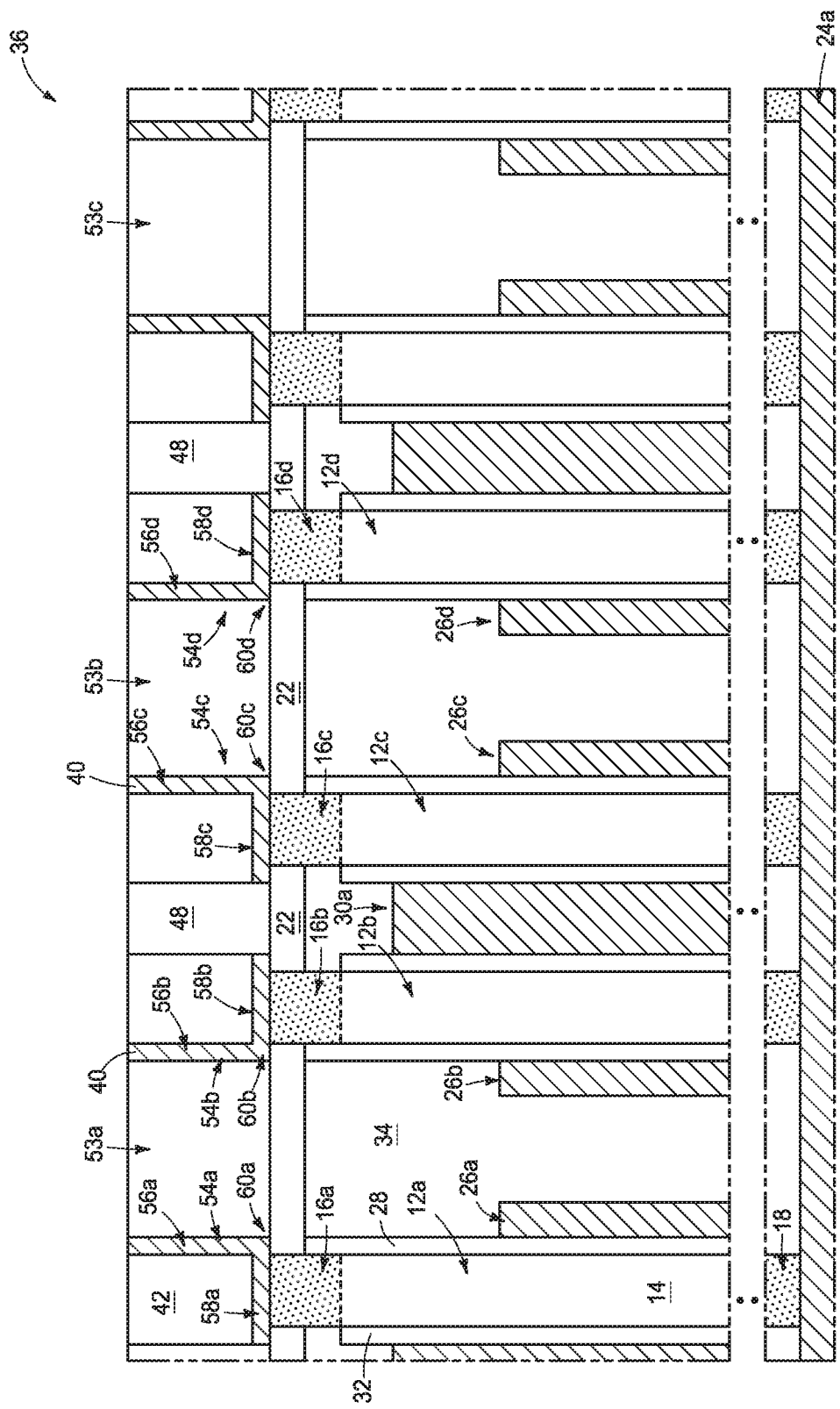
Figure 8B:
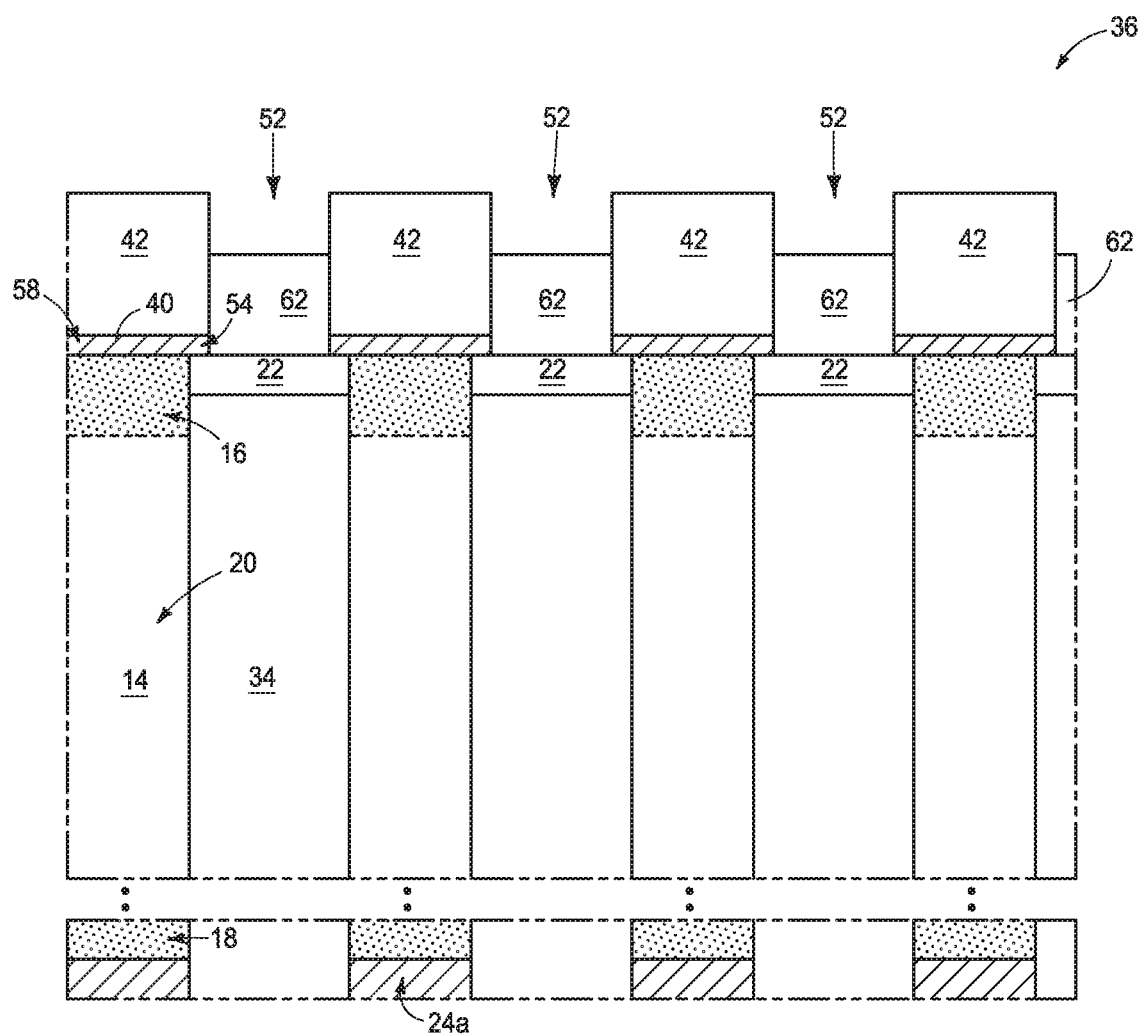

Referring to FIGS. 8-8B, the mask structures 50 (FIG. 7-7B) are removed, and a material 62 is provided within the openings 52 to partially fill such openings. The material 62 may comprise any suitable composition(s); and in some embodiments may comprise carbon (e.g., spin-on carbon, amorphous carbon, etc.). The material 62 may be a sacrificial material. In some embodiments, the material 62 may be referred to as a step material.

Figure 9:
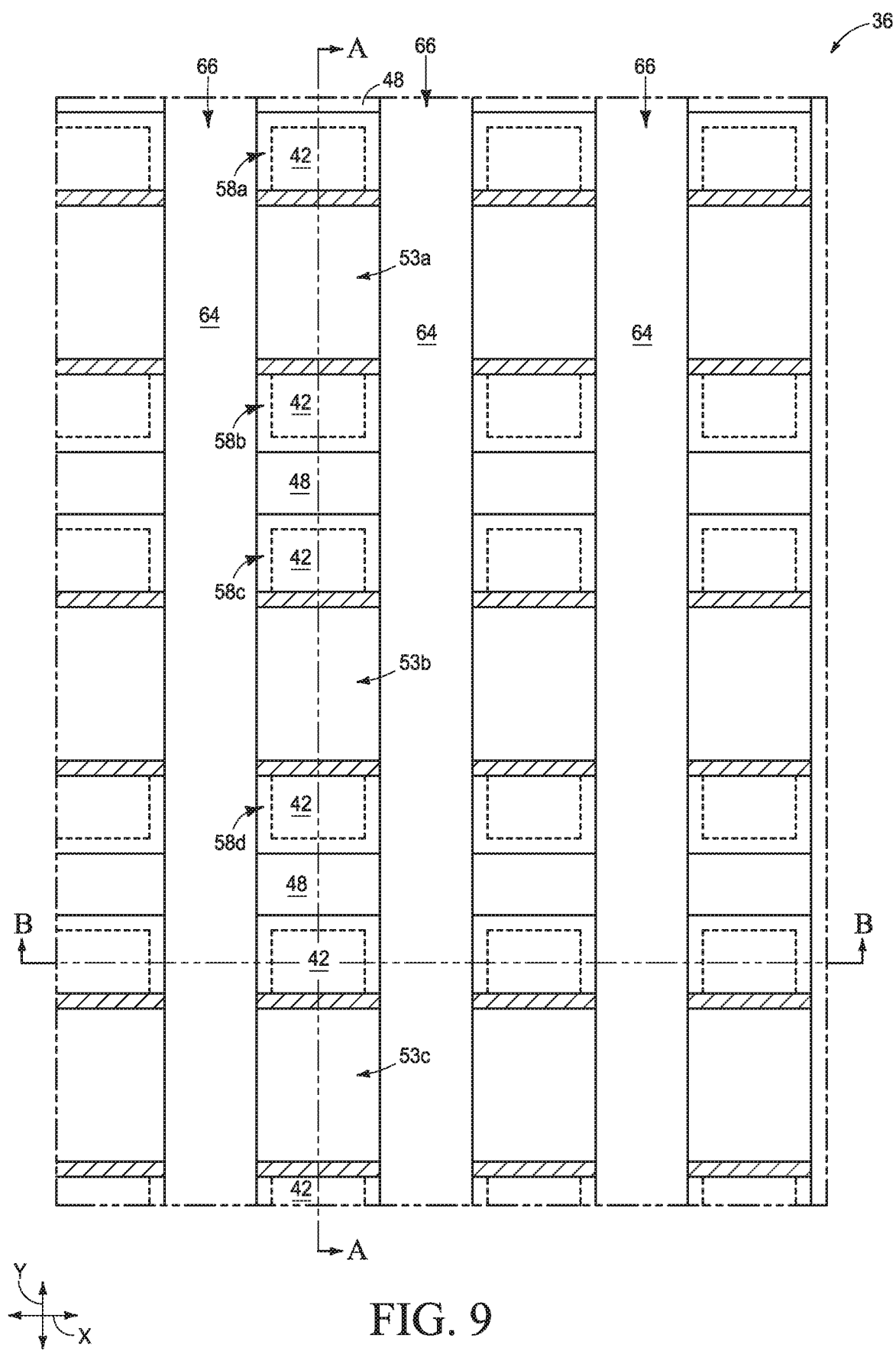
FIGS. 9-9B are diagrammatic views of the region of FIGS. 1-1B at an example process stage following that of FIGS. 8-8B.
Figure 9A:
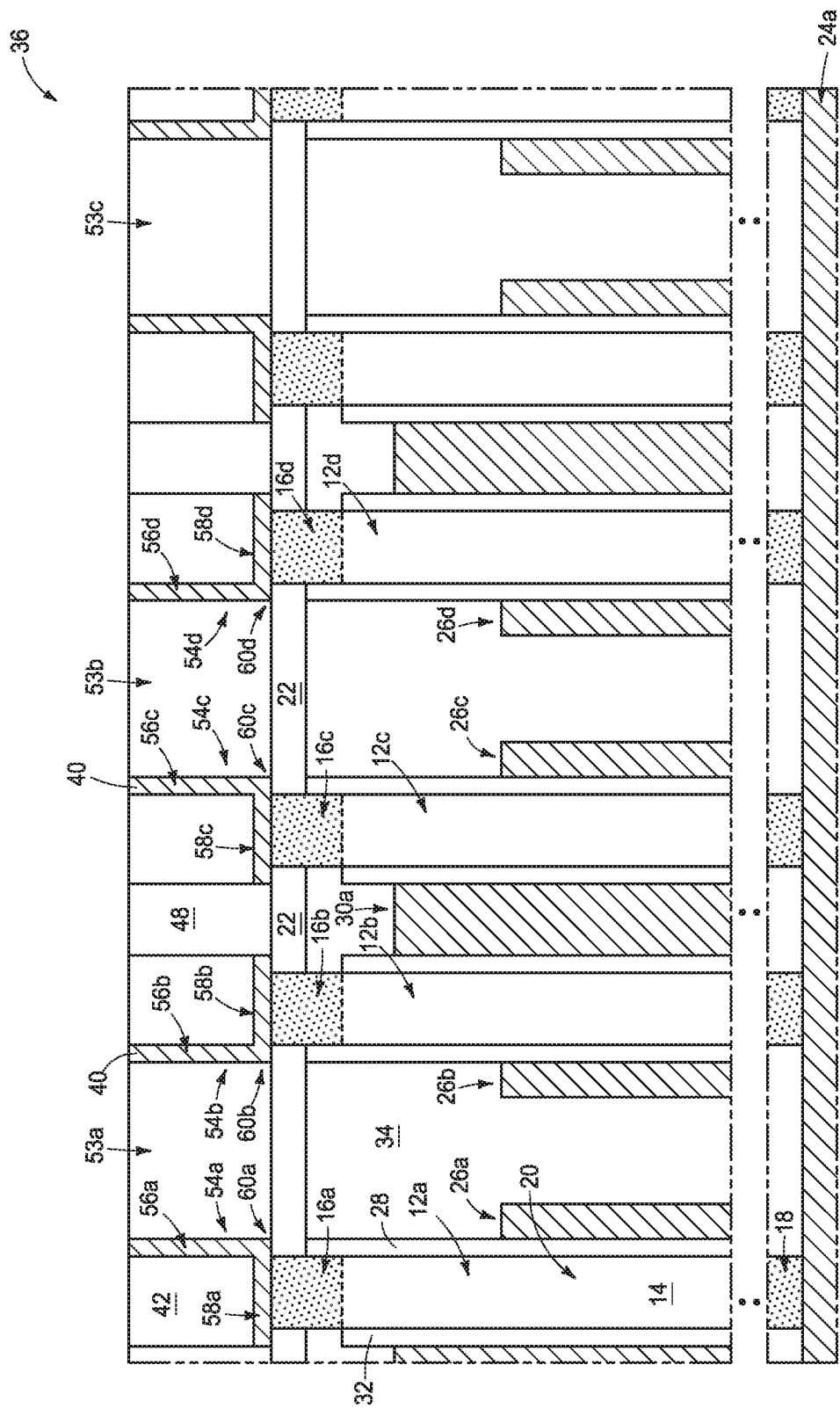
Figure 9B:
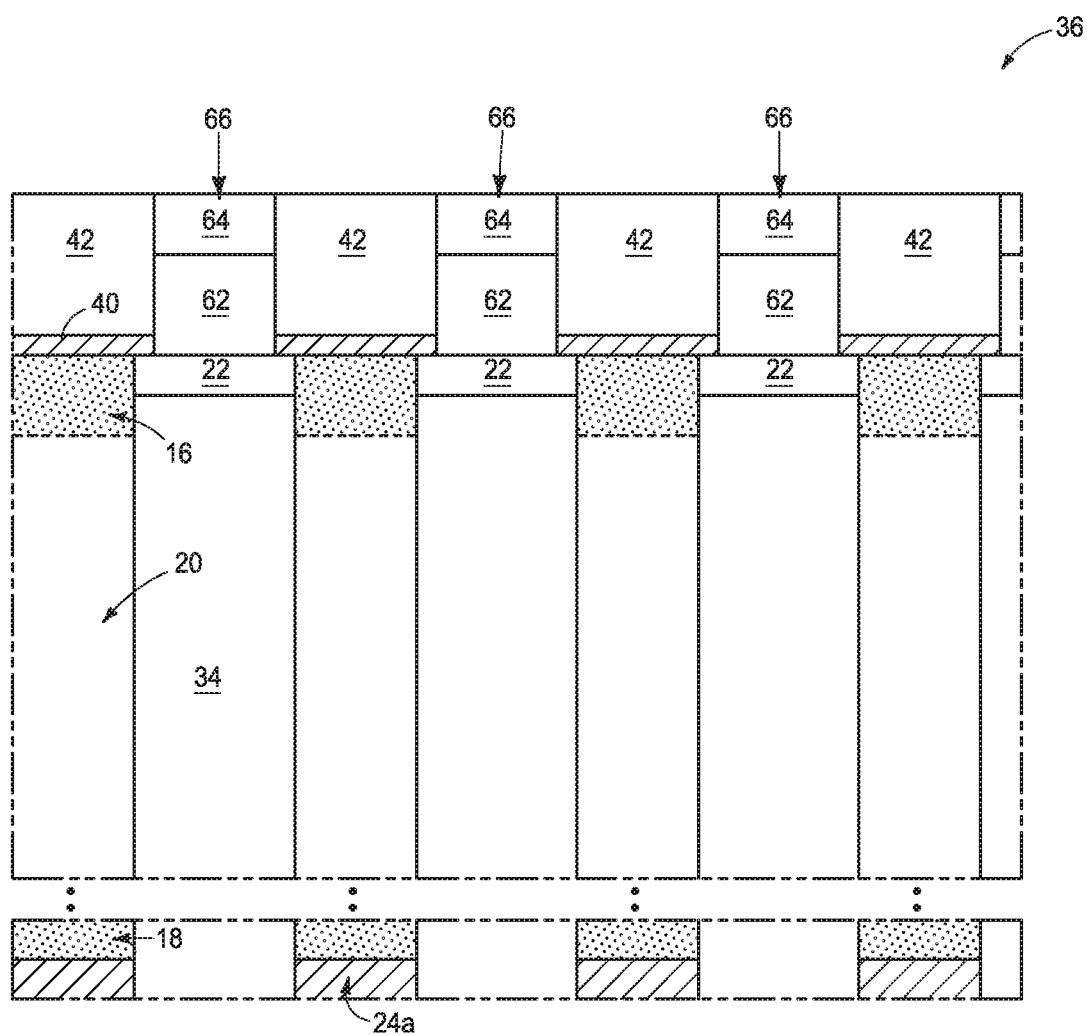

Referring to FIGS. 9-9B, material 64 (which may be referred to as rail material or insulative material) is formed within the openings 52 (FIG. 8-8B). The material 64 may be initially formed within the openings 52 and over upper surfaces of the materials adjacent the openings 52, and then planarization (e.g., CMP) may be utilized to remove excess of the material 64 while leaving remaining portions of the material 64 within the openings 52. The material 64 shown at the process stage of FIGS. 9-9B may be considered to be patterned into insulative structures (insulative rails) 66. The elevational location of the bottom surfaces of the structures 66 is determined by the height of the upper surface of the step material 62.

The material 64 may comprise any suitable composition(s); and in some embodiments may comprise, consist essentially of, or consist of silicon nitride.

In some embodiments, the bottom-electrode-structures 54 are incorporated into memory cells of a memory array (such as one of the memory arrays described below with reference to FIGS. 23 and 24). An edge of the array may be opened to form a trench around the array, and such trench may be filled with silicon nitride. The material 64 may be continuous with the silicon nitride formed around the array.

The structures 66 are directly against the vertically-extending segments 56 of the angle plates 54, as is better illustrated in FIG. 10C (discussed below).

Figure 10:
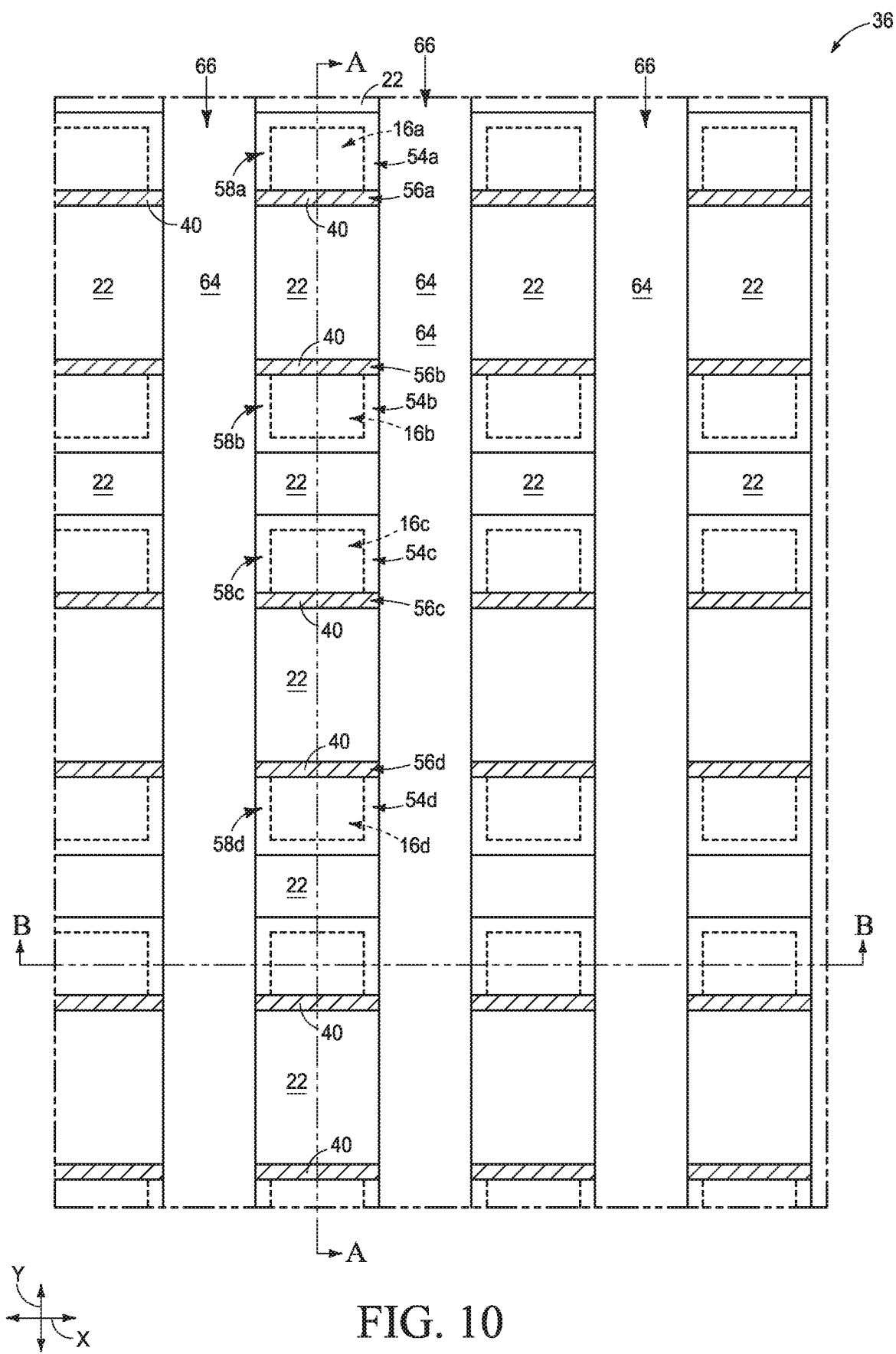
FIGS. 10-10C are diagrammatic views of the region of FIGS. 1-1B at an example process stage following that of FIGS. 9-9B.
Figure 10A:
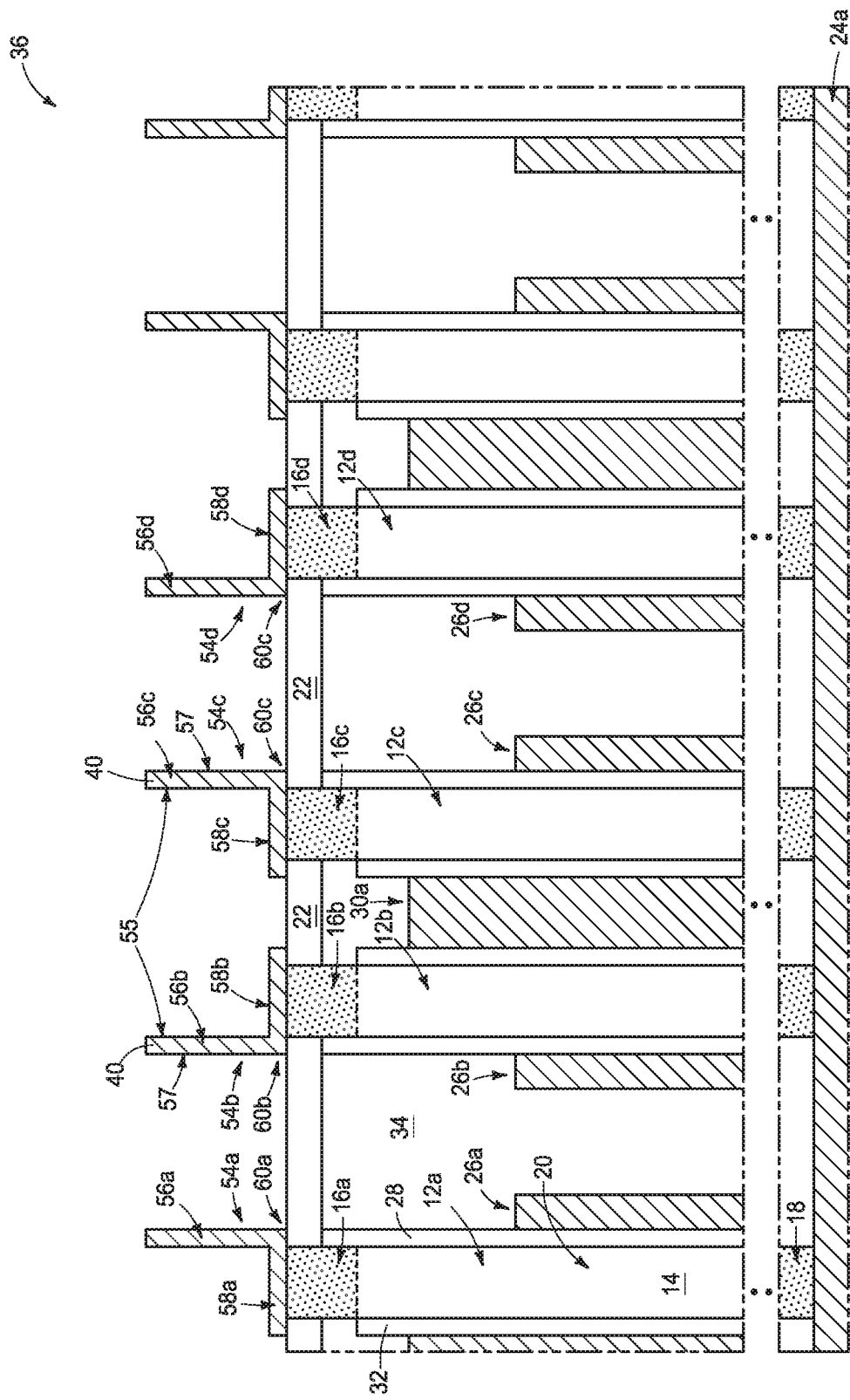
FIGS. 10A and 10B are cross-sectional side views along the lines A-A and B-B, respectively, of FIG. 10.
Figure 10B:
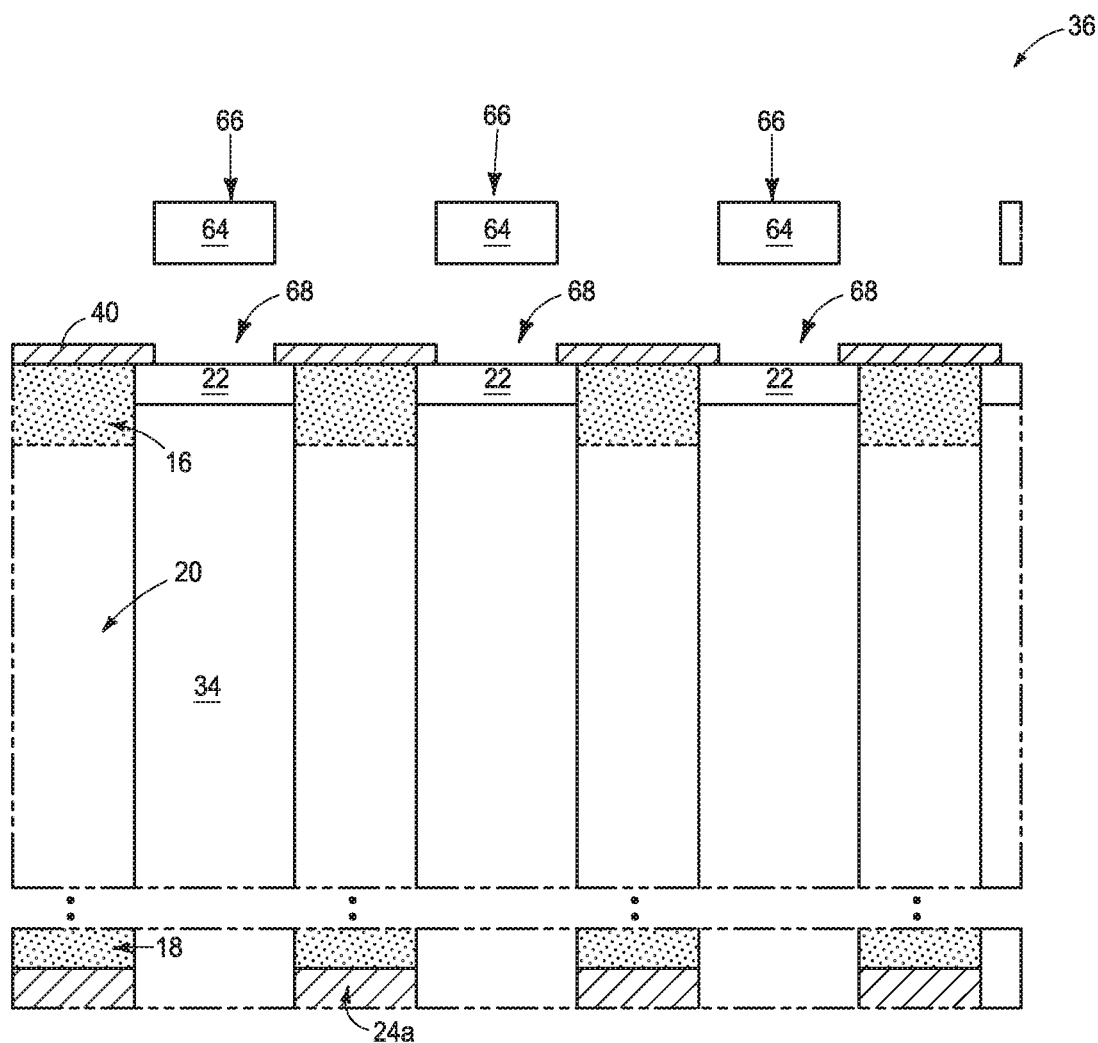
Figure 10C:
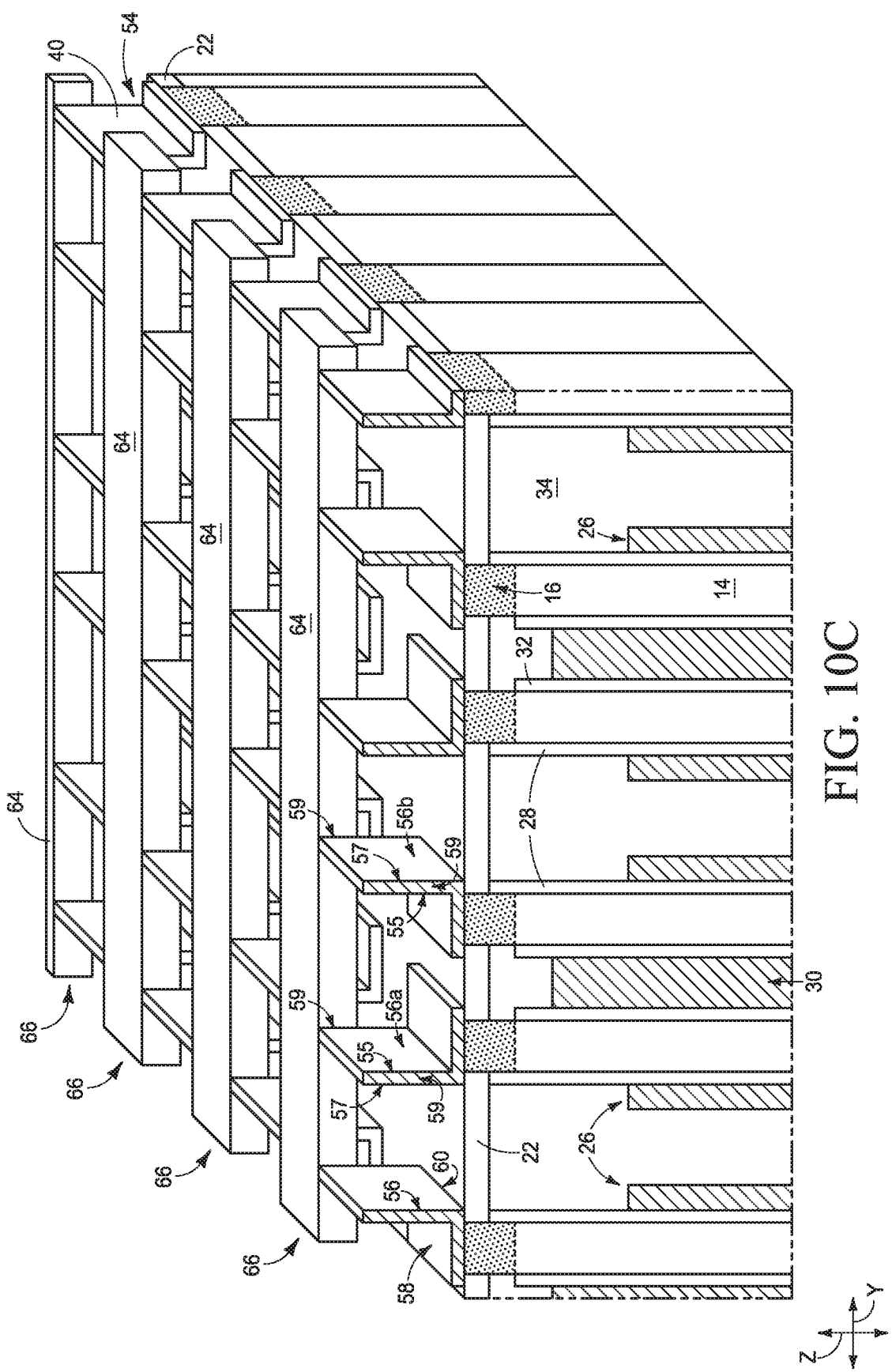

Referring to FIGS. 10-10C, the blocks 53 and materials 42, 48 and 62 are removed. Gaps 68 remain under the structures 66. The structures 66 provide support to the vertically-extending segments 56 of the bottom-electrode-structures 54, as shown in the three-dimensional view of FIG. 10C. The structures 66 may be supported, at least in part, due to the material 64 being continuous with silicon nitride formed in trenches surrounding the memory array. The structures 66 extend along the y-axis direction.

Two of the vertical segments 56 of FIG. 10C are labeled as first and second vertical segments 56a and 56b. The segments have inner surfaces 55 facing one another, and outer surfaces 57 in opposing relation to the inner surfaces. Sidewall surfaces 59 extend from the inner surfaces of the vertical segments to the outer surfaces of the vertical segments. The structures 66 are directly adjacent upper regions of the sidewall surfaces 59.

Figure 11:
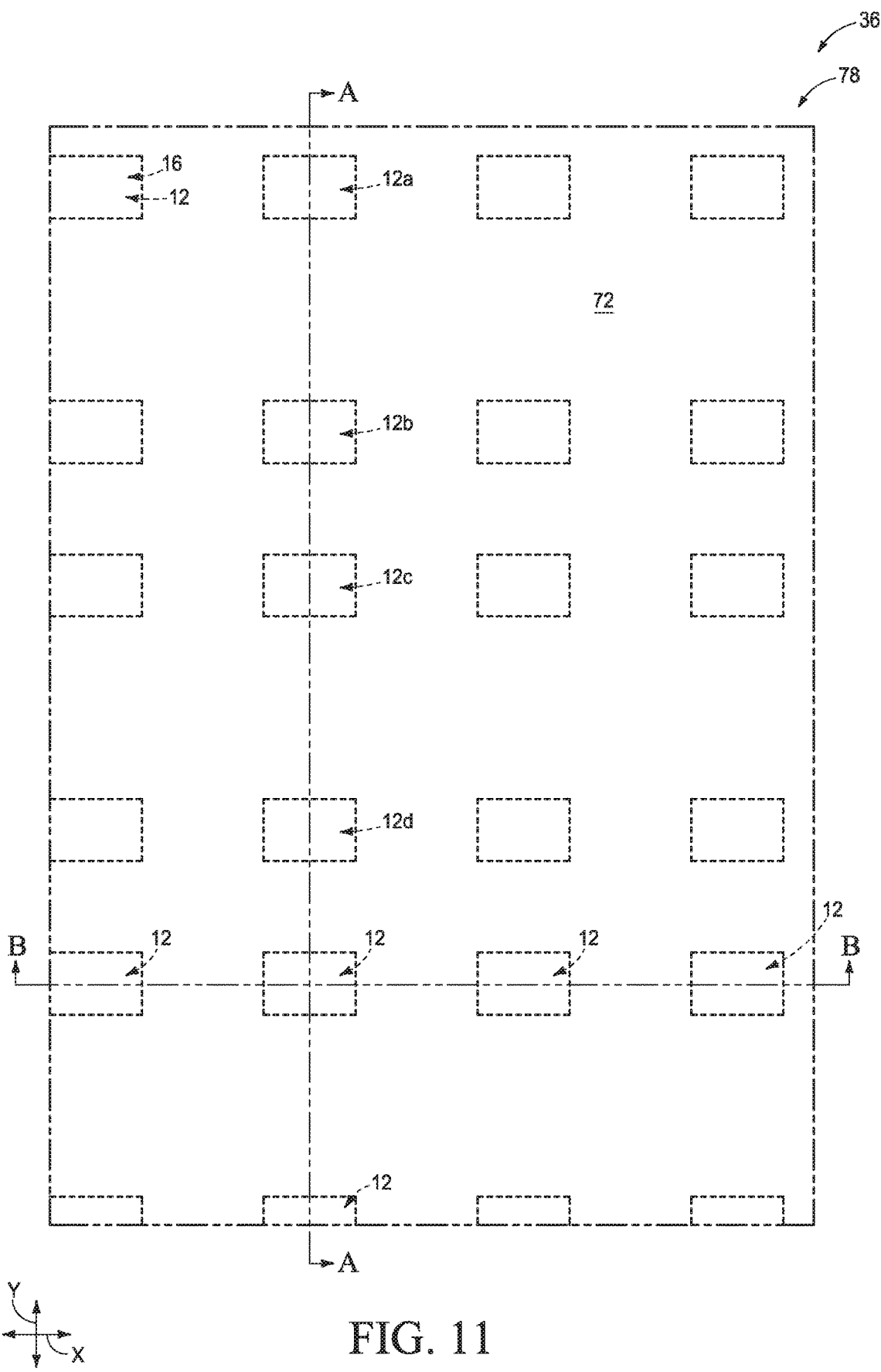
FIGS. 11-11B are diagrammatic views of the region of FIGS. 1-1B at an example process stage following that of FIGS. 10-10C.
Figure 11A:
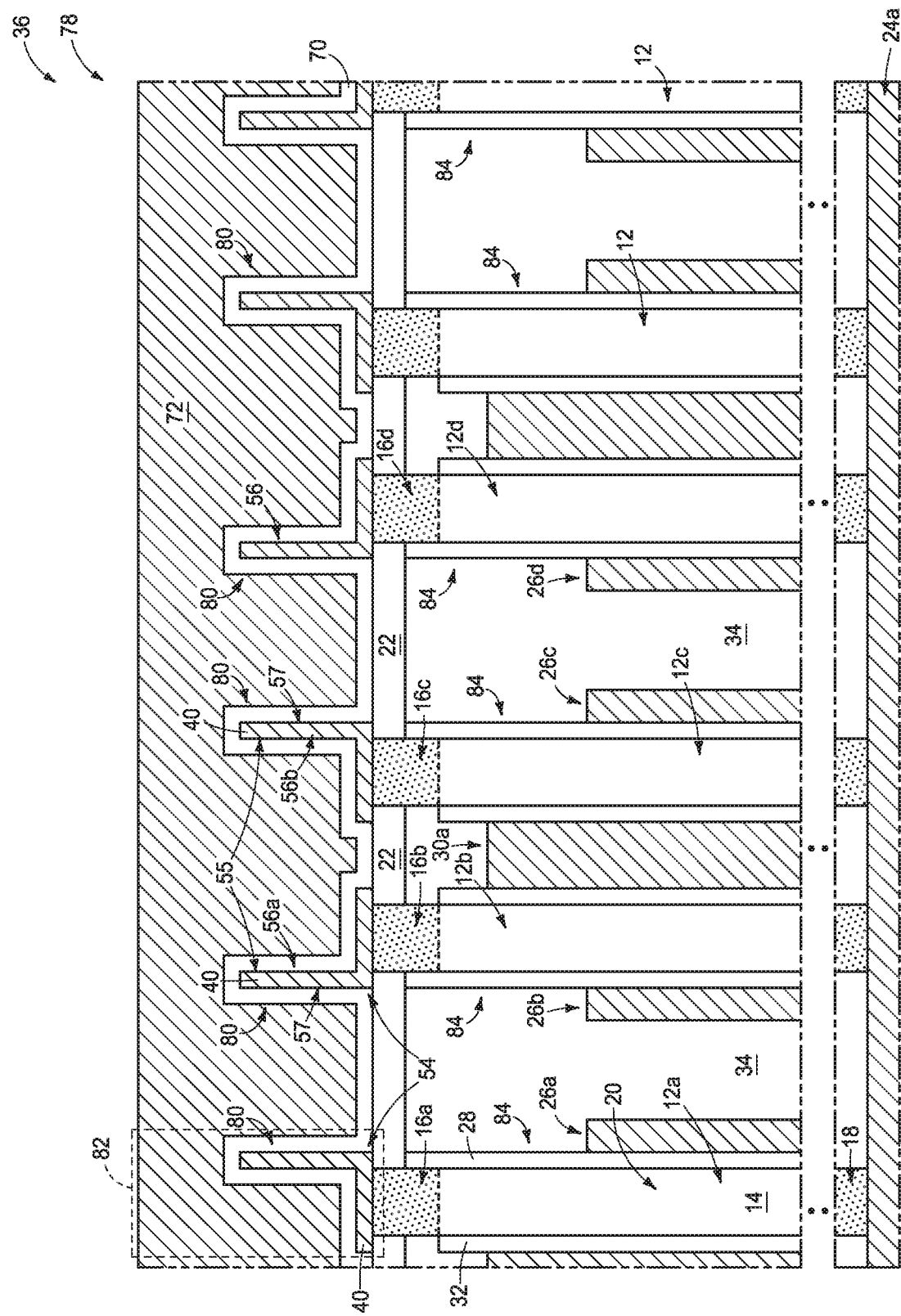
Figure 11B:
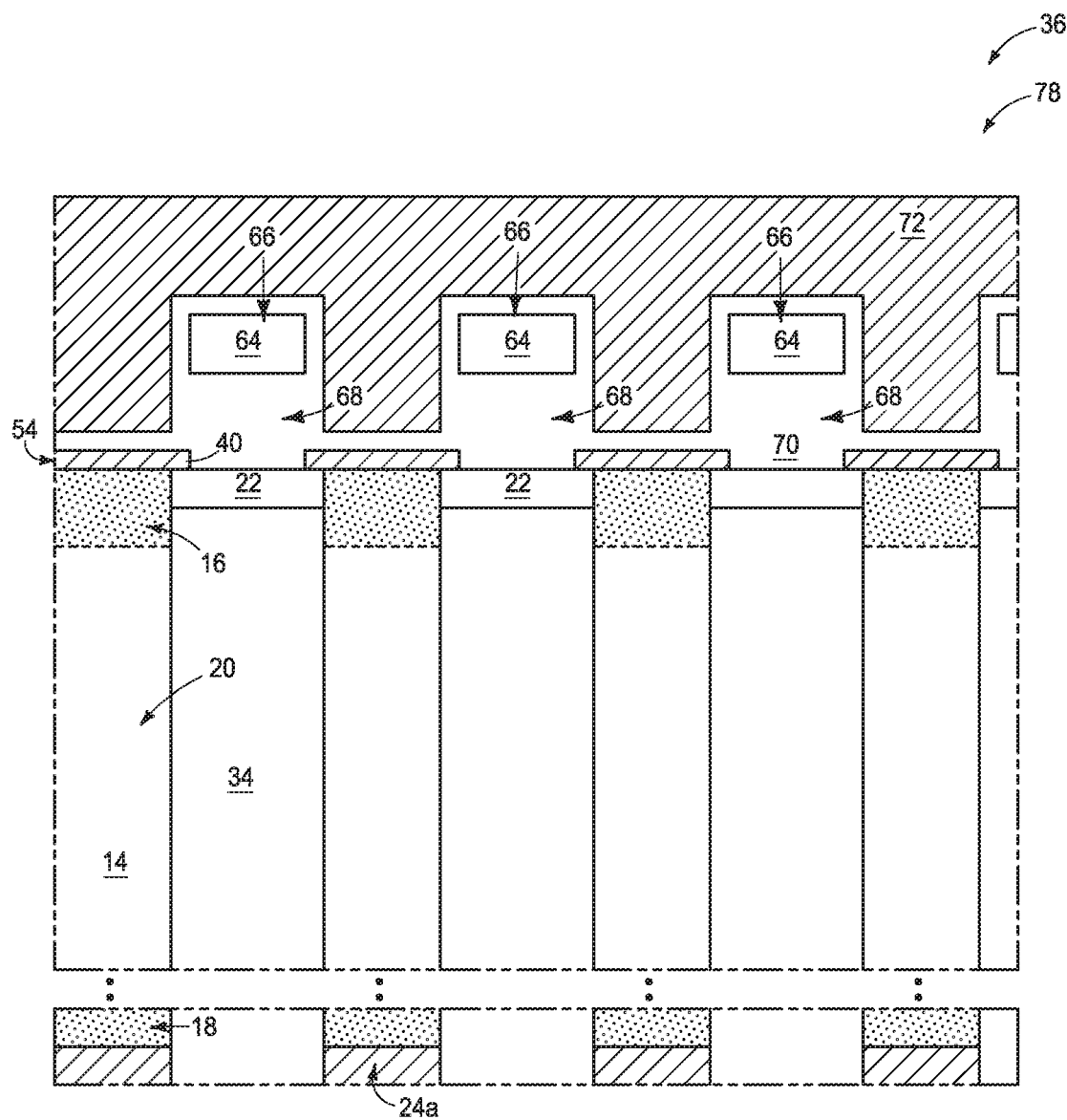

Referring to FIG. 11-11B, insulative material 70 is formed over the bottom-electrode-structures 54, and is directly against the bottom-electrode-structures 54. In the shown embodiment the insulative material 70 extends into the gaps 68 under the structures 66.

The insulative material 70 may be non-ferroelectric (e.g., may comprise, consist essentially of, or consist of silicon dioxide, silicon nitride, aluminum oxide, etc.), or may be ferroelectric. If material 70 is ferroelectric, the ferroelectric-insulative-material 70 may comprise any suitable composition or combination of compositions; and in some example embodiments may include one or more of transition metal oxide, zirconium, zirconium oxide, niobium, niobium oxide, hafnium, hafnium oxide, lead zirconium titanate, and barium strontium titanate. Also, in some example embodiments the ferroelectric-insulative-material may have dopant therein which comprises one or more of silicon, aluminum, lanthanum, yttrium, erbium, calcium, magnesium, strontium, and a rare-earth element.

The insulative material 70 may be formed to any suitable thickness; and in some embodiments may be formed to a thickness within a range of from about 30 Å to about 250 Å.

Top-electrode-material 72 is formed over the insulative material 70. The top-electrode-material 72 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the top-electrode-material 72 may comprise, consist essentially of, or consist of one or more of molybdenum silicide, titanium nitride, titanium silicon nitride, ruthenium silicide, ruthenium, molybdenum, tantalum nitride, tantalum silicon nitride and tungsten.

The top-electrode-material 72 may have any suitable thickness, and in some embodiments may have a thickness of at least about 10 Å.

The electrode materials 40 and 72 may comprise a same composition as one another in some embodiments, or may comprise different compositions relative to one another. In some embodiments, the electrode materials 40 and 72 may both comprise, consist essentially of, or consist of titanium nitride.

A pair of the vertical segments 56 along the cross-section of FIG. 11A are indicated to be first and second vertical segments 56a and 56b. Each of the segments has the inner surface 55 in a region between the first and second vertical segments 56a and 56b; and has the outer surface 57 in opposing relation to the inner surface. In the shown embodiment, the insulative material 70 is along and directly against the inner and outer surfaces 55 and 57 of the vertical segments 56a and 56b.

The integrated assembly 36 of FIGS. 11-11B may be considered to correspond to a portion of a memory array (memory device) 78. Such memory array includes memory cells 80 which each include a capacitor 82 (diagrammatically illustrated relative to the capacitor joined with the upper source/drain region 16a). The capacitor includes a bottom electrode 54; and includes regions of the insulative material 70 and the top-electrode-material 72.

The individual memory cells 80 each include an access transistor 84 coupled with a capacitor 82. Each access transistor 84 includes a pillar 12 and a region of a gate 26 adjacent such pillar. The region of the gate includes a transistor gate which may gatedly couple the source/drain regions 16 and 18 to another through the channel region 20.

Each of the memory cells 80 is uniquely addressed with one of the gates 26 and one of the digit lines 24. In some embodiments, the memory cells 80 may be considered to be substantially identical to one another, and to be representative of a large number of substantially identical memory cells which may be formed across the memory array 78. For instance, the memory array may comprise hundreds, thousands, hundreds of thousands, millions, hundreds of millions, etc., of the memory cells. The illustrated gates 26 may be representative of a large number of substantially identical gates that may extend along rows of the memory array, and the illustrated digit lines 24 may be representative of a large number of substantially identical digit lines that may extend along columns of the memory array. The term "substantially identical" means identical to within reasonable tolerances of fabrication and measurement.

In some embodiments, the material 70 may be ferroelectric-insulative-material, and the capacitors 82 may be ferroelectric capacitors. In other embodiments, the insulative material 70 may be non-ferroelectric (e.g., may comprise, consist essentially of, or consist of one or more of silicon dioxide, silicon nitride, silicon oxynitride, zirconium oxide, hafnium oxide, etc.) and the capacitors may be non-ferroelectric capacitors of dynamic random-access memory (DRAM). In some embodiments, the insulative material 70 may be referred to as a second insulative material to distinguish it from the first insulative material 22.

The embodiment of FIGS. 7-11 shows the masses (blocks) 53 removed prior to forming the insulative material 70. In other embodiments, the masses 53 may remain to provide support to the vertically-extending segments 56, as described with reference to an example embodiment of FIGS. 12 and 13.

Figure 12:
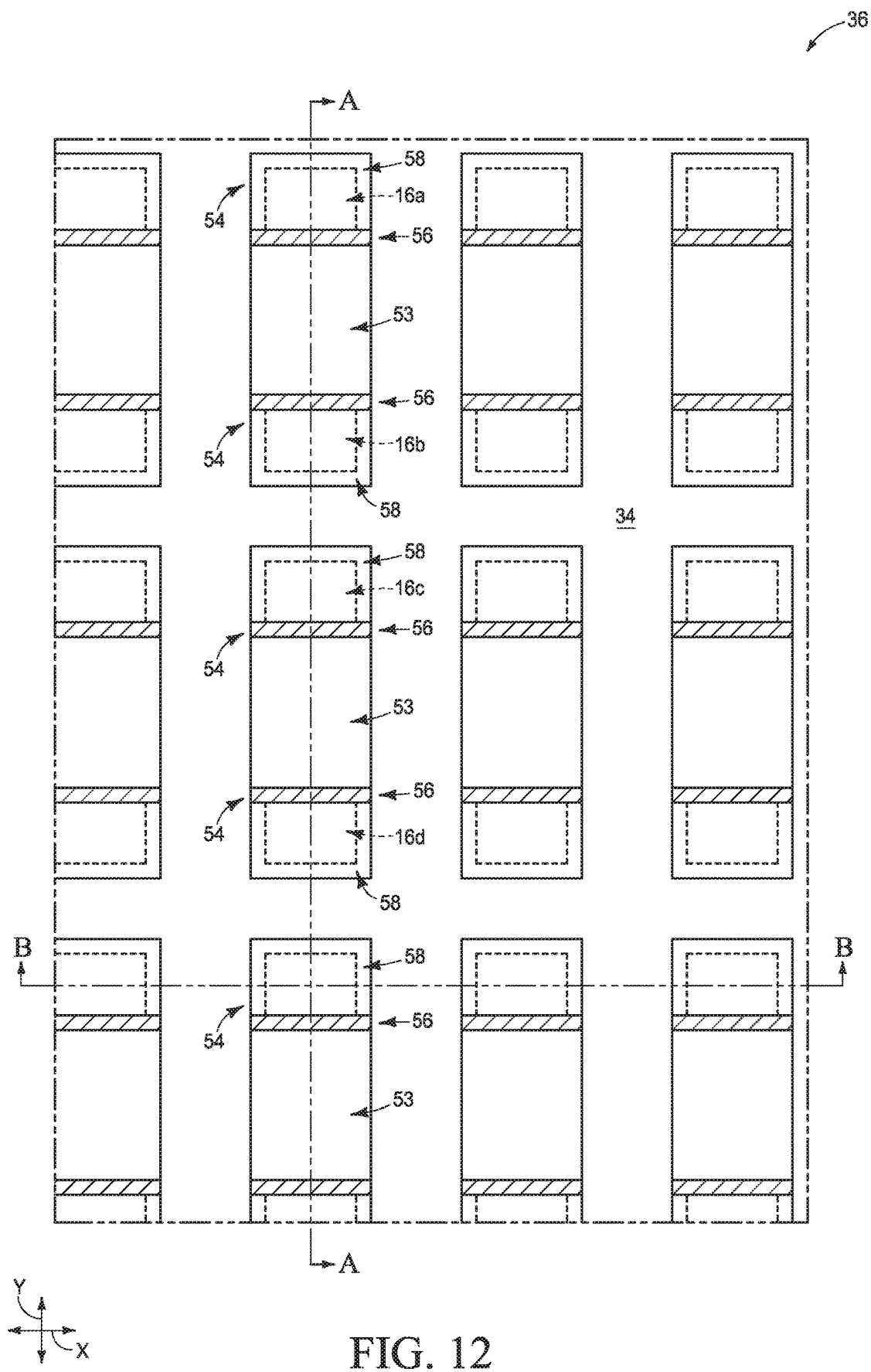
FIGS. 12-12C are diagrammatic views of the region of FIGS. 1-1B at another example process stage following that of FIGS. 6-6B.
Figure 12A:
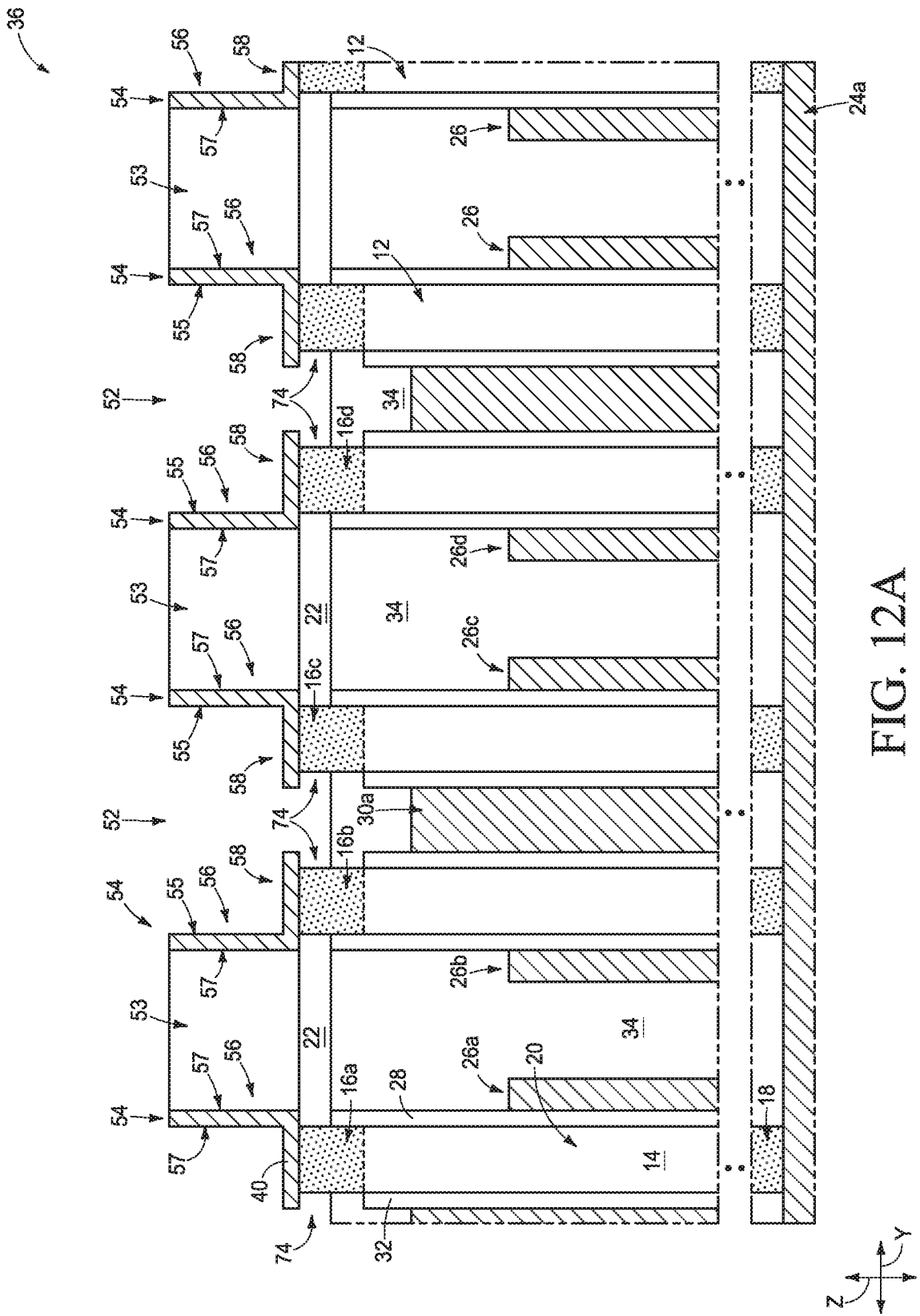
FIGS. 12A and 12B are cross-sectional side views along the lines A-A and B-B, respectively, of FIG. 12.
Figure 12B:
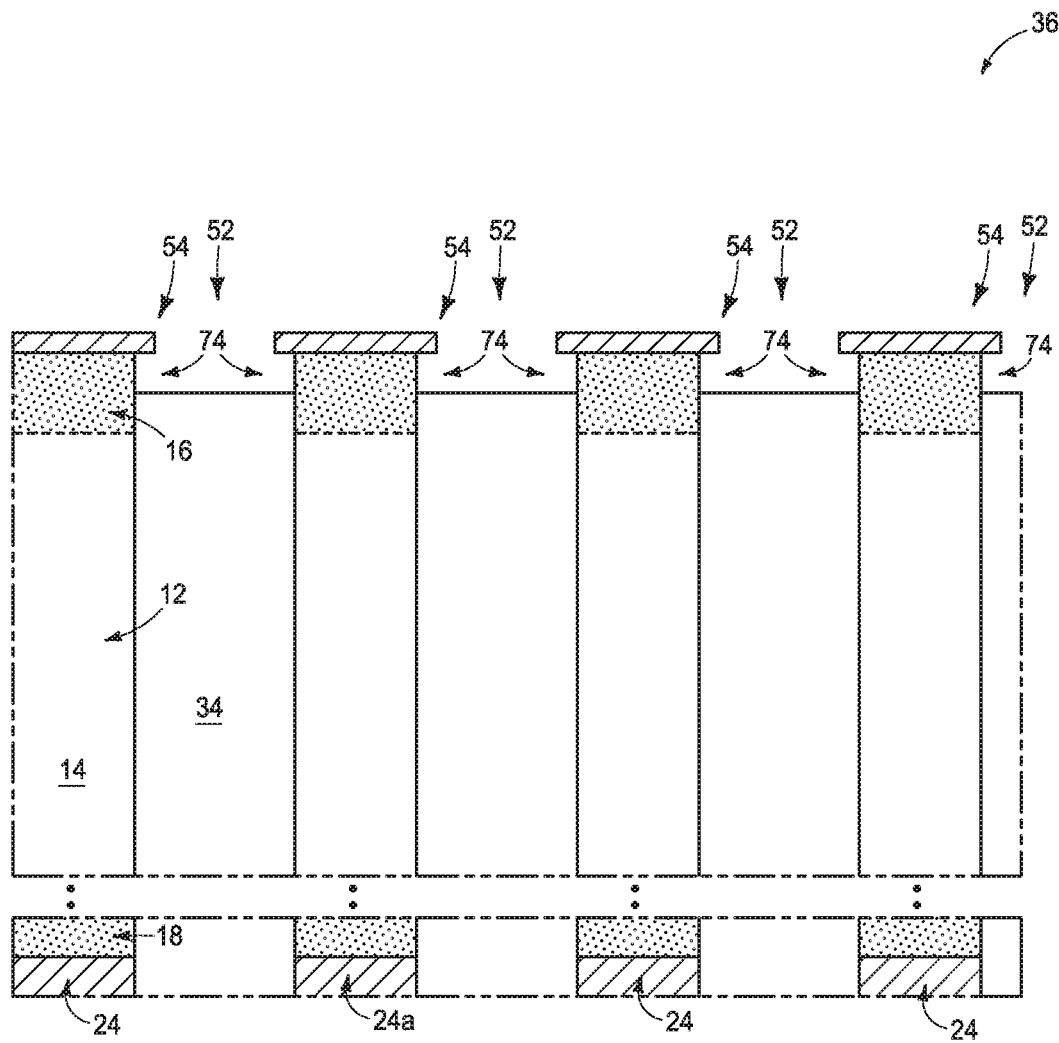
Figure 12C:
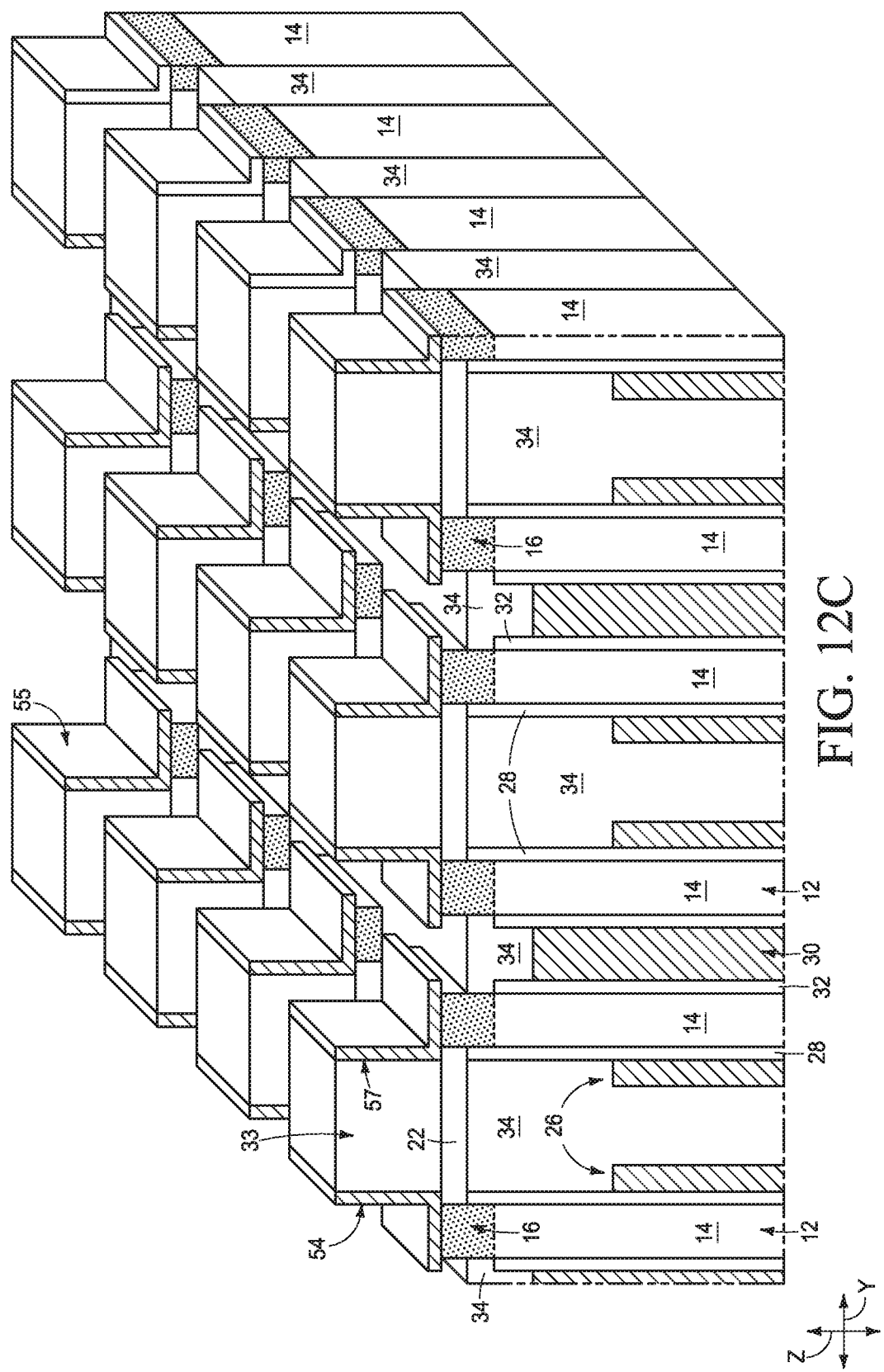

Referring to FIGS. 12-12C, the assembly 36 is shown at a process stage subsequent to that of FIGS. 6-6B. The materials 42 and 48 utilized to generate the assembly of FIGS. 12-12C may comprise one or both of silicon nitride and silicon oxynitride. The openings 52 are extended through the material 40 to expose the underlying material 22 and to pattern the mask structures 38 into the blocks (masses) 53. Subsequently the mask structures 50 and materials 42 and 48 are removed. Such also exposes the material 22 under regions where the material 48 had been. The material 22 may be removed (as shown) to leave gaps 74 extending under regions of the bottom-electrode-structures 54. Alternatively, the material 22 may not be removed, and the gaps 74 may not be formed. Whether or not the material 22 is removed may depend on whether or not the material 48 (FIGS. 6-6B) comprises a same composition as the material 22. If the materials 48 and 22 are a same composition as one another, the material 22 may be removed by the etch utilized to remove the material 48. Otherwise, the material 48 may be removed selectively relative to the material 22, and accordingly the material 22 may remain after the material 48 is removed.

The vertically-extending segments 56 of the bottom-electrode-structures 54 have the inner and outer surfaces 55 and 57 described above. The masses 53 remain along and directly against the outer surfaces 57 of the vertically-extending segments 56. In some embodiments, the masses 53 may comprise insulative material (e.g., one or both of silicon dioxide and silicon nitride), and may be referred to as insulative masses.

Figure 13:
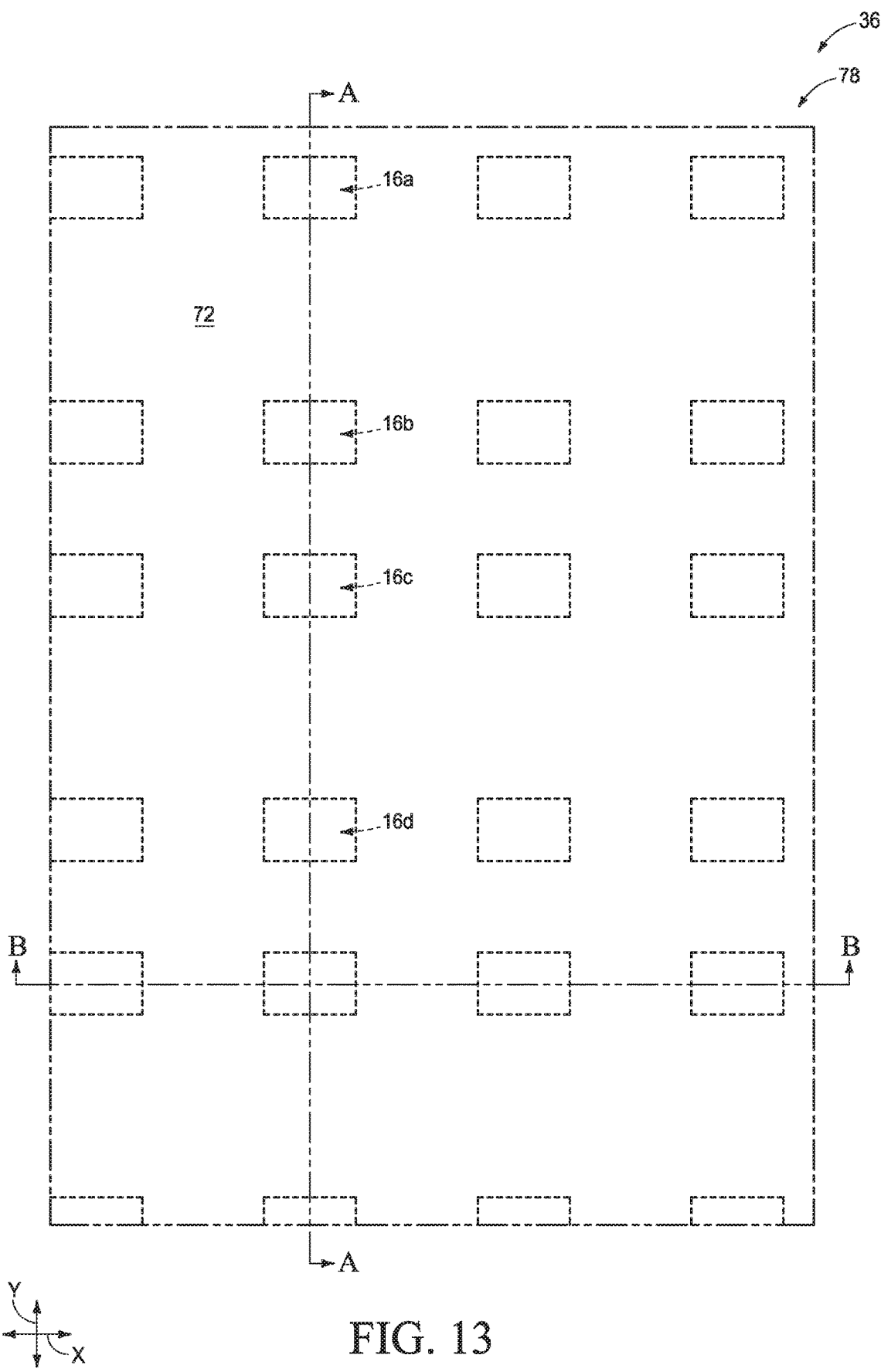
FIGS. 13-13B are diagrammatic views of the region of FIGS. 1-1B at an example process stage following that of FIGS. 12-12C.
Figure 13A:
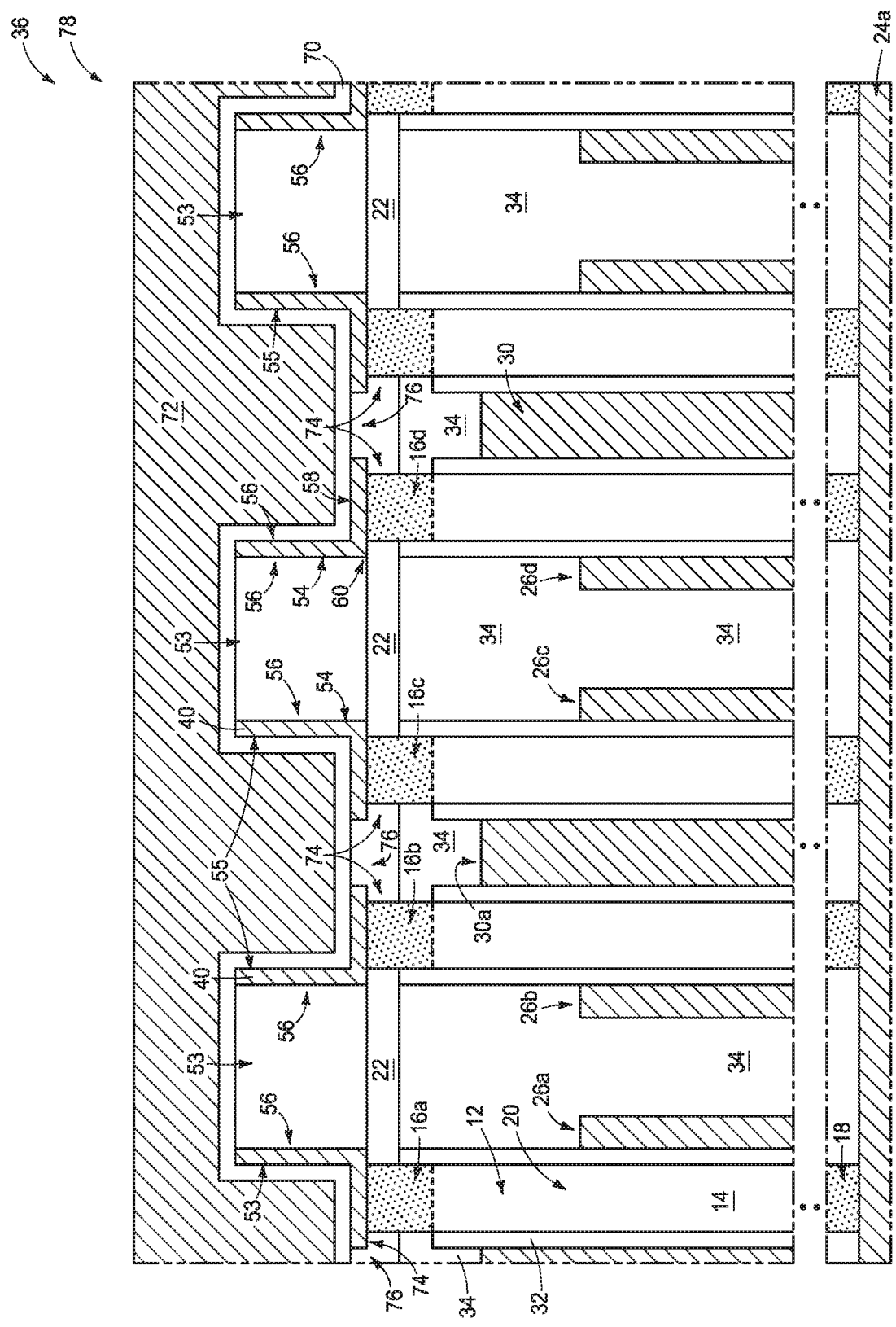

Referring to FIGS. 13-13C, the insulative material 70 is formed over the bottom-electrode-structures 54, and the top-electrode-material 72 is formed over the insulative material 70. In the illustrated embodiment, the insulative material 70 extends horizontally from one of the bottom electrodes 54 to another, and thus leaves voids 76 in the gaps 74 under the bottom electrodes 54. In other embodiments, the insulative material 70 may extend to between and under the bottom electrodes 54 to fill the gaps 74.

Figure 13B:
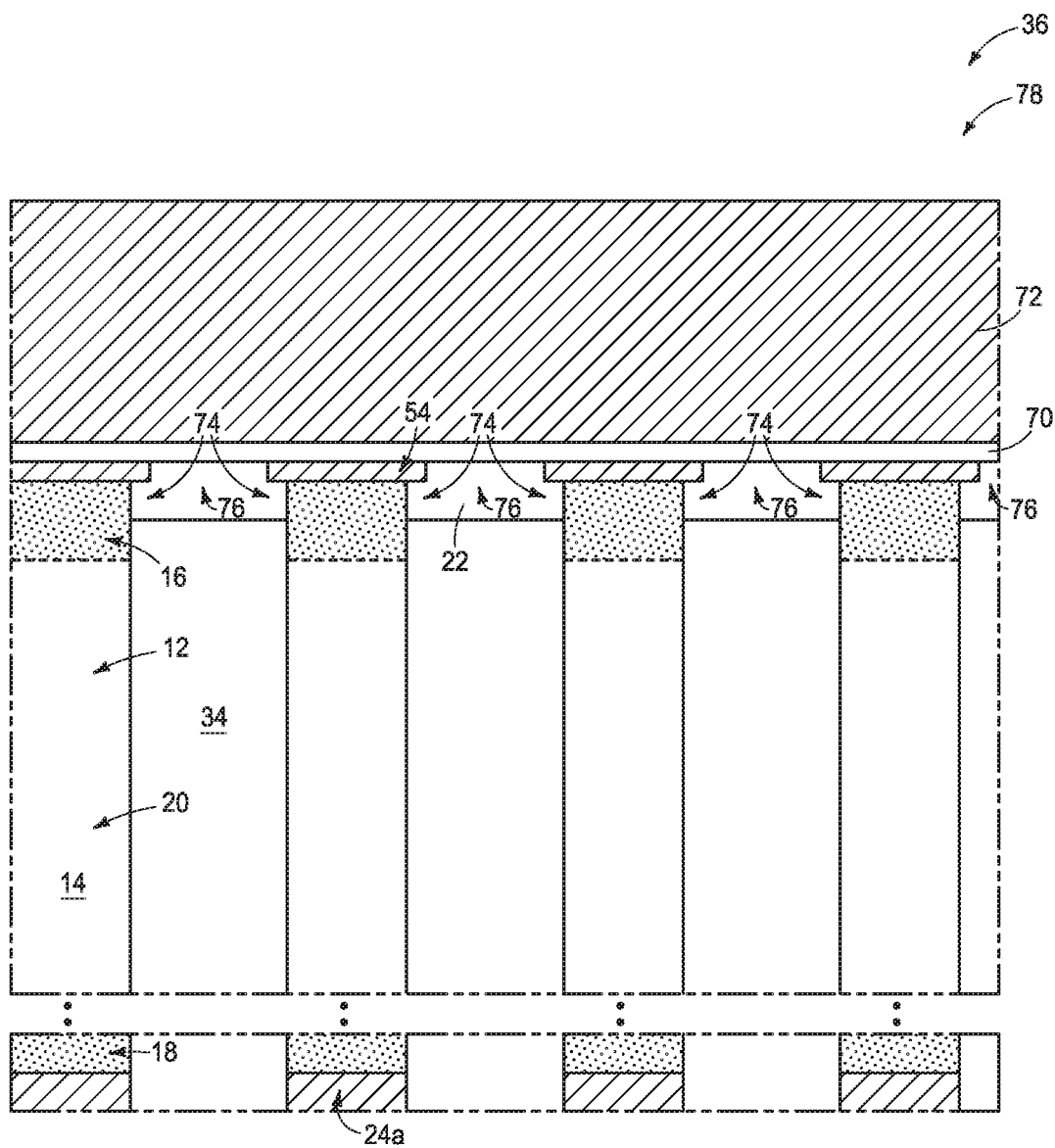

The embodiment of FIG. 13-13B shows the insulative masses 53 remaining between neighboring vertically-extending segments 56 of the bottom electrodes 54. Accordingly, the insulative material 70 is along the surfaces 55 of the vertically-extending segments 56, and the insulative masses 53 are along the opposing surfaces 57 of the vertically-extending segments 56. In some embodiments, the surfaces 55 and 57 may be referred to as first and second surfaces, respectively. The insulative material 70 and the top-electrode-material 72 are over the insulative masses 53 in the illustrated embodiment.

The embodiment of FIGS. 13-13B may comprise a memory array 78 analogous to that described above with reference to FIGS. 11-11B.

Some embodiments include recognition that a common memory cell disturb mechanism associated with FeRAM may be due to a buildup of potential at bottom electrodes. Such embodiments may incorporate of leaker devices into the ferroelectric capacitors to reduce charge buildup along the bottom electrodes. The leaker devices may couple the bottom electrodes to conductive plates. The leaker devices may have conductivity (or alternatively, resistance) tailored to enable excess charge to drain from the bottom electrodes to the conductive plate, while not enabling problematic shorting between the bottom electrodes and the conductive plate. An example embodiment is described with reference to FIGS. 14-22.

Figure 14:
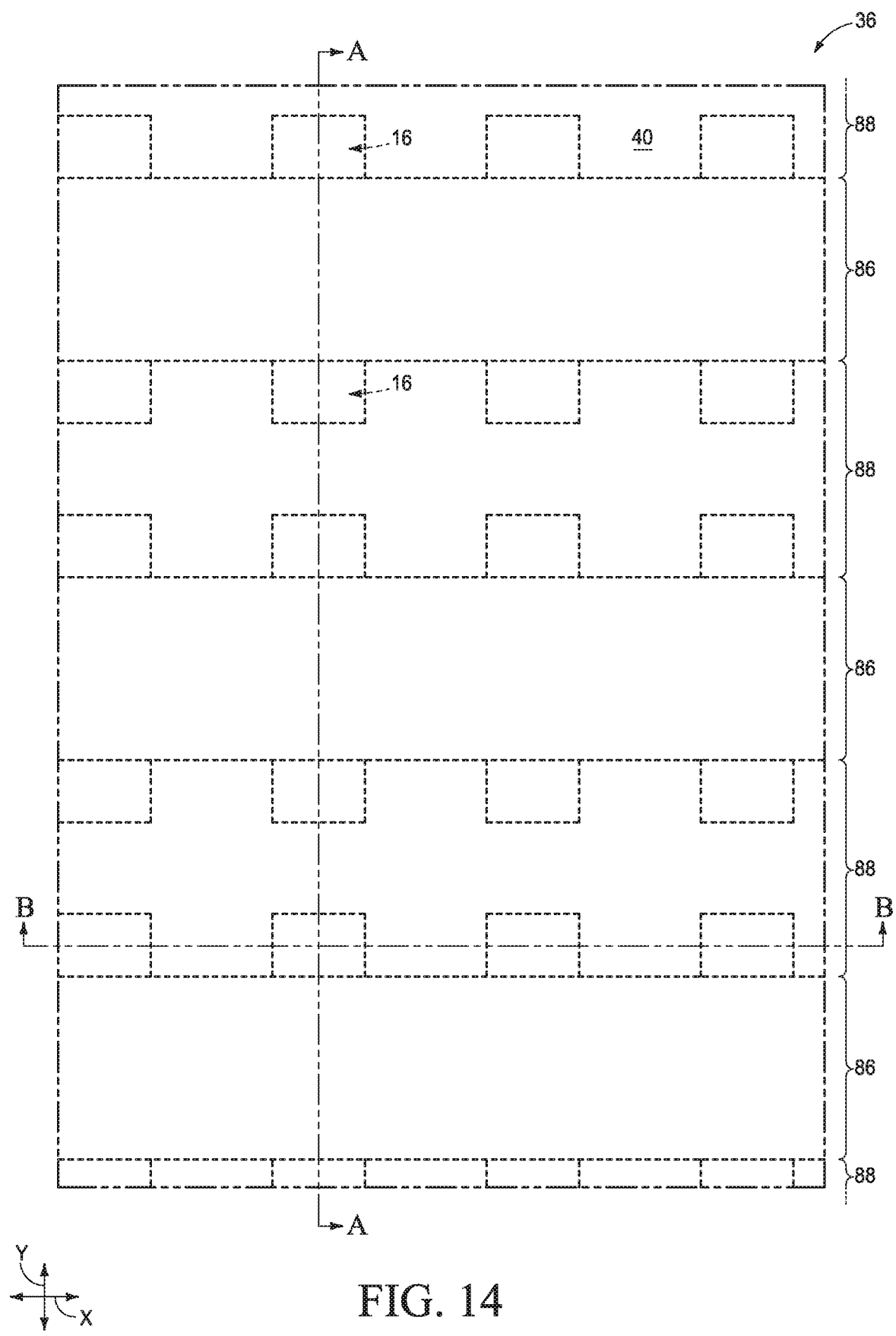
FIGS. 14-14B are diagrammatic views of the region of FIGS. 1-1B at another example process stage following that of FIGS. 2-2B.
Figure 14A:
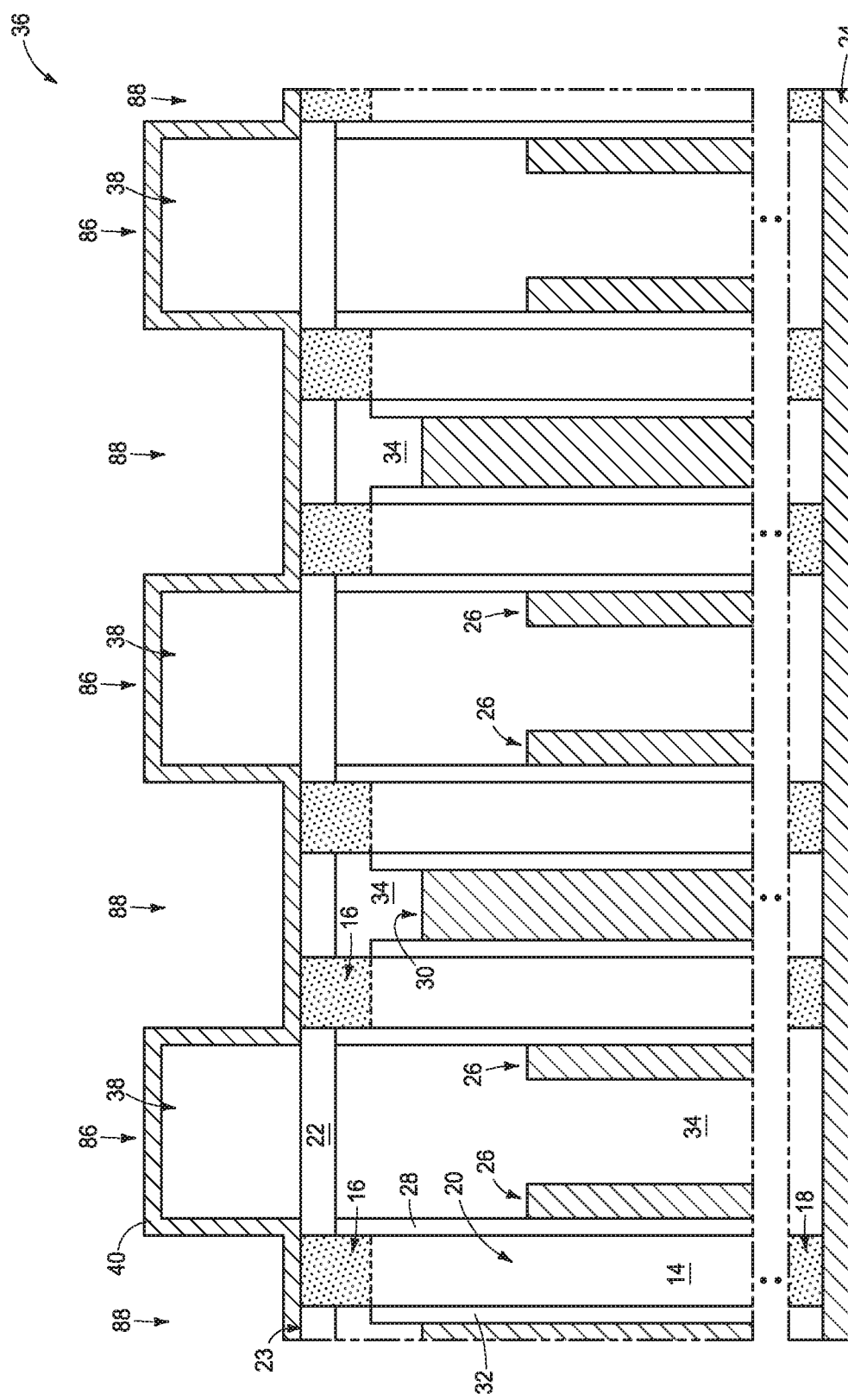
Figure 14B:
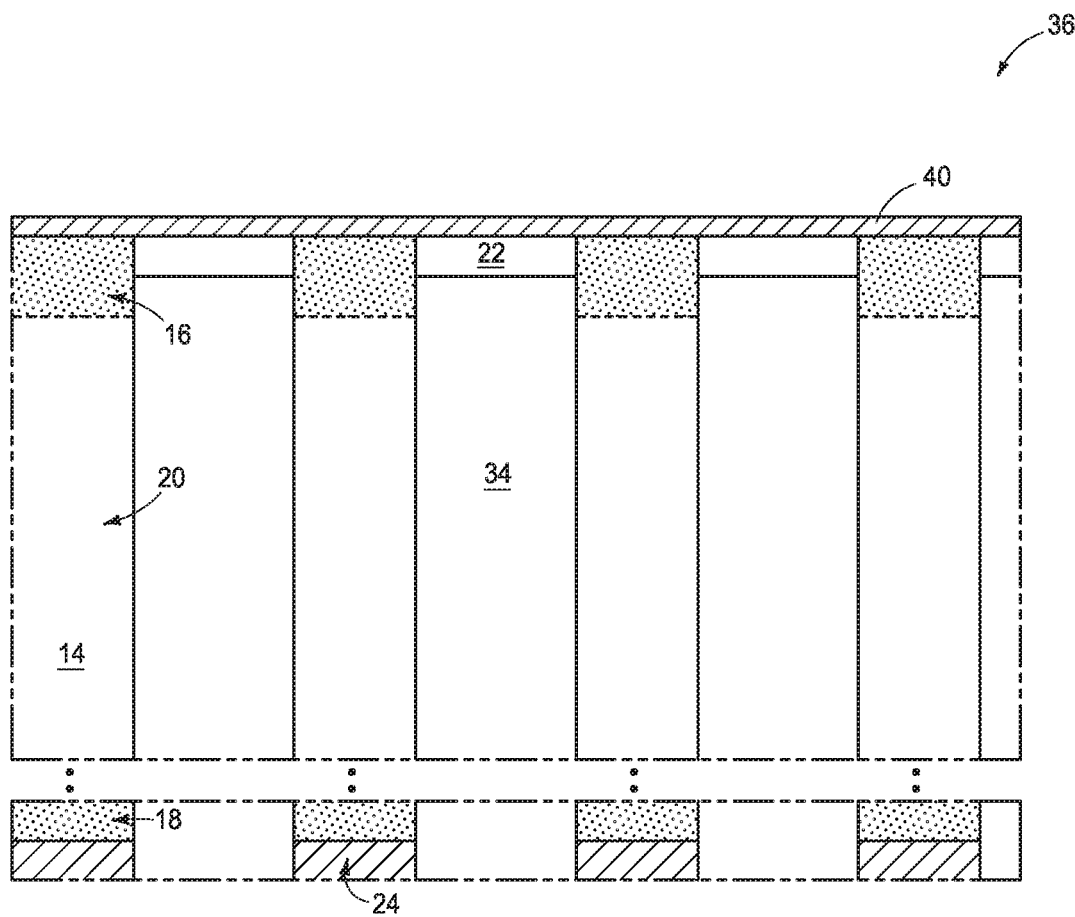

Referring to FIGS. 14-14B, the integrated assembly 36 is shown at a process stage which may follow that of FIGS. 2-2B. The bottom-electrode-material 40 is formed to extend across the upper surface 23 and over the mask structures 38. The electrode material 40 has an undulating topography which includes peaks 86 over the mask structures 38, and valleys 88 between the peaks.

Figure 15:
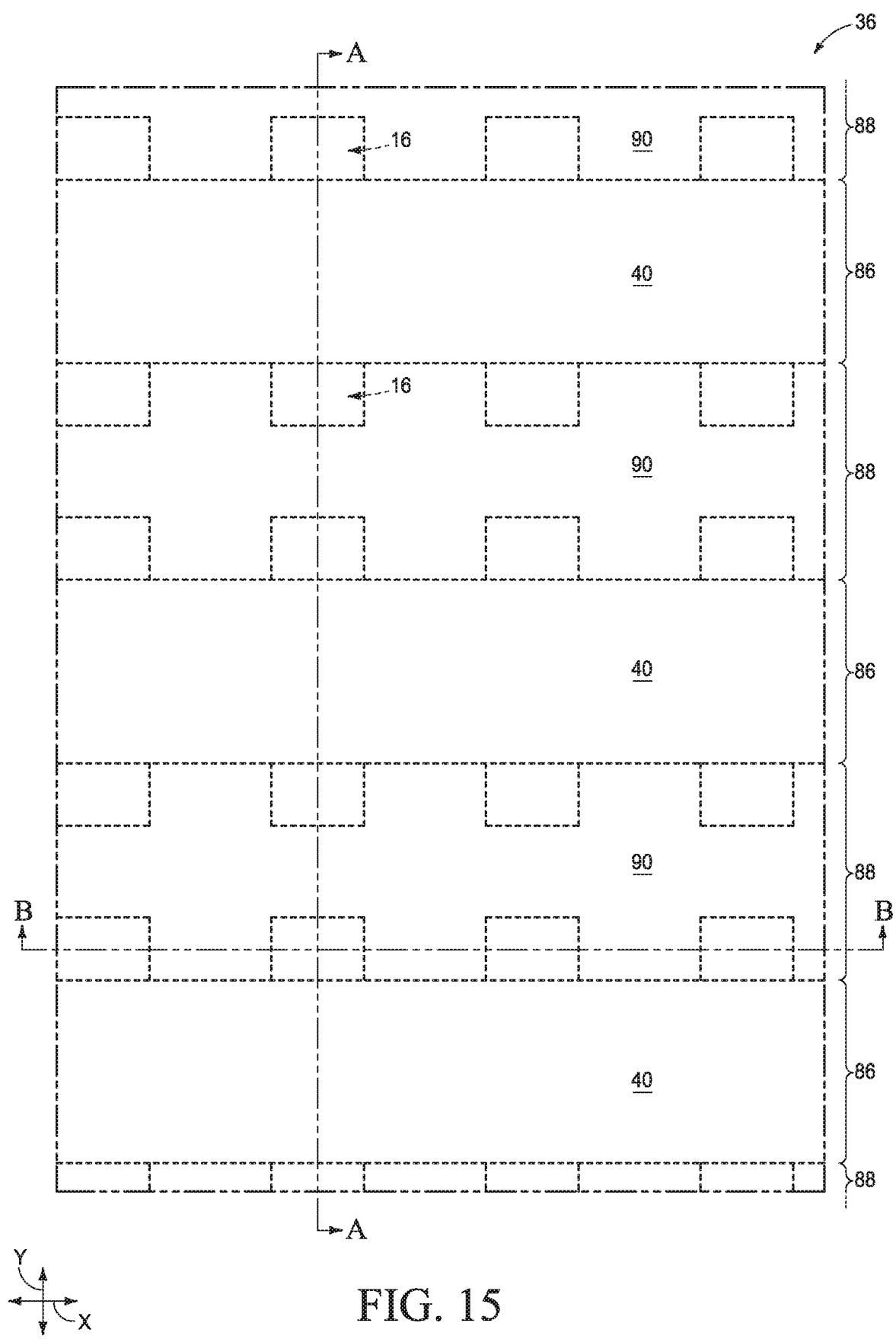
FIGS. 15-15B are diagrammatic views of the region of FIGS. 1-1B at an example process stage following that of FIGS. 14-14B.
Figure 15A:
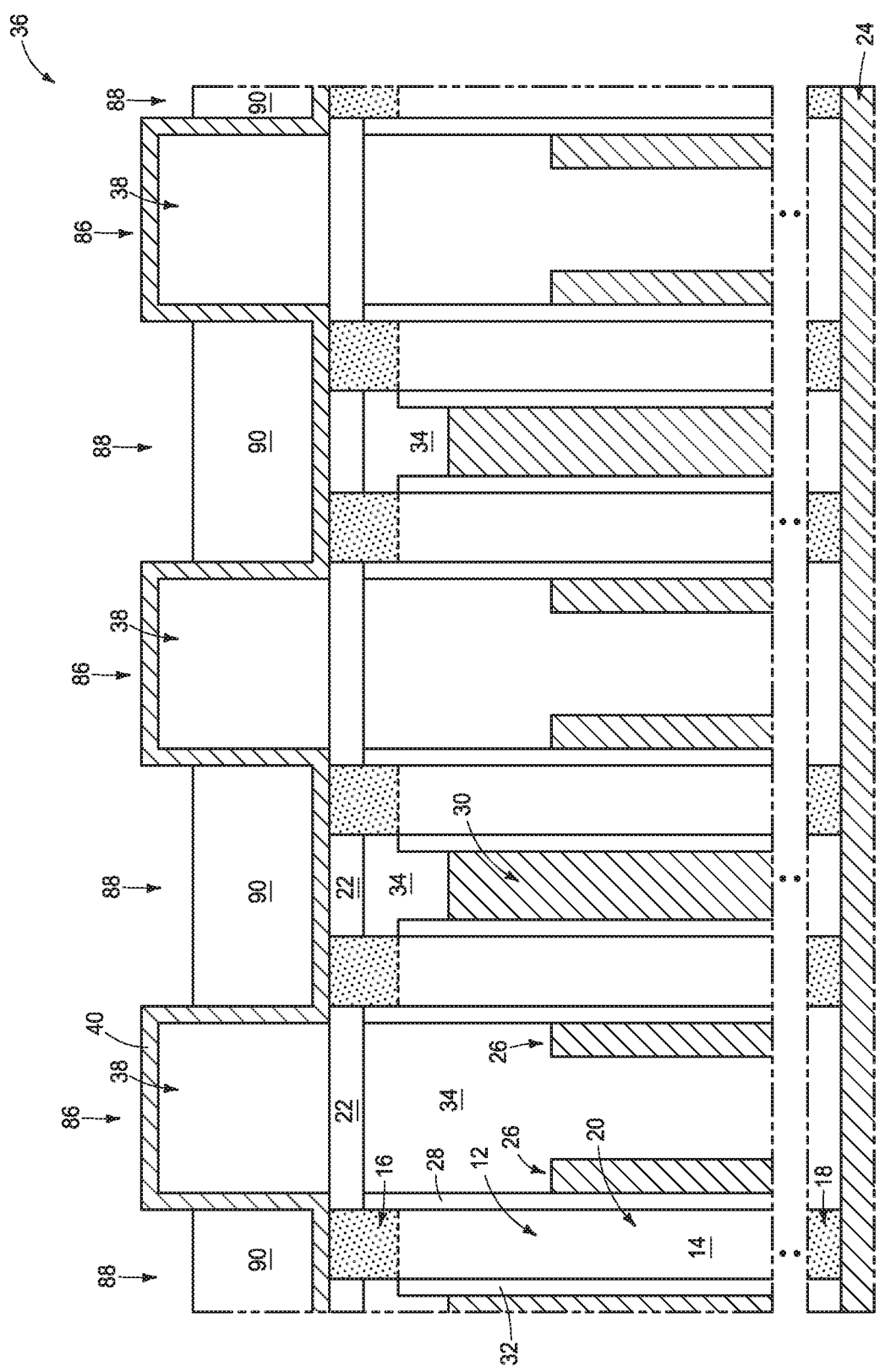
Figure 15B:
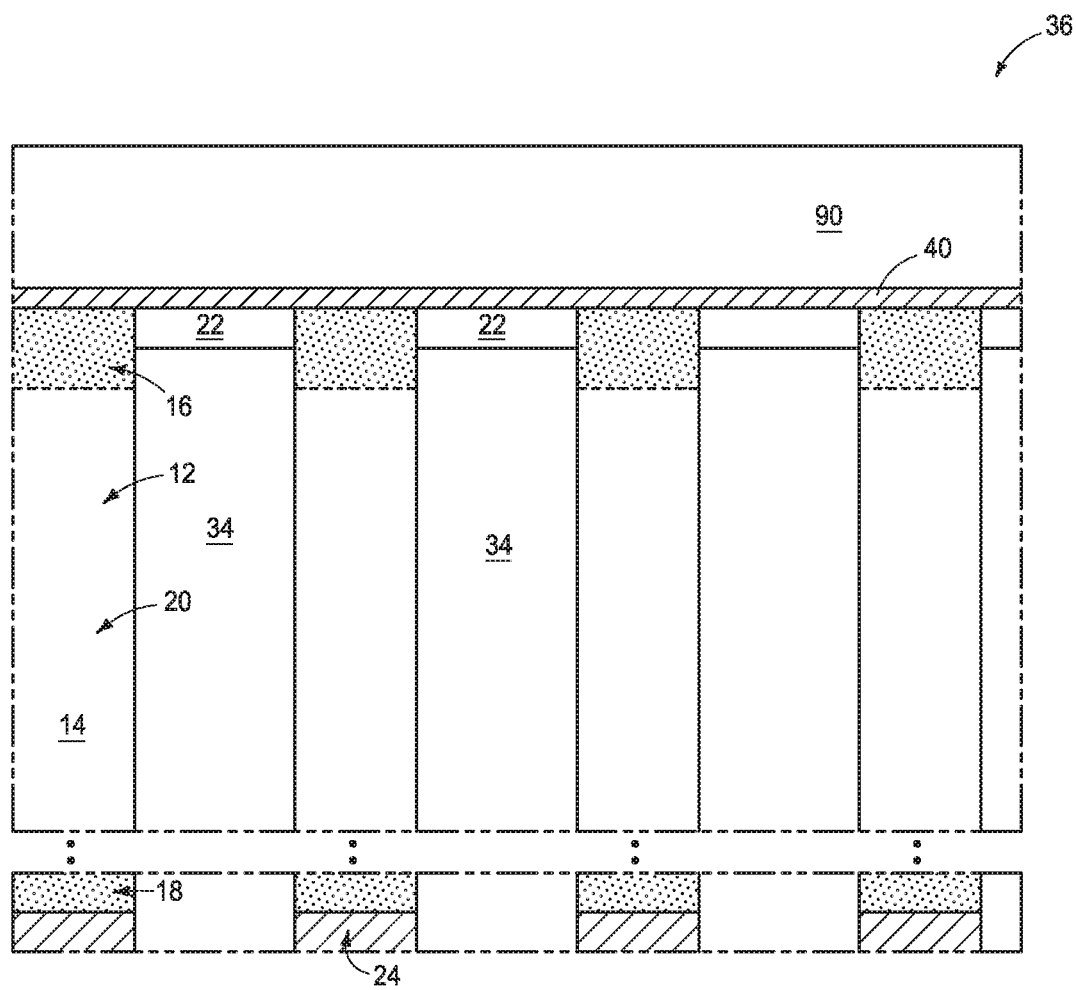

Referring to FIGS. 15-15B, fill material 90 is formed within the valleys 88 to partially fill such valleys. The material 90 may comprise any suitable composition(s); and in some embodiments may comprise, consist essentially of, or consist of photoresist.

Figure 16:
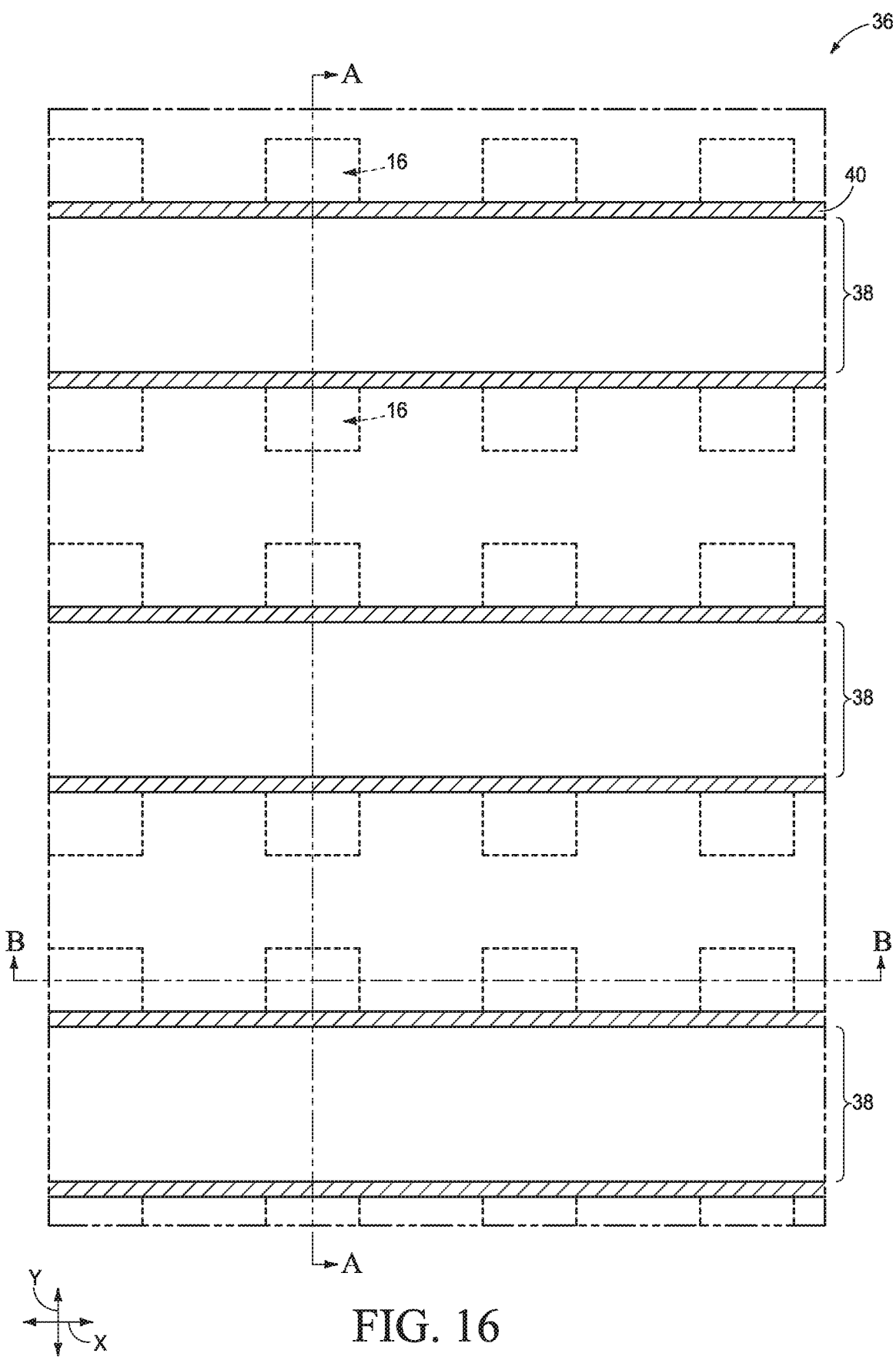
FIGS. 16-16B are diagrammatic views of the region of FIGS. 1-1B at an example process stage following that of FIGS. 15-15B.
Figure 16A:
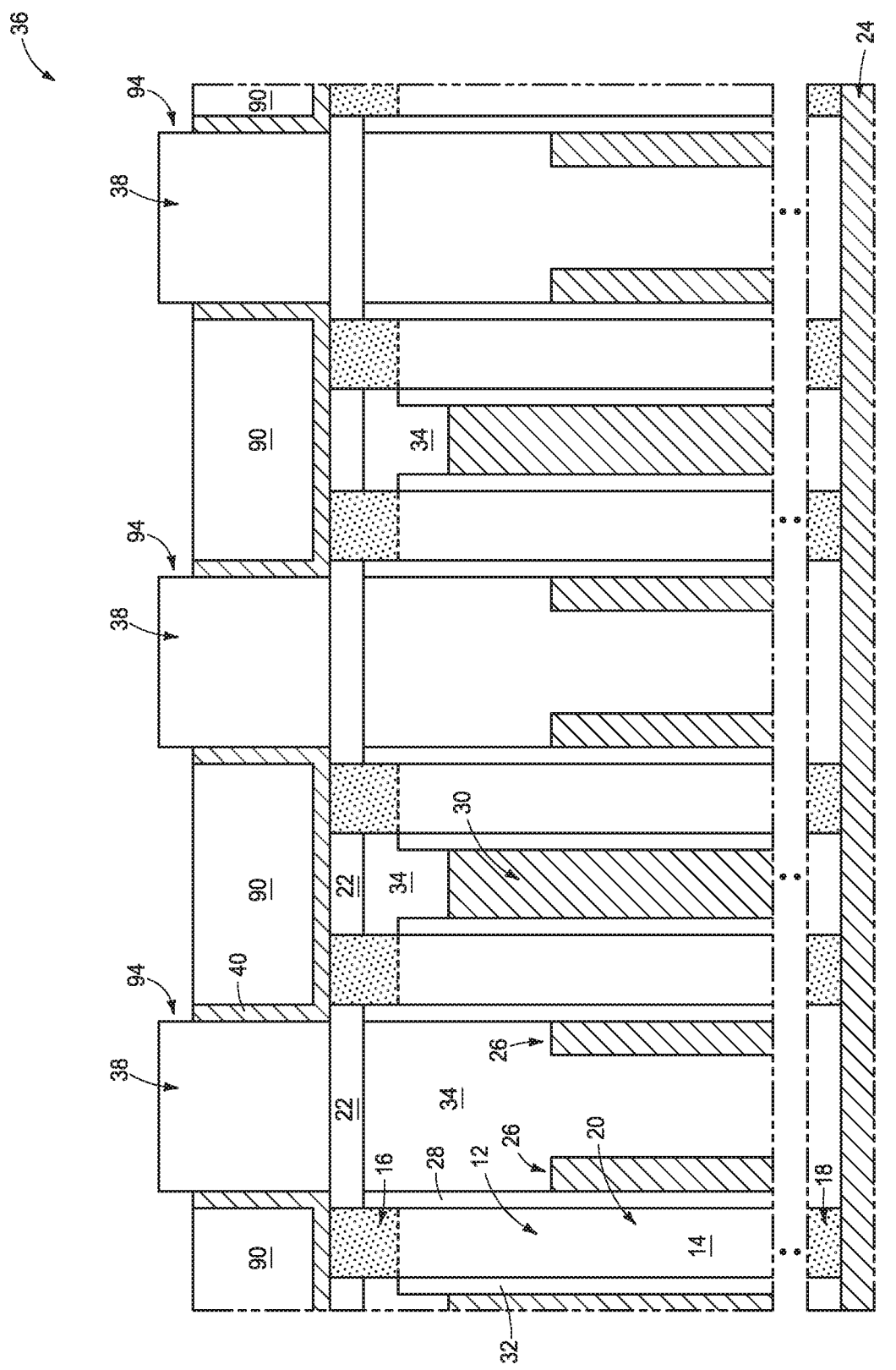
Figure 16B:
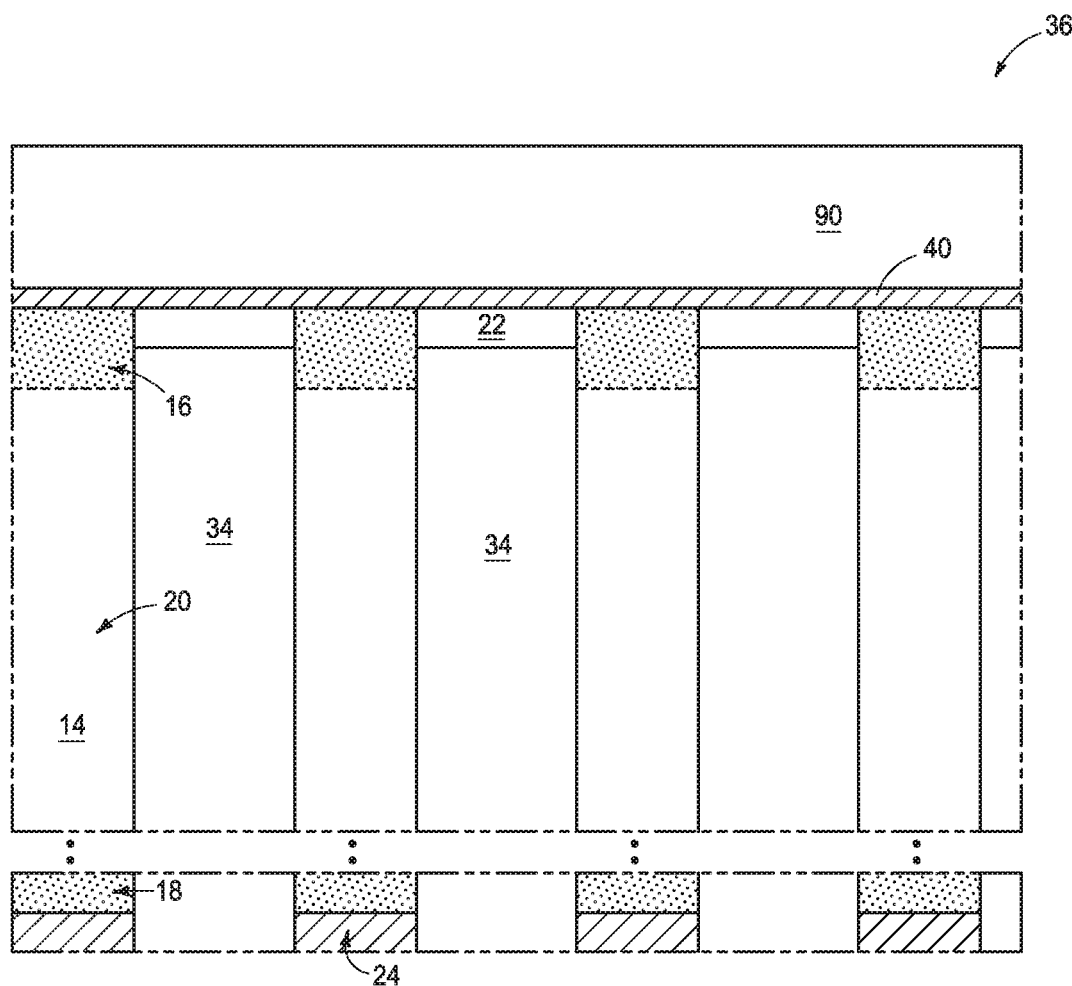

Referring to FIGS. 16-16B, exposed regions of the bottom-electrode-material 40 are removed from over the mask structures 38 to expose upper regions 94 of the mask structures. Such may be considered to recess the vertical segments of the angle plates 54 relative to upper regions of the mask structures 38, even though the angle plates 54 have not yet been fully patterned from the bottom-electrode-material 40.

Figure 17:
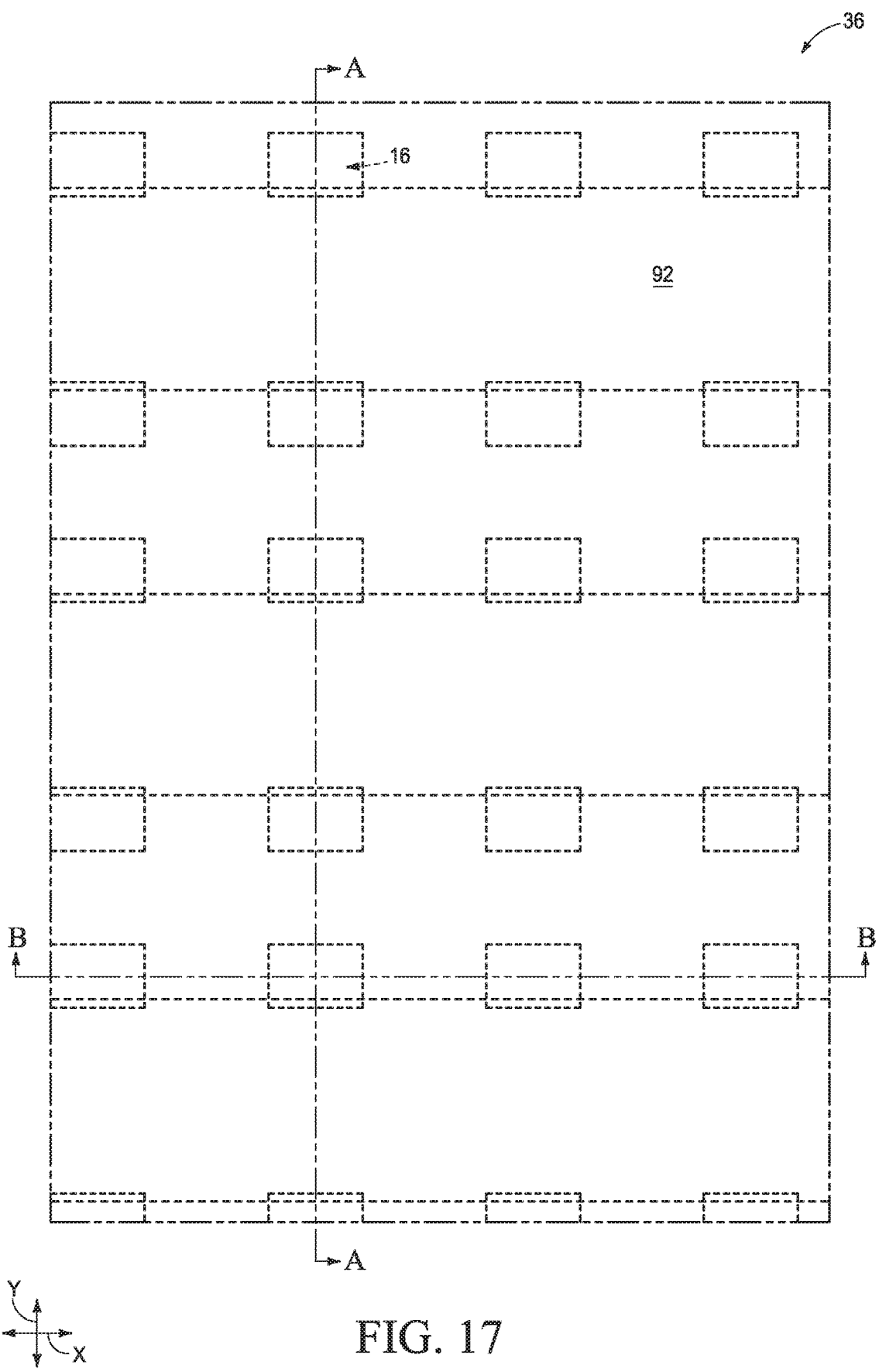
FIGS. 17-17B are diagrammatic views of the region of FIGS. 1-1B at an example process stage following that of FIGS. 16-16B.
Figure 17A:
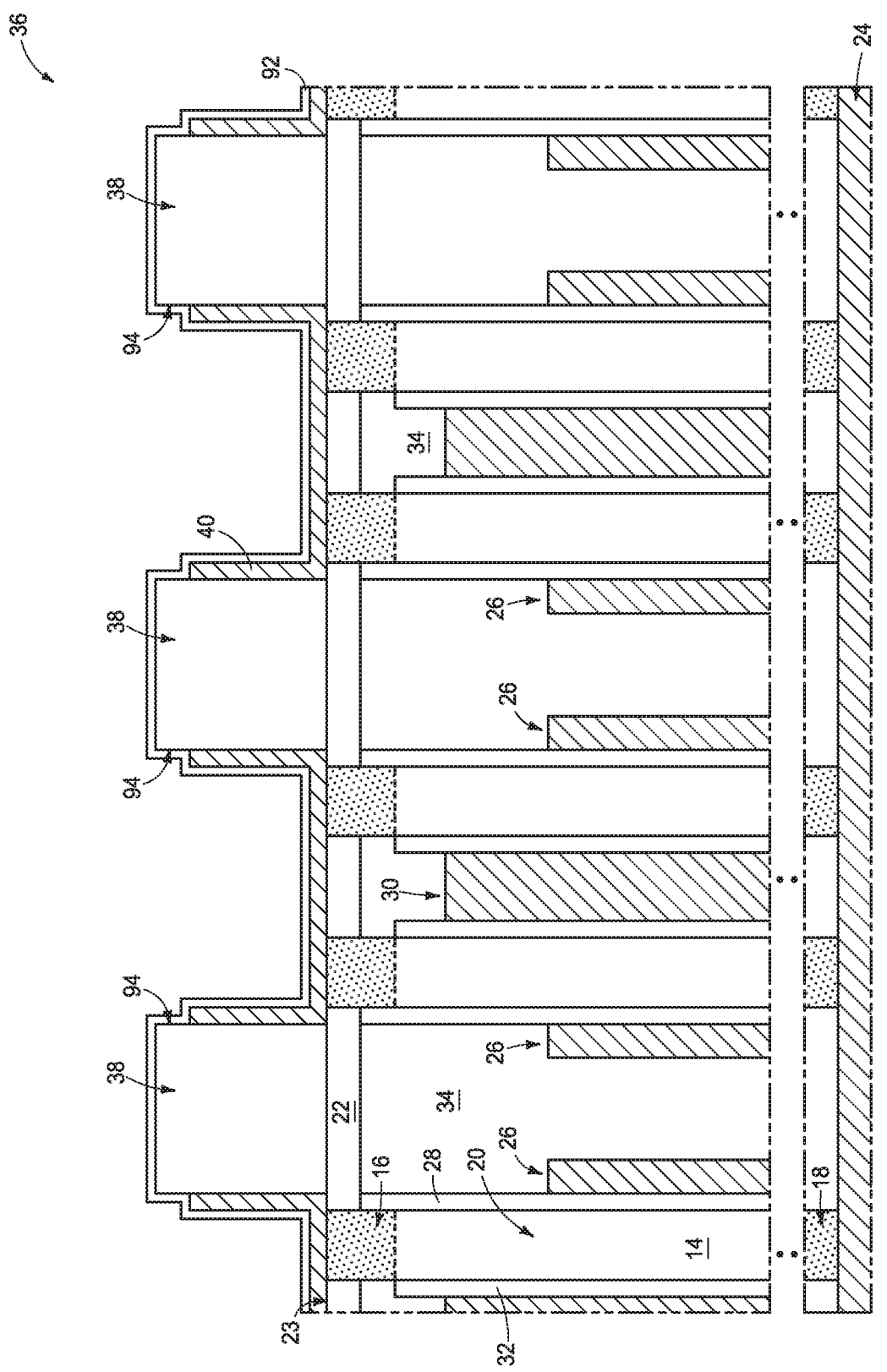
Figure 17B:
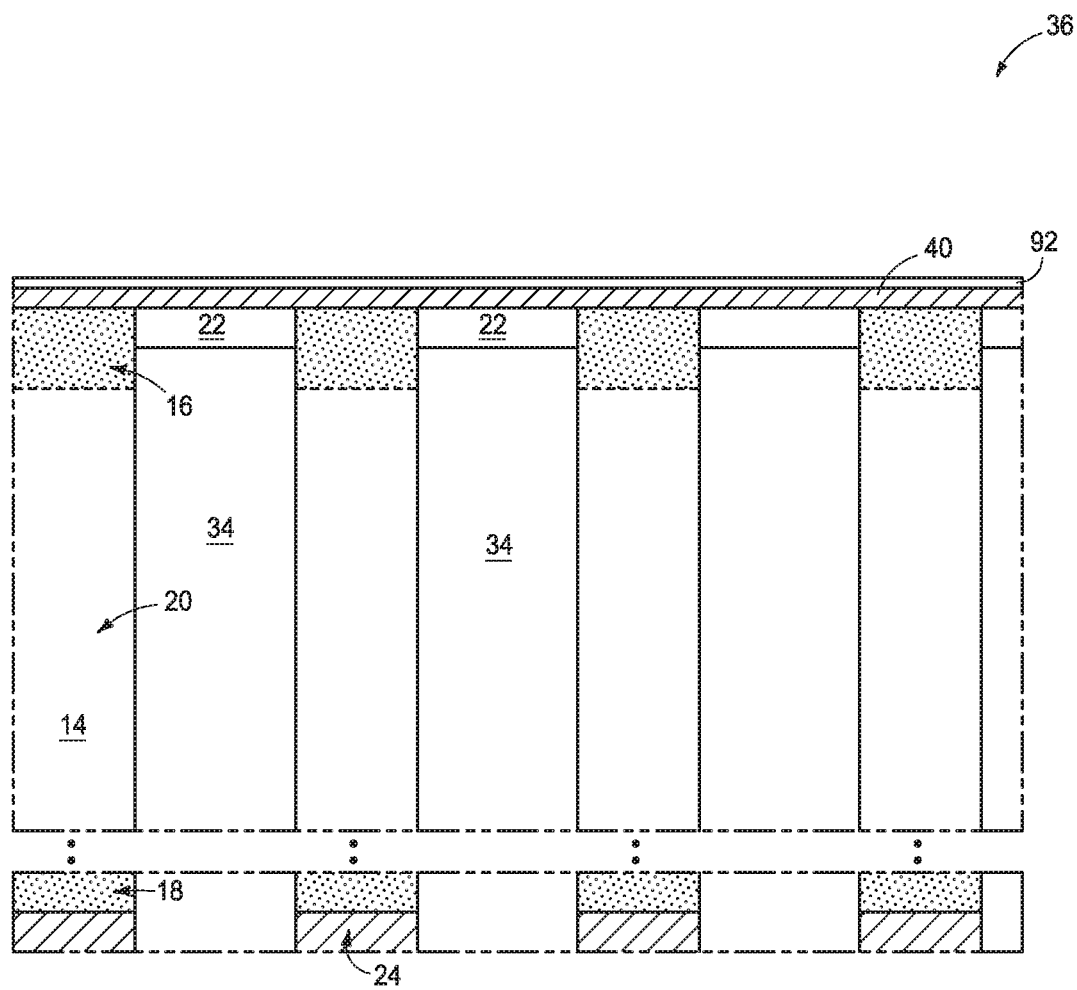
Figure 17B:
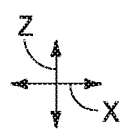

Referring to FIGS. 17-17B, the fill material 90 is removed, and leaker-device-material 92 is formed over the mask structures 38 and bottom-electrode-material 40. Notably, the leaker-device-material 92 is formed along and directly against the upper regions 94 of the mask structures 38.

The leaker-device-material 92 may comprise any suitable composition or combination of compositions. In some embodiments, the leaker-device-material 92 may comprise, consist essentially of, or consist of one or more of titanium, nickel and niobium in combination with one or more of germanium, silicon, oxygen, nitrogen and carbon. In some embodiments, the leaker-device-material may comprise, consist essentially of, or consist of one or more of Si, Ge, SiN, TiSiN, TiO, TiN, NiO, NiON and TiON; where the chemical formulas indicate primary constituents rather than particular stoichiometries. In some embodiments, the leaker-device-material may comprise, consist essentially of, or consist of titanium, oxygen and nitrogen. In some embodiments, the leaker-device-material may comprise amorphous silicon, niobium monoxide, silicon-rich silicon nitride, etc.; either alone or in any suitable combination.

The leaker-device-material 92 be formed to any suitable thickness. In some embodiments, the leaker-device-material may be a continuous layer having a thickness within a range of from about 2 Å to about 20 Å.

Figure 18:
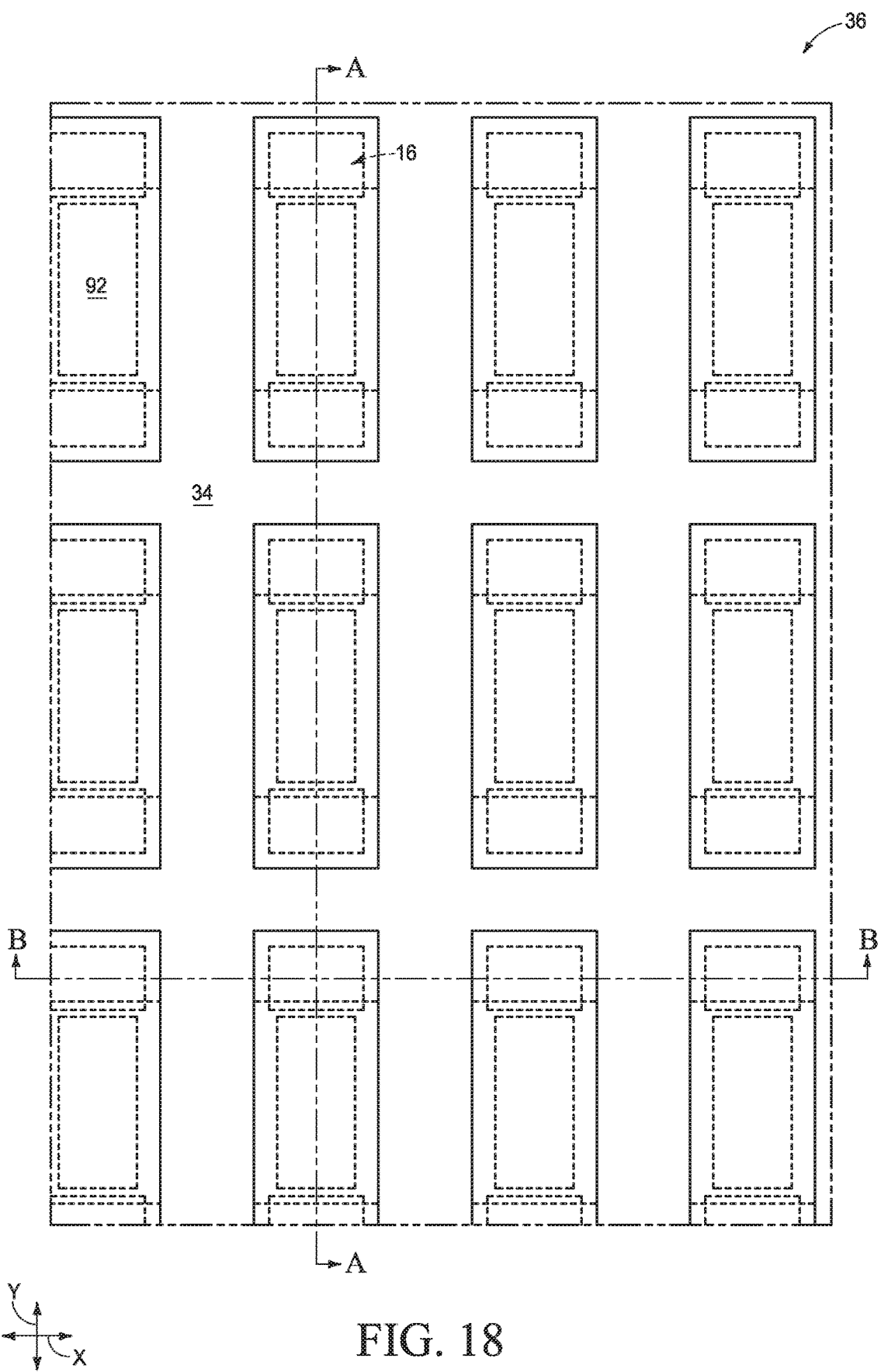
FIGS. 18-18B are diagrammatic views of the region of FIGS. 1-1B at an example process stage following that of FIGS. 17-17B.
Figure 18A:
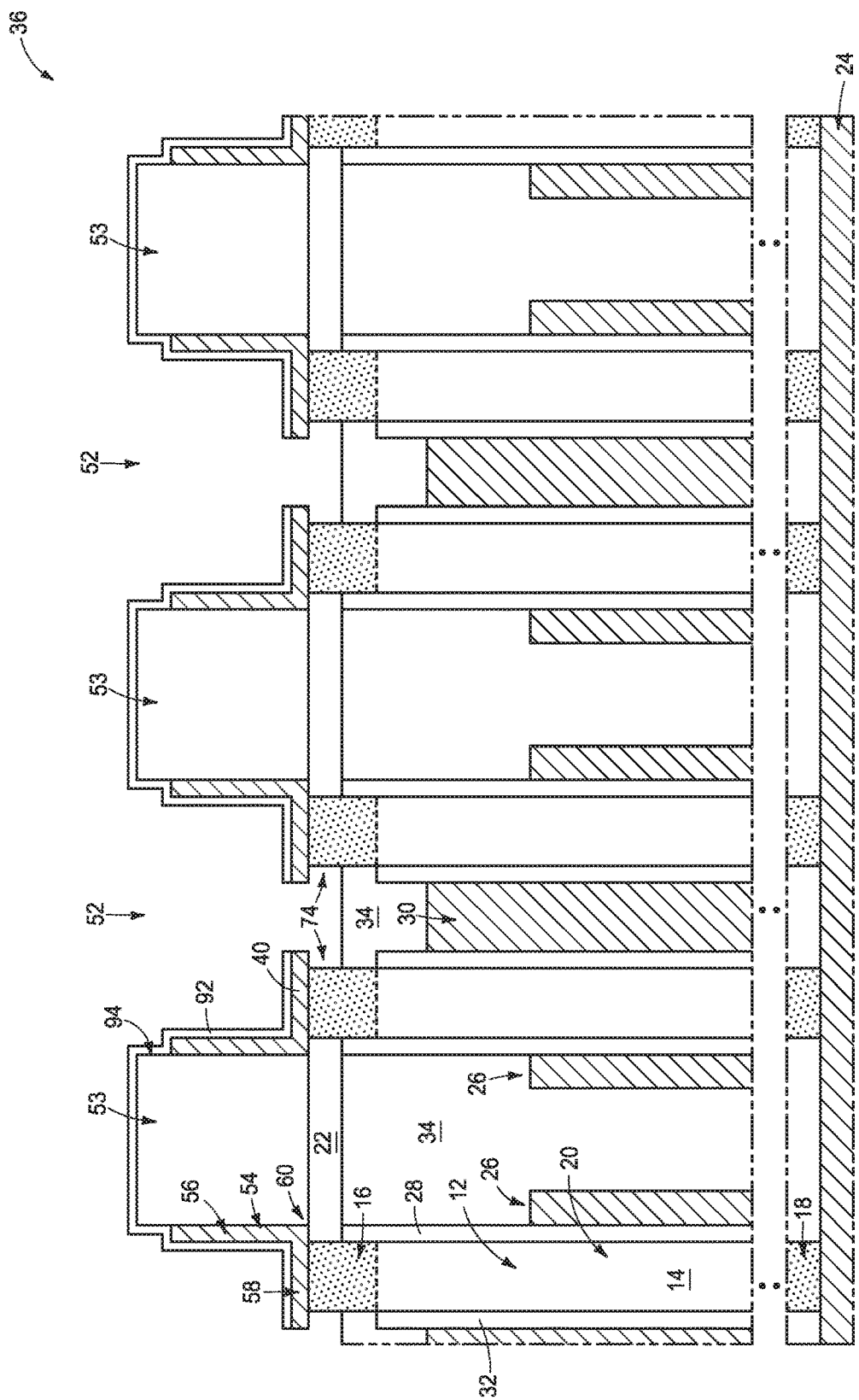
Figure 18B:
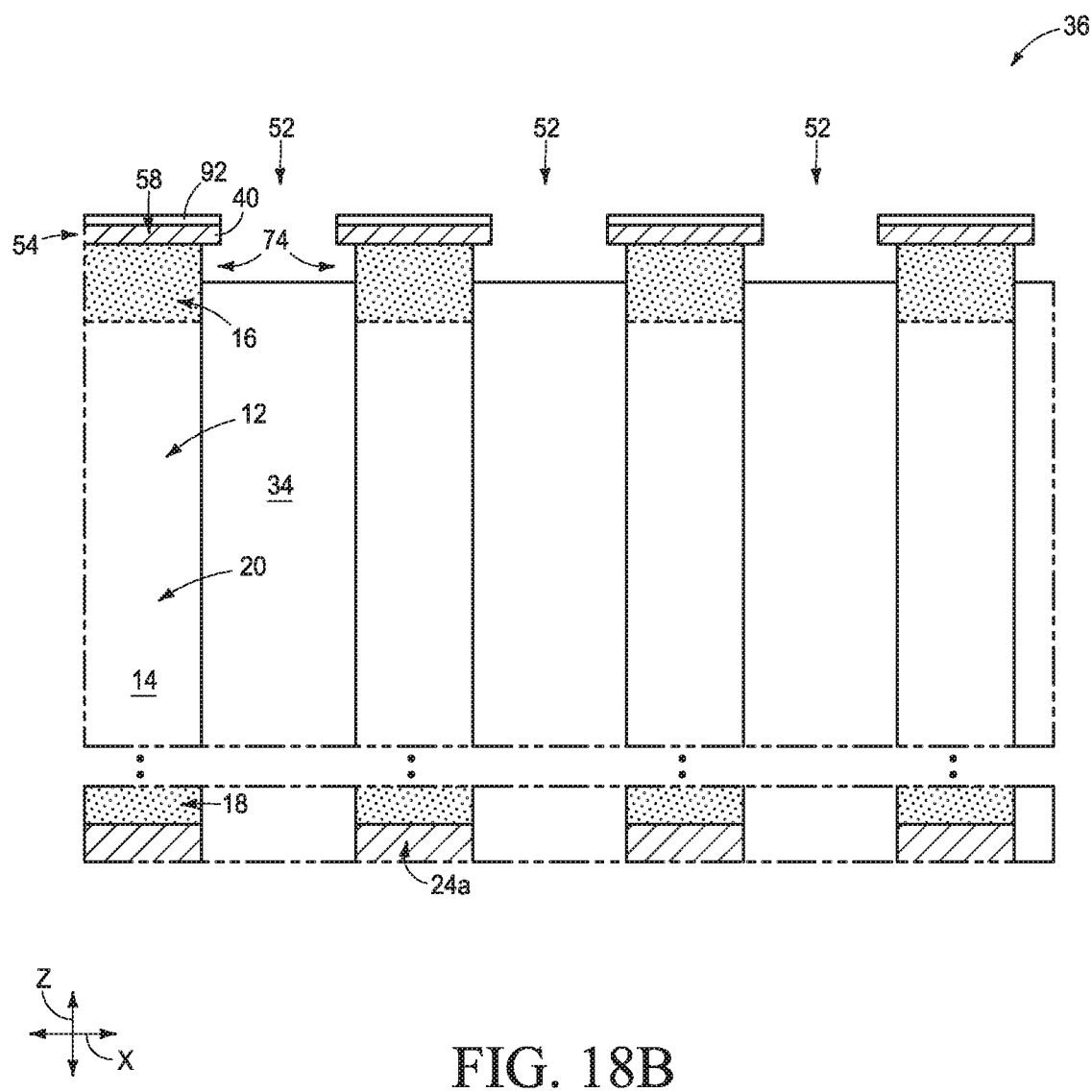

Referring to FIGS. 18-18B, the assembly 36 is subjected to processing analogous to that described above with reference to FIGS. 12-12B to form the openings 52 which subdivide the bottom-electrode-material 40 into the bottom-electrode-structures (bottom electrodes) 54, and formed the gaps 74 extending under regions of such bottom-electrode-structures. The mask structures 38 (FIG. 17-17B) are patterned into the insulative masses 53.

Figure 19:
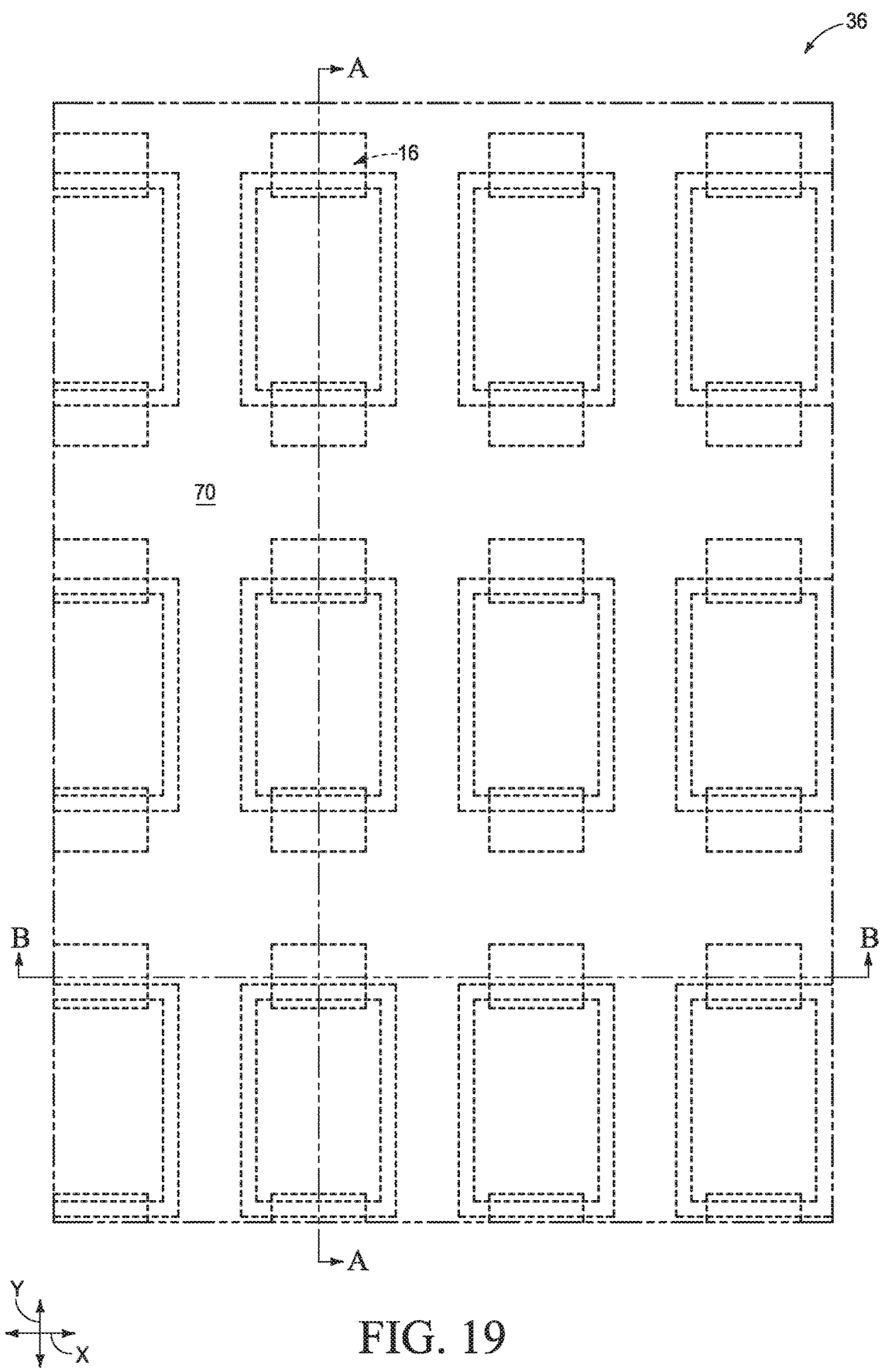
FIGS. 19-19B are diagrammatic views of the region of FIGS. 1-1B at an example process stage following that of FIGS. 18-18B.
Figure 19A:
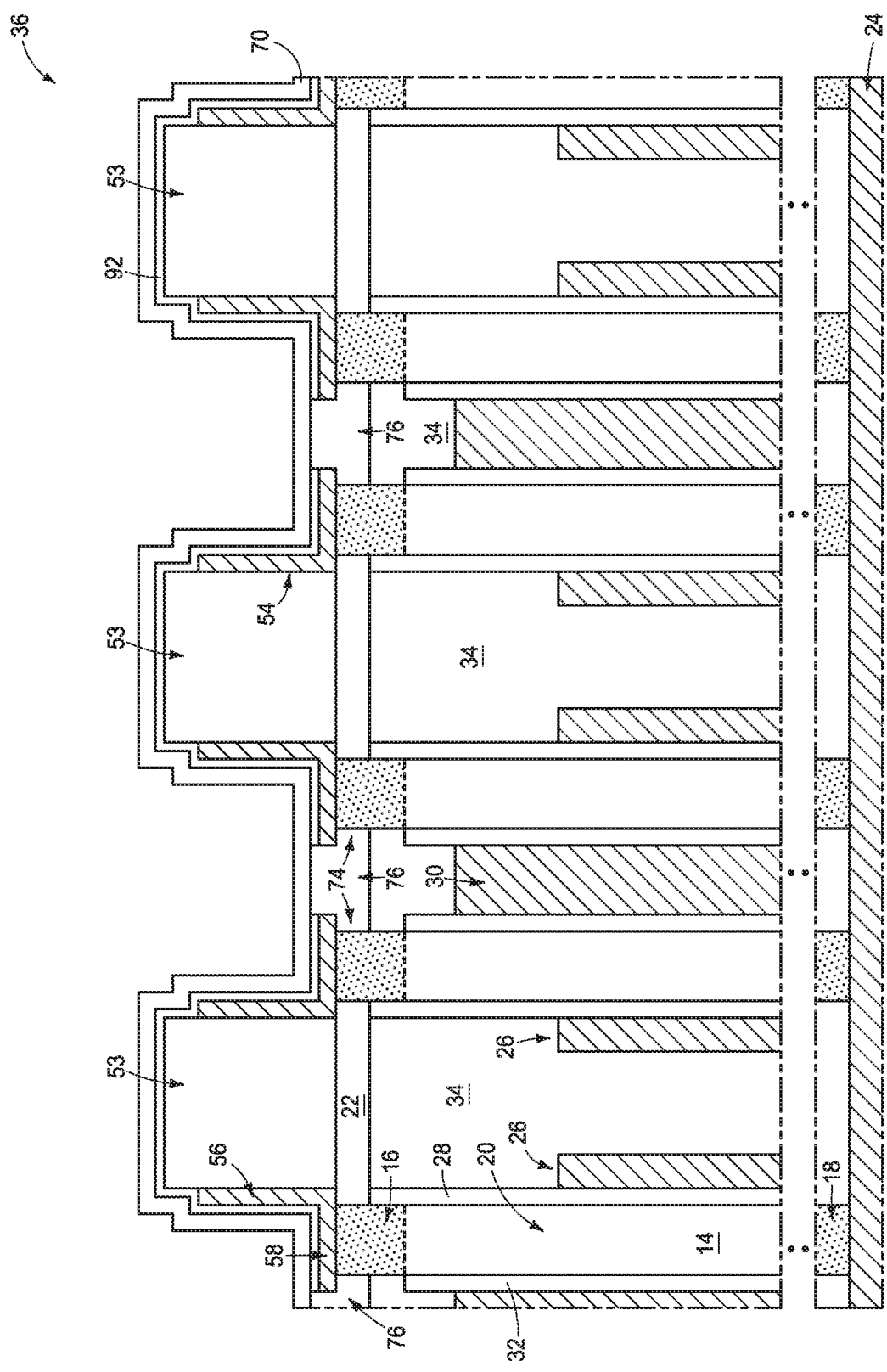
Figure 19B:
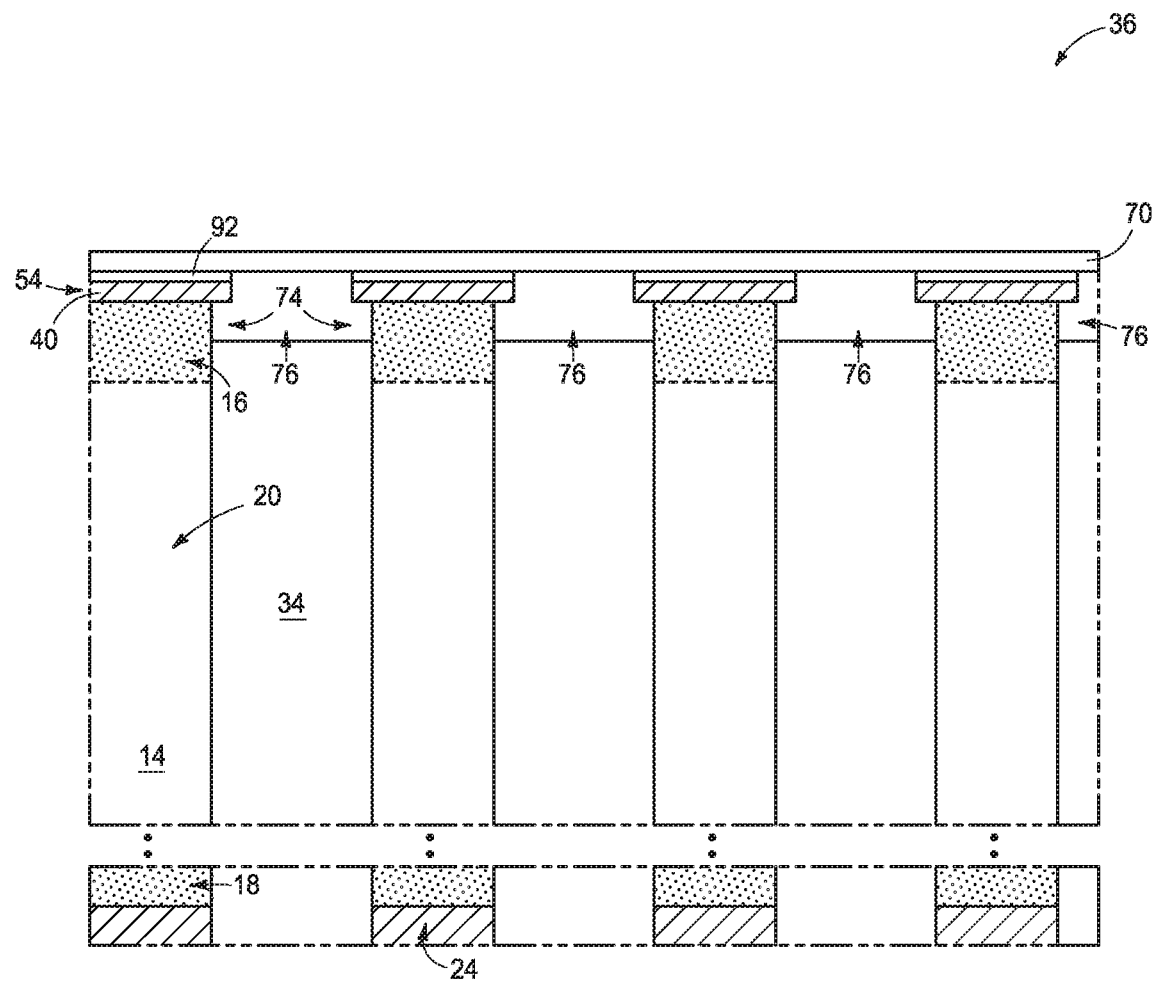

Referring to FIGS. 19-19B, the ferroelectric-insulative-material 70 is formed over an upper surface of the integrated assembly 36. In the illustrated embodiment, the material 70 extends across regions between neighboring bottom electrodes 54 to leave voids 76, and to leave the gaps 74 extending under portions of the bottom electrodes 54. In other embodiments, the ferroelectric-insulative-material 70 may extend into the gaps 74.

Figure 20:
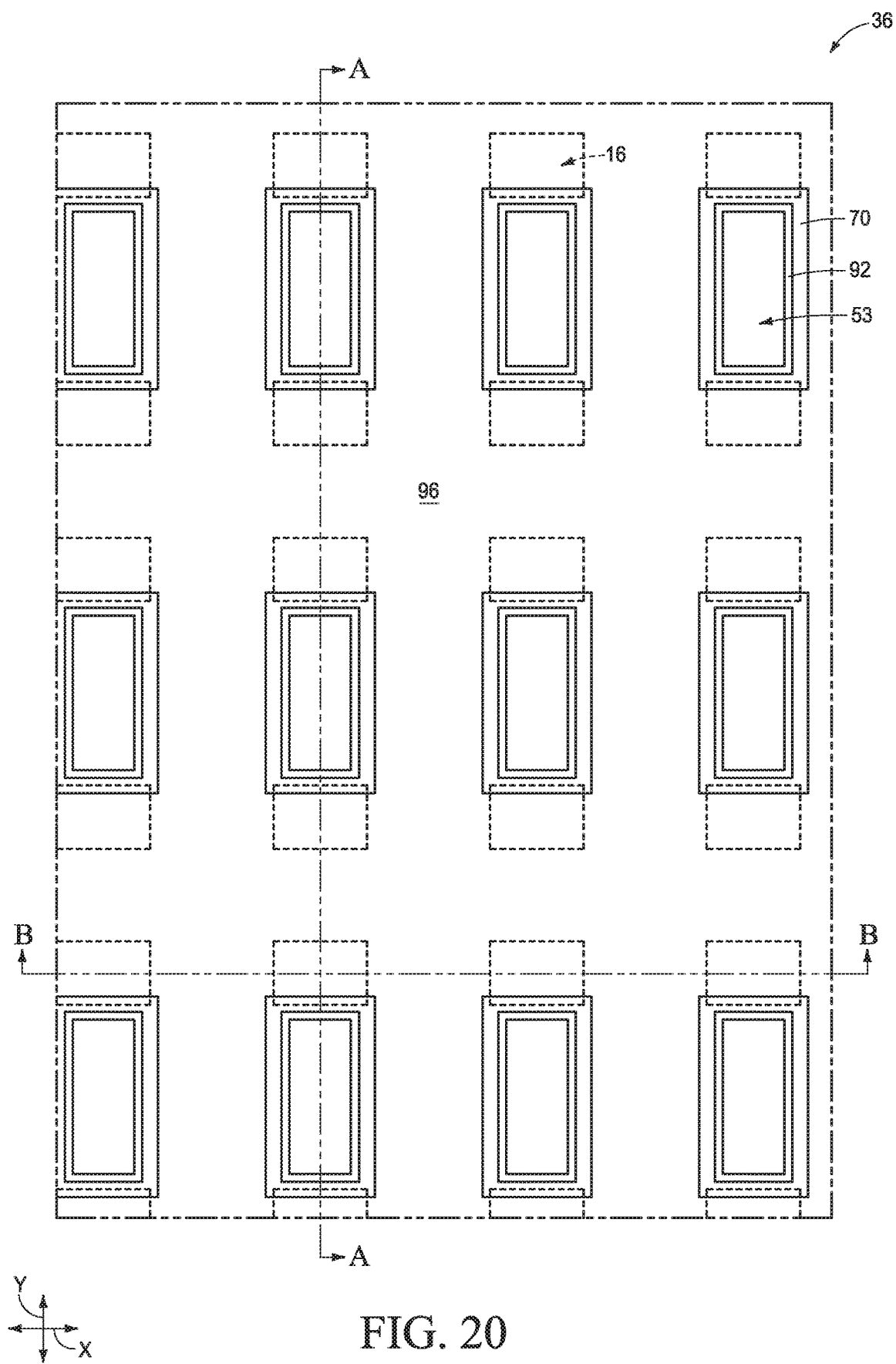
FIGS. 20-20B are diagrammatic views of the region of FIGS. 1-1B at an example process stage following that of FIGS. 19-19B.
Figure 20A:
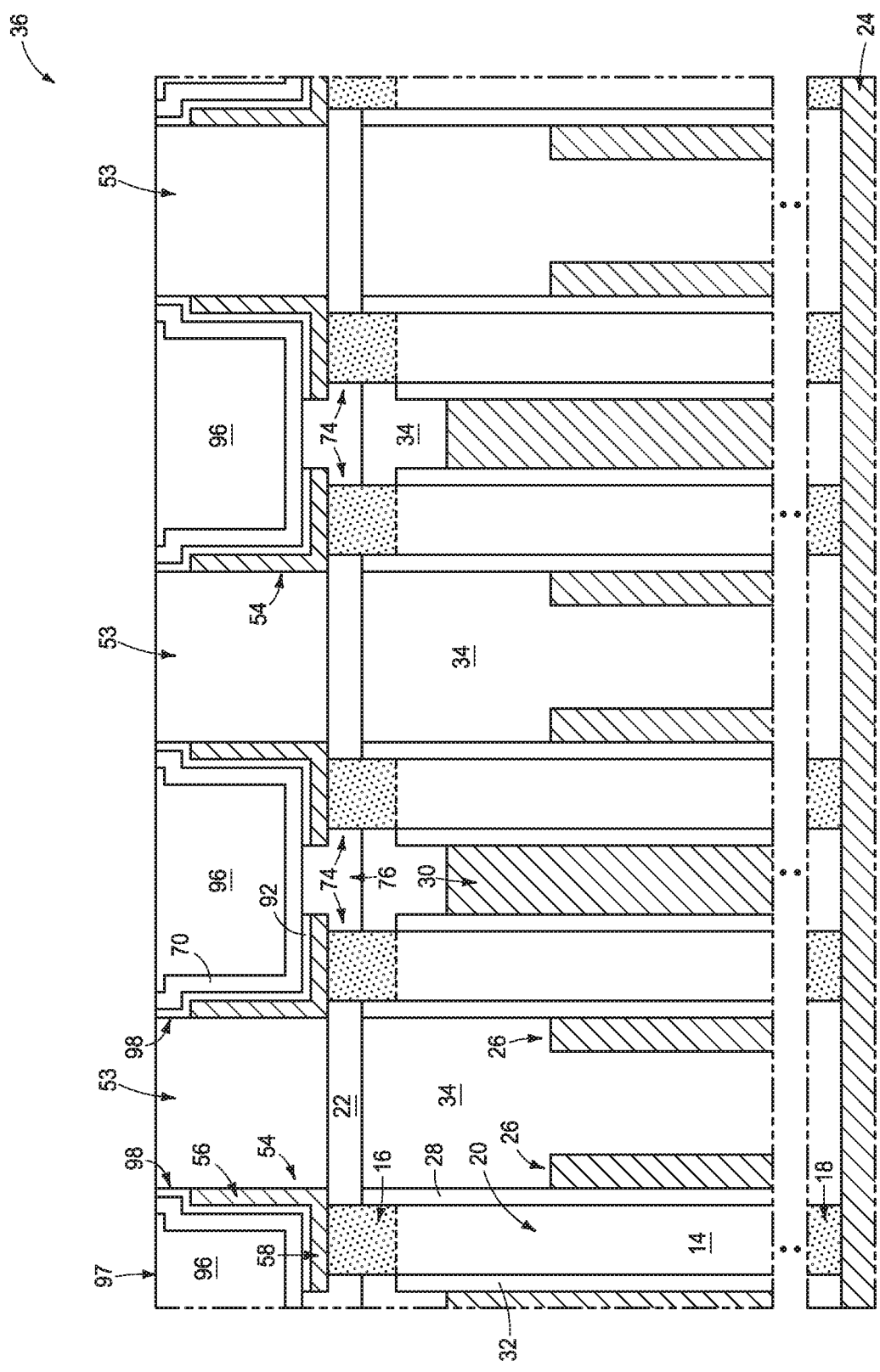
Figure 20B:
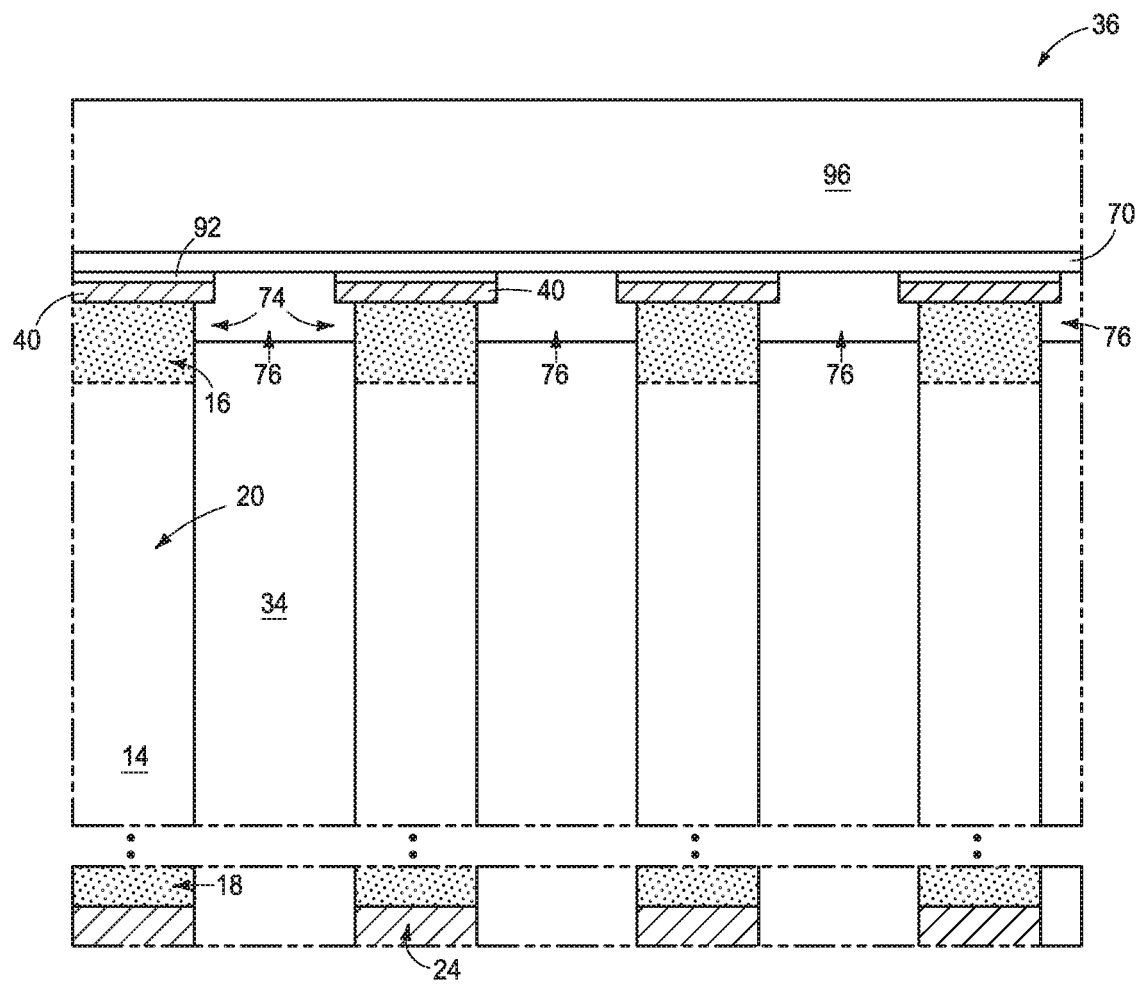

Referring to FIGS. 20-20B, regions between the mask structures 38 are filled with a fill material 96, and subsequently the integrated assembly 36 is subjected to planarization (CMP) to form a planarized upper surface 97 extending across the materials 96, 70 and 92, as well as along the insulative masses 53. The remaining portions of the leaker-device-material 92 are configured as vertically-extending-segments 98 which extend along the sidewalls of the insulative masses 53.

The planarization of FIGS. 20-20B may be considered to remove some portions of the ferroelectric-insulative-material 70, while leaving other portions remaining over the horizontal segments 58 of the angle plates 54.

The fill material 96 may comprise any suitable composition(s); and in some embodiments may comprise, consist essentially of, or consist of photoresist.

Figure 21:
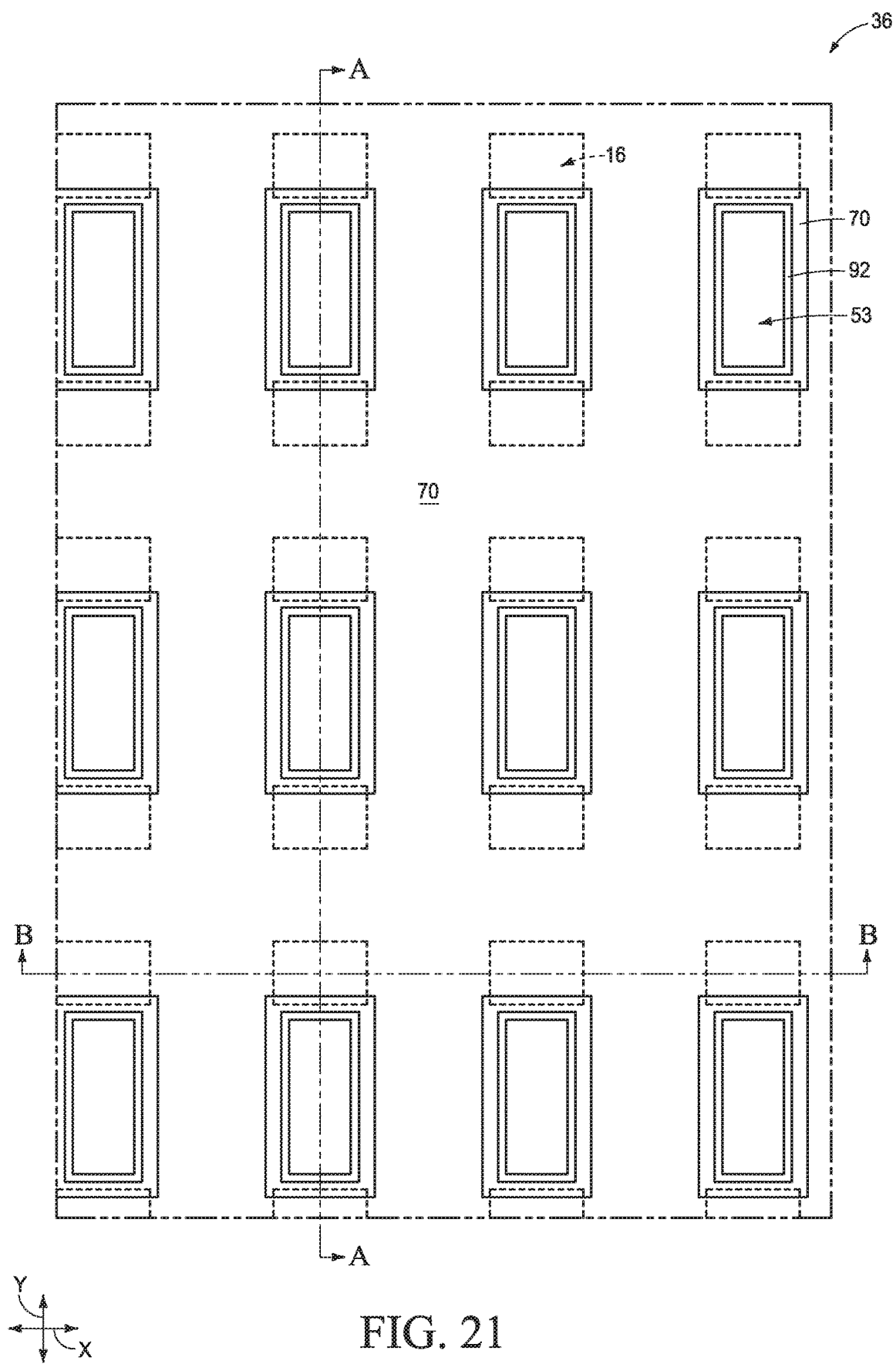
FIGS. 21-21B are diagrammatic views of the region of FIGS. 1-1B at an example process stage following that of FIGS. 20-20B.
Figure 21A:
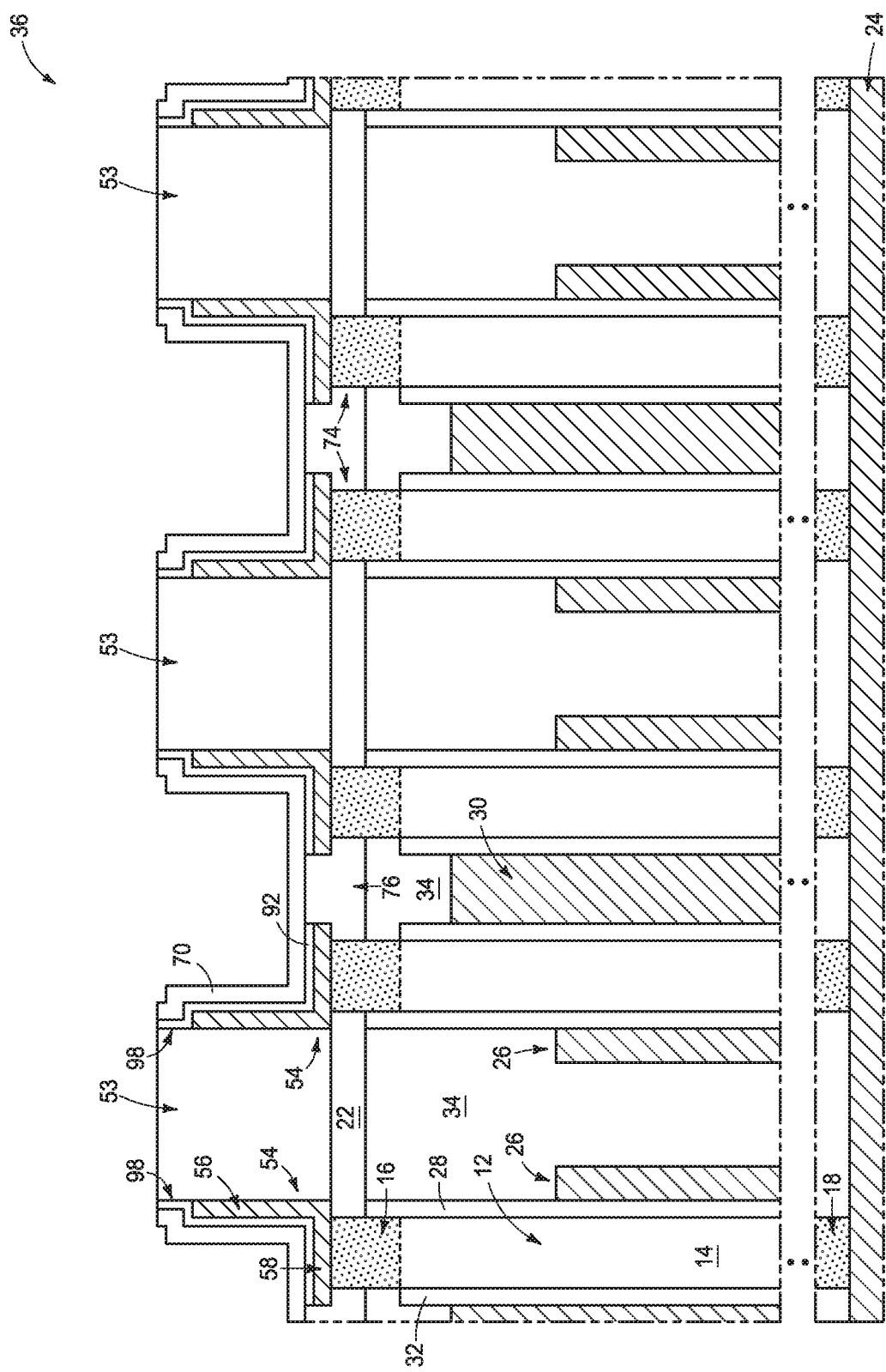
Figure 21B:
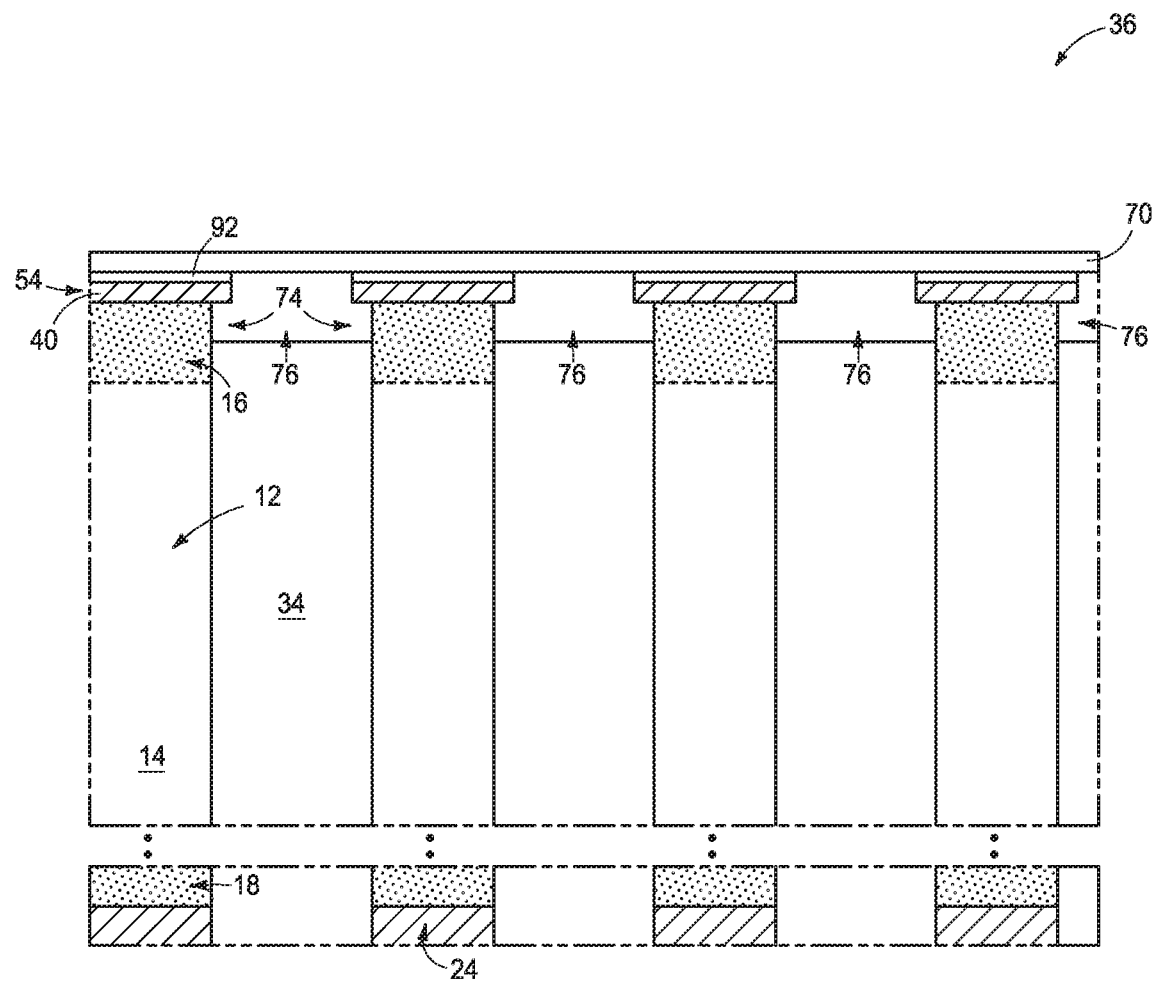

Referring to FIGS. 21-21B, the fill material 96 (FIGS. 20-20B) is removed.

Figure 22:
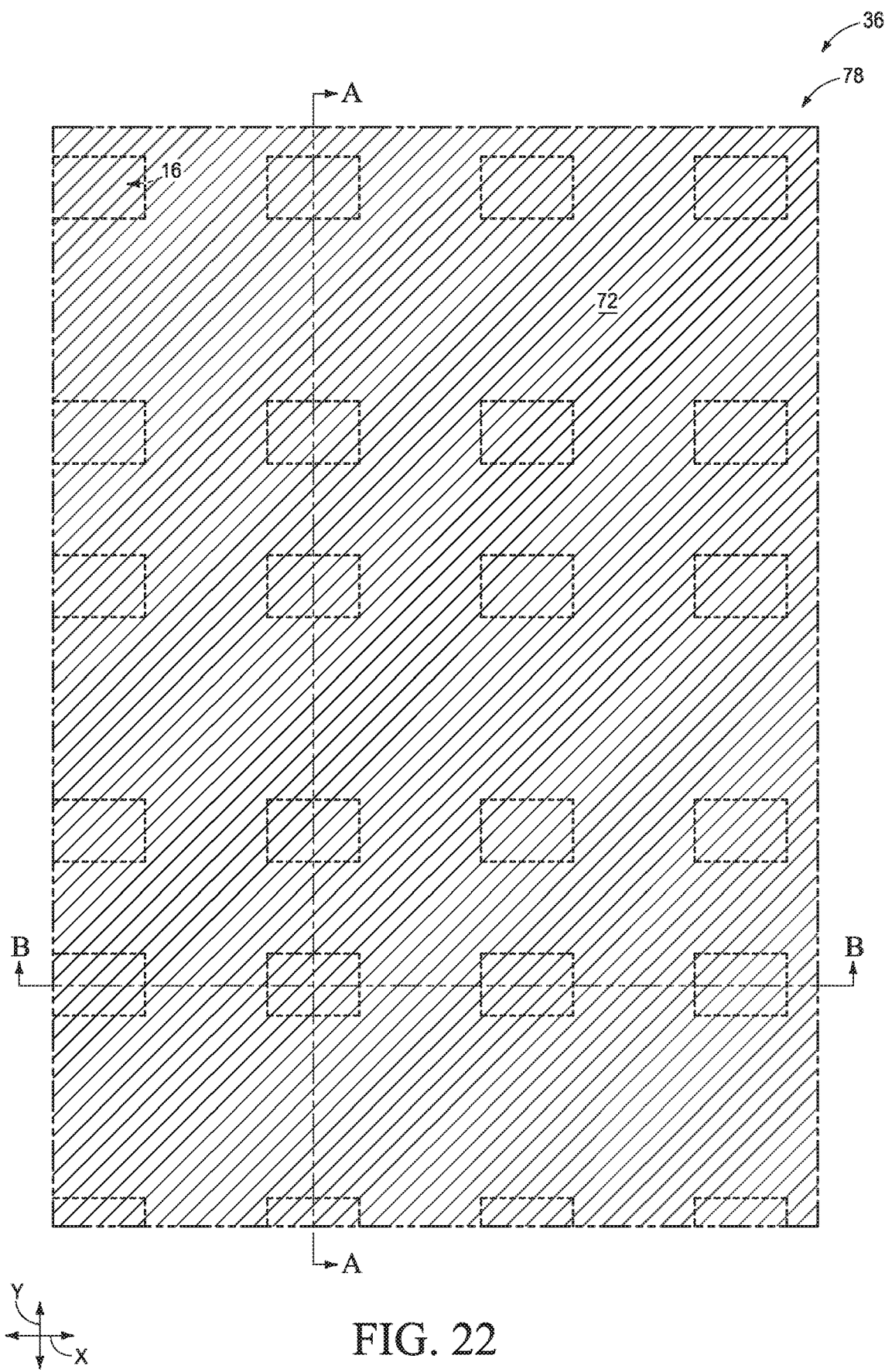
FIGS. 22-22B are diagrammatic views of the region of FIGS. 1-1B at an example process stage following that of FIGS. 21-21B.
Figure 22A:
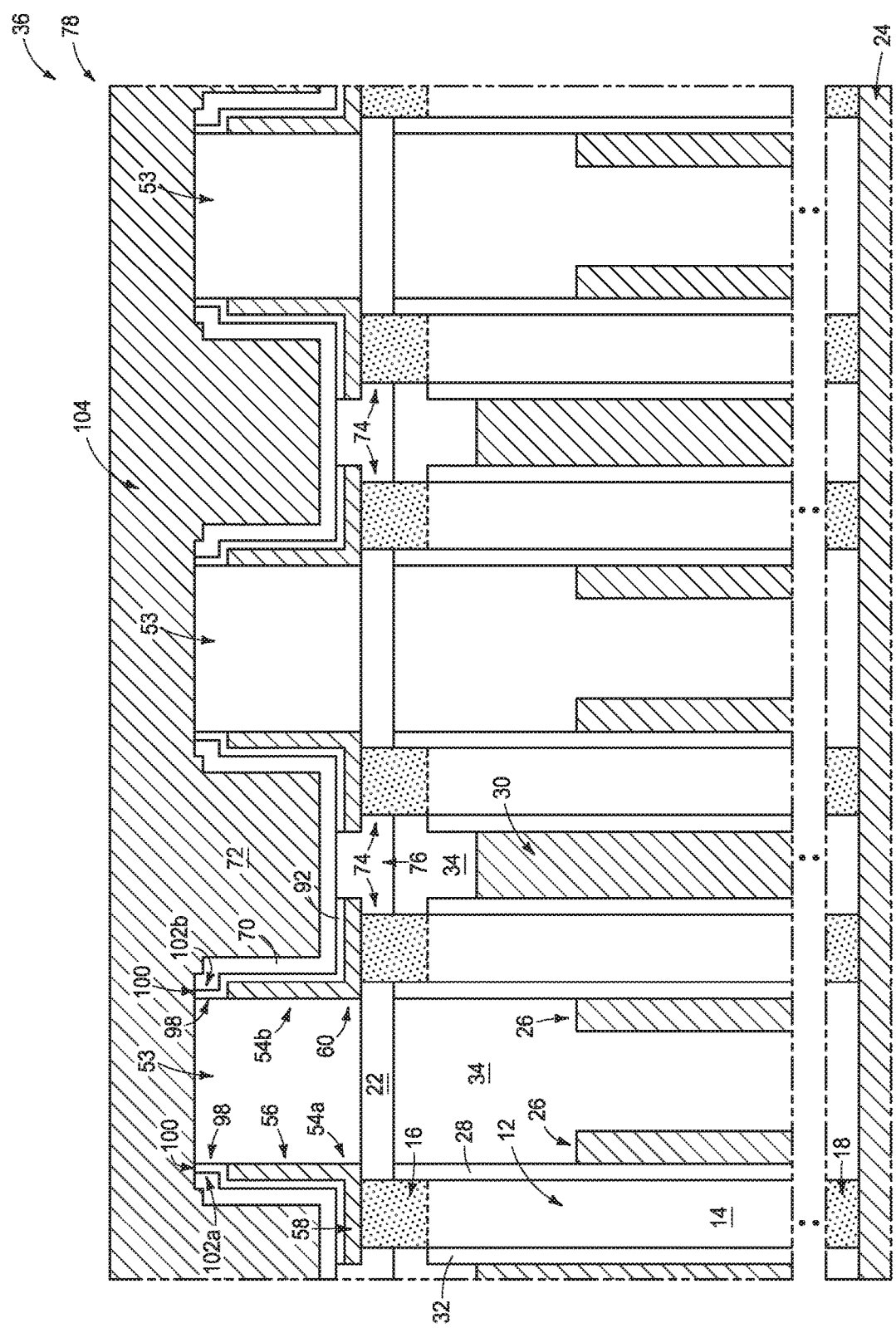
Figure 22B:
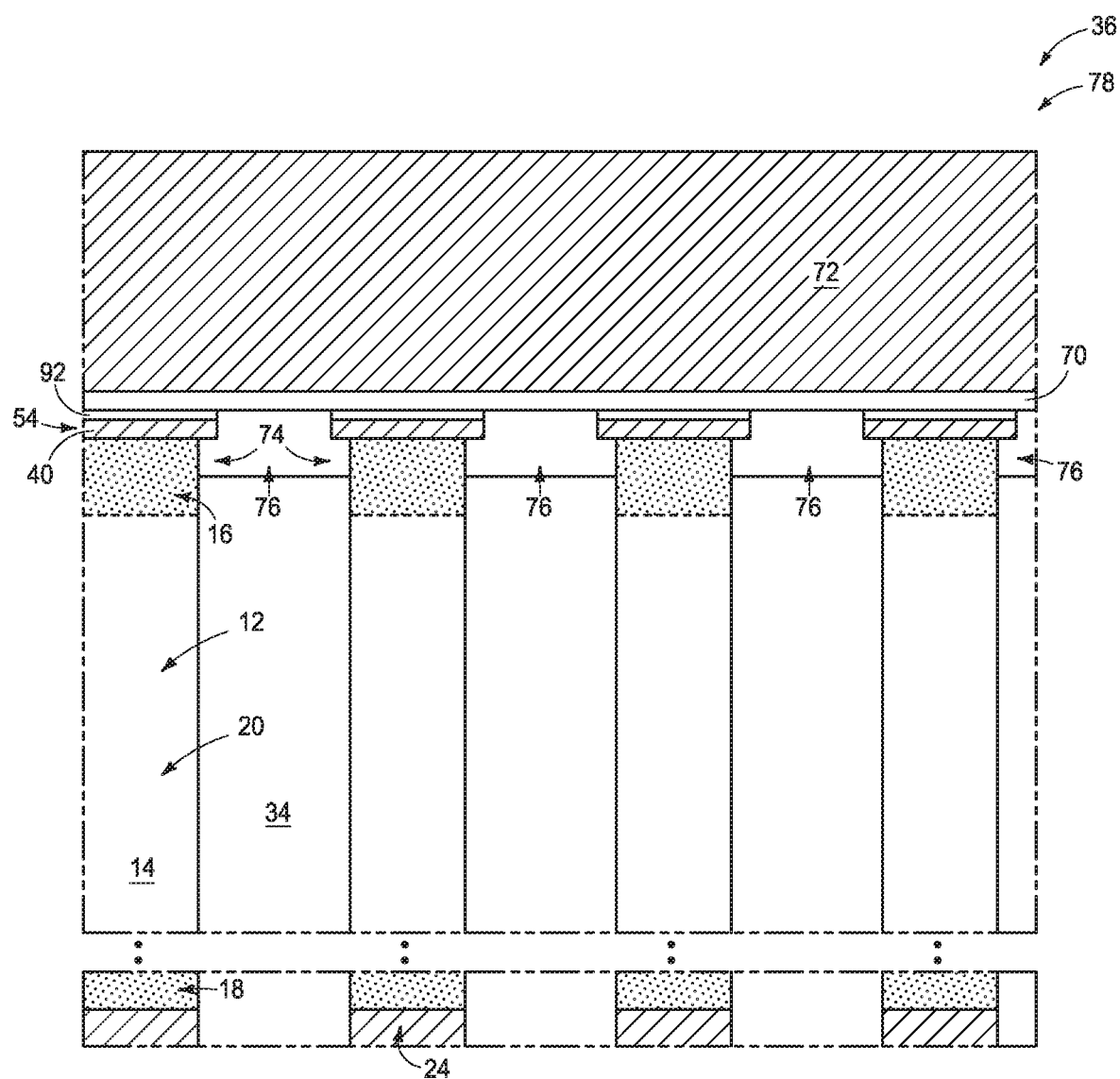

Referring to FIGS. 22-22B, the top-electrode-material 72 is formed over the ferroelectric-insulative-material 70, and directly against regions 100 of the leaker-device-material 92. The vertically-extending-segments 98 of the leaker-device-material 92 may be considered to be leaker devices 102 which couple the bottom electrodes 54 with a top electrode (plate electrode) 104 comprising the top-electrode-material 72. In the illustrated embodiment, two of the leaker devices 102 are labeled as a first leaker device 102a and a second leaker device 102b. The leaker devices are spaced from one another by the intervening insulative mass 53. In some embodiments, the first leaker device 102a may be considered to couple a first bottom electrode 54a with the top electrode 104, and the second leaker device 102b may be considered to couple a second bottom electrode 54b with the top electrode 104.

The integrated assembly 36 of FIGS. 22-22B may be considered to comprise a memory array 78 analogous to that described above with reference to FIGS. 11-11B.

The memory arrays described above (e.g., memory arrays 78 of FIGS. 11, 13 and 22) may have any suitable configuration, and may be FeRAM arrays or DRAM arrays.

Figure 23:
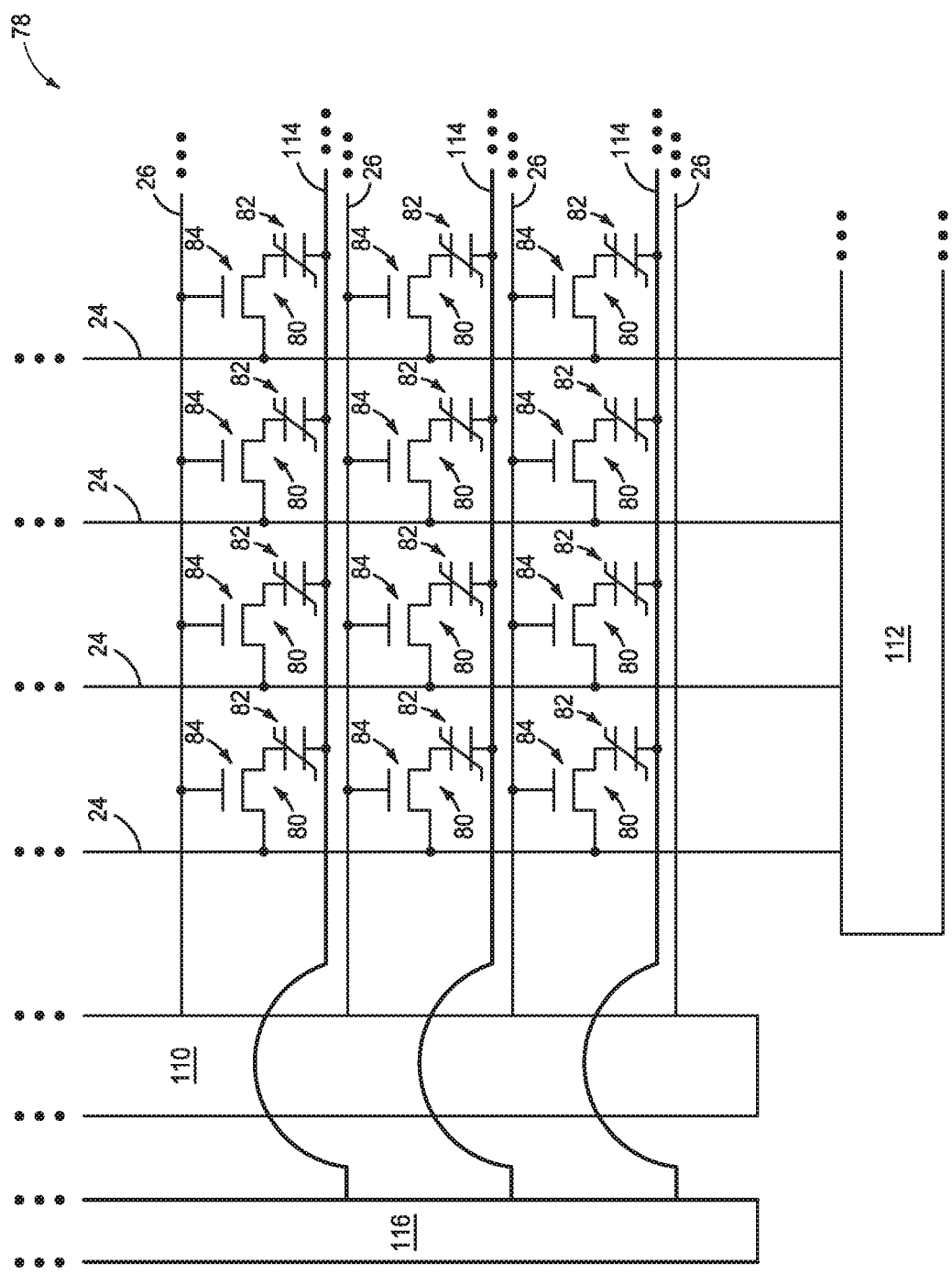
FIG. 23 is a schematic diagram of an example memory array comprising ferroelectric capacitors.

An example FeRAM array 78 is described schematically with reference to FIG. 23. The memory array includes a plurality of substantially identical ferroelectric capacitors 82. Wordlines extend along rows of the memory array and comprise the gates 26 (the wordlines are labeled 26, and in some embodiments may be considered to extensions of the gates); and digit lines 24 extend along columns of the memory array. Each of the capacitors 82 is within a memory cell 80 which is uniquely addressed utilizing a combination of a gate and a digit line. The wordlines extend to driver circuitry 110, and the digit lines 24 extend to detecting (sensing) circuitry 112. In the illustrated embodiment, the top electrodes of the capacitors 38 are shown coupled with plate lines 114 which extend to an appropriate reference source 116.

At least some of the circuitry 110, 112 and 116 may be directly under the memory array 78 in some embodiments. One or more of the circuitries 110, 112 and 116 may include CMOS, and accordingly some embodiments may include CMOS-under-array architecture.

Figure 24:
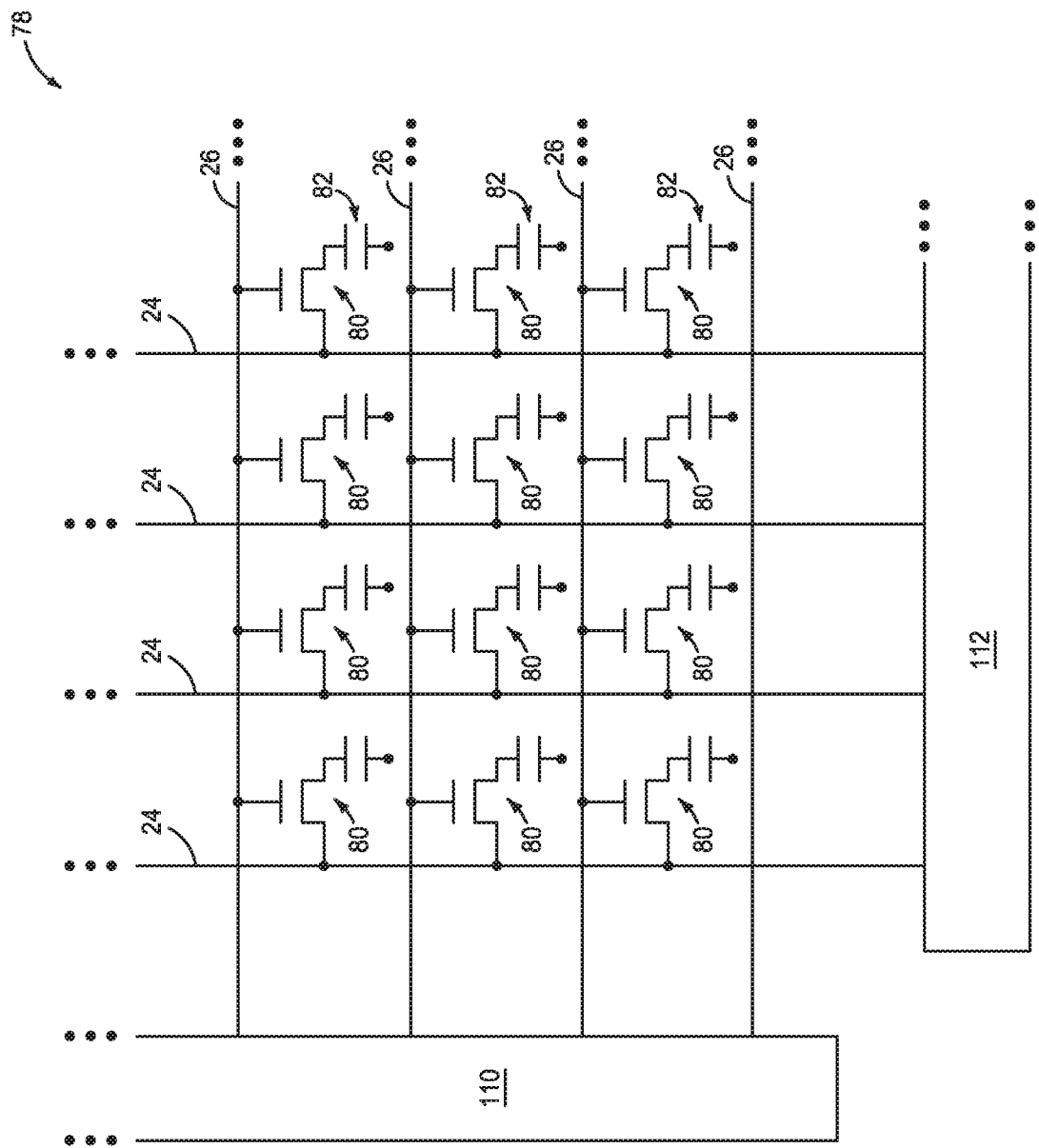
FIG. 24 is a schematic diagram of another example memory array.

An example DRAM array 78 is shown schematically in FIG. 24. The DRAM array of FIG. 24 is similar to the FeRAM array of FIG. 23, but comprises memory cells 80 with non-ferroelectric capacitors 82.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having first and second pillars. Each of the pillars has, along a cross-section, an inner edge facing a region between the pillars and an outer edge in opposing relation to the inner edge. The first pillar has a first upper source/drain region, a first lower source/drain region, and a first channel region between the first upper source/drain region and the first lower source/drain region. The second pillar has a second upper source/drain region, a second lower source/drain region, and a second channel region between the second upper source/drain region and the second lower source/drain region. A shield line is in the region between the first and second pillars. A first gate is proximate the first channel region. A second gate is proximate the second channel region. A digit line is beneath the first and second pillars and is electrically coupled with the first and second lower source/drain regions. A first bottom electrode is electrically coupled with the first upper source/drain region. The first bottom electrode is configured as a first angle plate. The first angle plate has a first horizontal segment adjacent the first upper source/drain region and has a first vertical segment extending upwardly from the first horizontal segment. A second bottom electrode is electrically coupled with the second upper source/drain region. The second bottom electrode is configured as a second angle plate. The second angle plate has a second horizontal segment adjacent the second upper source/drain region and has a second vertical segment extending upwardly from the second horizontal segment. An insulative material is over the first and second bottom electrodes. A top electrode is over the insulative material.

Some embodiments include a method of forming an integrated assembly. A construction is provided to have first and second pillars of semiconductor material, and to have first and second gates between the first and second pillars along a cross-section. The first gate is adjacent to the first pillar, and the second gate is adjacent to the second pillar. The first and second pillars are capped with first and second source/drain regions, respectively. The construction includes first insulative material over the gates and between the first and second source/drain regions. An upper surface of the construction extends across the first insulative material and the first and second source/drain regions. A mask structure is formed over the upper surface. The mask structure has a pair of sidewalls along the cross-section. The mask structure is directly over the first insulative material and does not cover the first and second source/drain regions. Bottom-electrode-material is formed conformally along the mask structure and along the first and second source/drain regions. The bottom-electrode-material is patterned into a first bottom-electrode-structure over the first source/drain region and a second bottom-electrode-structure over the second source/drain region. The first bottom-electrode-structure has a first vertical segment along one of the sidewalls of the mask structure, a first horizontal segment along the first source/drain region, and a first corner joining the first vertical segment to the first horizontal segment. The second bottom-electrode-structure has a second vertical segment along the other of the sidewalls of the mask structure, a second horizontal segment along the second source/drain region, and a second corner joining the second vertical segment to the second horizontal segment. A second insulative material is formed over the first and second bottomelectrode-structures. A top-electrode-material is formed over the second insulative material.

Some embodiments include a method of forming an integrated assembly. A construction is provided to have pillars of semiconductor material. Each of the pillars extends vertically and has an upper source/drain region, a lower source/drain region, and a channel region between the upper and lower source/drain regions. The construction includes insulative material between the upper source/drain regions. An upper surface of the construction extends across the insulative material and the upper source/drain regions. The construction includes digit lines under the pillars and coupled with the bottom source/drain regions. The digit lines extend in a first direction. The construction includes gates alongside the pillars and extending in a second direction. Each of the pillars is uniquely addressed by one of the gates and one of the digit lines. The construction includes shield lines alongside the pillars and extending along a same direction as the gates. Each of the pillars has one side adjacent to one of the shield lines and another side, in opposing relation to said one side, adjacent to one of the gates. The construction includes, along a cross-section, an arrangement of four of the pillars, four of the gates and one of the shield lines. The four of the pillars being, in lateral order, a first, a second, a third and a fourth of the pillars. The four of gates being, in lateral order, a first, a second, a third and a fourth of the gates. The first and second gates being between the first and second pillars. The third and fourth gates being between the third and fourth pillars. Said one of the shield lines being between the second and third pillars. Mask structures are formed over the upper surface of the construction and extend along the second direction. A first of the mask structures is over the first and second gates, and a second of the mask structures is over the third and fourth gates. Bottom-electrode-material is formed conformally along the mask structures and along regions of the upper surface of the construction not covered by the mask structures. The bottom-electrode-material is patterned into angle plates with vertical segments along the mask structures and with horizontal segments along the upper surface. Four of the angle plates along the cross-section are a first, a second, a third and a fourth of the angle plates. The first, second, third and fourth angle plates have their horizontal segments directly against the upper source/drain regions of the first, second, third and fourth pillars, respectively. A ferroelectric-insulative-material is formed over and directly against the angle plates. A top-electrode-material is formed over the ferroelectric-insulative-material and extends across the angle plates.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
    first and second pillars; each of the pillars having, along a cross-section, an inner edge facing a region between the pillars and an outer edge in opposing relation to the inner edge; the first pillar having a first upper source/drain region, a first lower source/drain region, and a first channel region between the first upper source/drain region and the first lower source/drain region; the second pillar having a second upper source/drain region, a second lower source/drain region, and a second channel region between the second upper source/drain region and the second lower source/drain region;
    a shield line in the region between the first and second pillars;
    a first gate proximate the first channel region;
    a second gate proximate the second channel region;
    a digit line beneath the first and second pillars and electrically coupled with the first and second lower source/drain regions;
    a first bottom electrode electrically coupled with the first upper source/drain region; the first bottom electrode being configured as a first angle plate; the first angle plate having a first horizontal segment adjacent the first upper source/drain region and having a first vertical segment extending upwardly from the first horizontal segment;
    a second bottom electrode electrically coupled with the second upper source/drain region; the second bottom electrode being configured as a second angle plate; the second angle plate having a second horizontal segment adjacent the second upper source/drain region and having a second vertical segment extending upwardly from the second horizontal segment;
    an insulative material over the first and second bottom electrodes; and
    a top electrode over the insulative material.

2. The integrated assembly of claim 1 wherein the first vertical segment is longer than the first horizontal segment, and wherein the second vertical segment is longer than the second horizontal segment.

3. The integrated assembly of claim 1 wherein the insulative material is non-ferroelectric.

4. The integrated assembly of claim 1 wherein the insulative material is a ferroelectric-insulative-material.

5. The integrated assembly of claim 4 wherein:
    the first bottom electrode, a first region of the top electrode and a first region of the ferroelectric-insulative-material are configured as a first ferroelectric capacitor;
    the second bottom electrode, a second region of the top electrode and a second region of the ferroelectric-insulative-material are configured as a second ferroelectric capacitor;
    a first access transistor comprises the first pillar and a region of the first gate adjacent the first pillar, and gatedly couples the first ferroelectric capacitor with the digit line;
    a second access transistor comprises the second pillar and a region of the second gate adjacent the second pillar, and gatedly couples the second ferroelectric capacitor with the digit line;
    the first access transistor and the first ferroelectric capacitor are configured as a first memory cell;
    the second access transistor and the second ferroelectric capacitor are configured as a second memory cell;
    the first and second memory cells are two of many substantially identical memory cells of a memory array;
    the first and second gates are two of many substantially identical gates extending across the memory array;
    the digit line is one of many substantially identical digit lines extending across the memory array; and
    each of the memory cells is uniquely addressed by one of the gates in combination with one of the digit lines.

6. The integrated assembly of claim 4 wherein the ferroelectric-insulative-material is directly against the first and second bottom electrodes.

7. The integrated assembly of claim 4 wherein:
each of the first and second vertical segments has, along the cross-section, an inner surface facing a region between the first and second vertical segments, and an outer surface in opposing relation to the inner surface; and
the ferroelectric-insulative-material is along both of the inner and outer surfaces of the first and second vertical segments.

8. The integrated assembly of claim 7 wherein the first vertical segment has a first sidewall surface that extends from the inner surface of the first vertical segment to the outer surface of the first vertical segment; wherein the second vertical segment has a second sidewall surface that extends from the inner surface of the second vertical segment to the outer surface of the second vertical segment; wherein the digit line extends along a first direction; and further comprising an insulative structure extending along the first direction and being directly adjacent upper regions of the first and second sidewall surfaces.

9. The integrated assembly of claim 8 wherein a gap is under the insulative structure, and wherein the ferroelectric-insulative-material extends into the gap.

10. The integrated assembly of claim 8 wherein the insulative structure comprises silicon nitride.

11. The integrated assembly of claim 4 wherein:
each of the first and second vertical segments has, along the cross-section, an inner surface facing a region between the first and second vertical segments, and an outer surface in opposing relation to the inner surface; and
the ferroelectric-insulative-material is along the inner surfaces of the first and second vertical segments, and is not along the outer surfaces of the first and second vertical segments.

12. The integrated assembly of claim 11 further comprising an insulative mass between the first and second vertical segments and directly against the inner surfaces of the first and second vertical segments.

13. The integrated assembly of claim 12 wherein the insulative mass comprises one or both of silicon dioxide and silicon nitride.

14. The integrated assembly of claim 12 further comprising:
a first leaker device coupling the first bottom electrode with the top electrode; and
a second leaker device coupling the second bottom electrode with the top electrode.

15. The integrated assembly of claim 14 wherein the leaker devices comprise one or more of Ti, Ni and Nb, in combination with one or more of Ge, Si, O, N and C.

16. The integrated assembly of claim 14 wherein the leaker devices comprise one or more of Si, Ge, SiN, TiSiN, TiO, TiN, NiO, NiON and TiON; where the chemical formulas indicate primary constituents rather than particular stoichiometries.

17. The integrated assembly of claim 14 wherein the leaker devices comprise titanium, oxygen and nitrogen.

18. The integrated assembly of claim 14 wherein the leaker devices comprise vertically-extending segments along the insulative mass.

19. The integrated assembly of claim 18 wherein the vertically-extending segments have horizontal thicknesses within a range of from about 2 Å to about 20 Å.

20. A method of forming an integrated assembly, comprising:
forming a construction having first and second pillars of semiconductor material, and having first and second gates between the first and second pillars along a cross-section; the first gate being adjacent the first pillar, and the second gate being adjacent the second pillar; the first and second pillars having first and second source/drain regions, respectively; the construction including a first insulative material over the gates and between the first and second source/drain regions; an upper surface of the construction extending across the first insulative material and the first and second source/drain regions;
forming a mask structure over the upper surface; the mask structure having a pair of sidewalls along the cross-section; the mask structure being directly over the insulative material and not covering the first and second source/drain regions;
forming bottom-electrode-material conformally along the mask structure and along the first and second source/drain regions;
patterning the bottom-electrode-material into a first bottom-electrode-structure over the first source/drain region and a second bottom-electrode-structure over the second source/drain region; the first bottom-electrode-structure having a first vertical segment along one of the sidewalls of the mask structure, a first horizontal segment along the first source/drain region, and a first corner joining the first vertical segment to the first horizontal segment; the second bottom-electrode-structure having a second vertical segment along the other of the sidewalls of the mask structure, a second horizontal segment along the second source/drain region, and a second corner joining the second vertical segment to the second horizontal segment;
forming a second insulative material over the first and second bottom-electrode-structures; and
forming a top-electrode-material over the second insulative material.

21. The method of claim 20 wherein the first and second corners are each about 90°.

22. The method of claim 20 wherein the second insulative material is non-ferroelectric.

23. The method of claim 20 wherein the second insulative material is a ferroelectric-insulative-material.

24. The method of claim 23 further comprising removing the mask structure before forming the ferroelectric-insulative-material.

25. The method of claim 24 comprising forming an insulative structure along and directly against upper regions of the first and second vertical segments prior to removing the insulative mask structure.

26. The method of claim 25 wherein the insulative structure comprises silicon nitride.

27. The method of claim 25 wherein a gap is under the insulative structure, and wherein the ferroelectric-insulative-material extends into the gap.

28. The method of claim 23 wherein the mask structure is patterned into insulative blocks, and further comprising forming the ferroelectric-insulative-material over the insulative blocks.

29. The method of claim 28 wherein the mask structure comprises one or both of silicon dioxide and silicon nitride.

30. The method of claim 23 wherein the ferroelectric-insulative-material comprises one or more of zirconium, zirconium oxide, niobium, niobium oxide, hafnium, hafnium oxide, lead zirconium titanate, and barium strontium titanate.

31. The method of claim 30 wherein the ferroelectric-insulative-material further includes dopant comprising one or more of silicon, aluminum, lanthanum, yttrium, erbium, calcium, magnesium and strontium.

32. The method of claim 20, further comprising forming silicon nitride over the bottom electrode material before patterning the bottom electrode material.

33. The method of claim 20, further comprising forming oxide over the bottom electrode material before patterning the bottom electrode material.

34. The method of claim 20, further comprising forming resist over the bottom electrode material before patterning the bottom electrode material.

35. The method of claim 34, further comprising forming leaker-device-material coupled with the bottom electrode material.

36. The method of claim 35, wherein the leaker-device-material comprises one or more of Si, Ge, SiN, TiSiN, TiO, TiN, NiO, NiON and TiON; where the chemical formulas indicate primary constituents rather than particular stoichiometries.

37. A method of forming an integrated assembly, comprising:
forming a construction having pillars of semiconductor material; each of the pillars extending vertically and having an upper source/drain region, a lower source/drain region, and a channel region between the upper and lower source/drain regions; the construction include insulative material between the upper source/drain regions; an upper surface of the construction extending across the insulative material and the upper source/drain regions; the construction including digit lines under the pillars and coupled with the bottom source/drain regions, the digit lines extending in a first direction; the construction including gates alongside the pillars and extending in a second direction; each of the pillars being uniquely addressed by one of the gates and one of the digit lines; the construction including shield lines alongside the pillars and extending along a same direction as the gates; each of the pillars having one side adjacent to one of the shield lines and another side, in opposing relation to said one side, adjacent to one of the gates; the construction including, along a cross-section, an arrangement of four of the pillars, four of the gates and one of the shield lines; the four of the pillars being, in lateral order, a first, a second, a third and a fourth of the pillars; the four of gates being, in lateral order, a first, a second, a third and a fourth of the gates; the first and second gates being between the first and second pillars; the third and fourth gates being between the third and fourth pillars; said one of the shield lines being between the second and third pillars;
forming mask structures over the upper surface of the construction and extending along the second direction; a first of the mask structures being over the first and second gates, and a second of the mask structures being over the third and fourth gates;
forming bottom-electrode-material conformally along the mask structures and along regions of the upper surface of the construction not covered by the mask structures;
patterning the bottom-electrode-material into angle plates with vertical segments along the mask structures and with horizontal segments along the upper surface; four of the angle plates along the cross-section being a first, a second, a third and a fourth of the angle plates; the first, second, third and fourth angle plates having their horizontal segments directly against the upper source/drain regions of the first, second, third and fourth pillars, respectively;
forming insulative material over and directly against the angle plates; and
forming a top-electrode-material over the insulative material and extending across the angle plates.

38. The method of claim 37 wherein the insulative material is ferroelectric-insulative-material.

39. The method of claim 38 further comprising removing the mask structures before forming the ferroelectric-insulative-material.

40. The method of claim 39 comprising forming insulative structures along and directly against upper regions of the vertical segments of the angle plates prior to removing the mask structures.

41. The method of claim 40 wherein the insulative structures extend along the second direction.

42. The method of claim 38 wherein mask structures are patterned into insulative masses, and wherein the ferroelectric-insulative-material is formed over the insulative masses.

43. The method of claim 38 wherein:
the vertical segments of the angle plates are recessed relative to upper regions of the mask structures;
leaker-device-material is formed along the upper regions of the mask structures;
the ferroelectric-insulative-material is formed over the leaker-device-material and over the mask structures, and well as over the horizontal segments of the angle plates;
planarizing to remove portions of the ferroelectric-insulative-material and expose regions of the leaker-device-material adjacent the mask structures while leaving other regions of the ferroelectric-insulative-material over the horizontal segments of the angle plates; and
the top-electrode-material is formed directly against the exposed regions of the leaker-device-material and said other regions of the ferroelectric-insulative-material.

* * * * *